United States Patent
Danz

(10) Patent No.: US 10,651,394 B2
(45) Date of Patent: May 12, 2020

(54) ORGANIC MOLECULES FOR USE AS EMITTERS

(71) Applicant: CYNORA GMBH, Bruchsal (DE)

(72) Inventor: Michael Danz, Eggenstein-Leopoldshafen (DE)

(73) Assignee: CYNORA GMBH, Bruchsal (DE)

( * ) Notice: Subject to any disclaimer, the term of this patent is extended or adjusted under 35 U.S.C. 154(b) by 127 days.

(21) Appl. No.: 15/506,346

(22) PCT Filed: Sep. 17, 2015

(86) PCT No.: PCT/EP2015/071309
§ 371 (c)(1),
(2) Date: Feb. 24, 2017

(87) PCT Pub. No.: WO2016/042070
PCT Pub. Date: Mar. 24, 2016

(65) Prior Publication Data
US 2017/0288149 A1    Oct. 5, 2017

(30) Foreign Application Priority Data

Sep. 17, 2014 (EP) .................................... 14185118
Nov. 18, 2014 (EP) .................................... 14193686

(51) Int. Cl.
*H01B 1/12* (2006.01)
*H01L 51/00* (2006.01)
(Continued)

(52) U.S. Cl.
CPC .......... *H01L 51/0069* (2013.01); *C09K 11/06* (2013.01); *H01B 1/12* (2013.01);
(Continued)

(58) Field of Classification Search
CPC ............ C09K 11/06; C09K 2211/1007; C09K 2211/1011; C09K 2211/1029;
(Continued)

(56) References Cited

U.S. PATENT DOCUMENTS

2009/0107551 A1\* 4/2009 Hassan ................ C07D 209/48
                                                                136/263
2010/0148662 A1    6/2010 Lee et al.

FOREIGN PATENT DOCUMENTS

CN    101787129 A    7/2010
CN    102086181 A    6/2011
(Continued)

OTHER PUBLICATIONS

A.R. Katritzky et al., "Synthesis and Transformations of 1-(1,3-Butadien-1-yl)benzotriazoles," Center for Heterocyclic Compounds, Journal of Heterocyclic Chemistry, 1993, pp. 1073-1077, vol. 30, issue 4.
(Continued)

*Primary Examiner* — Mark Kopec
*Assistant Examiner* — Jaison P Thomas
(74) *Attorney, Agent, or Firm* — Ryan, Mason & Lewis, LLP

(57) ABSTRACT

The invention relates to purely organic molecules according to formula A without metal center and their use as emitters in organic light-emitting diodes (OLEDs) and in other optoelectronic devices

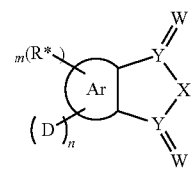

Formula A with
Y is independently selected from the group consisting of C, PR, S, and S(=O);
W is independently selected from the group consisting of $C(CN)_2$, NR, O, and S;
X is selected from the group consisting of $CR^2$, $C=C(CN)_2$, NR, O, and S;
Ar is a substituted aryl or heteroaryl group with 5 to 40 aromatic ring atoms, which is substituted with m same or (Continued)

HOMO

LUMO different radicals R* and with n same or different donor groups D with electron-donating properties, wherein m+n equals the number of substitutable ring atoms and wherein D comprises a structure of formula I:

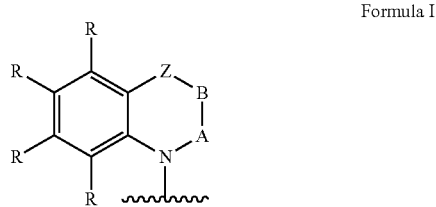

Formula I wherein

A and B are independently selected from the group consisting of CRR', CR, NR, and N, wherein there is a single of a double bond between A and B and a single or a double bond between B and Z;

Z is a direct bond or a divalent organic bridge group selected from the group consisting of a substituted or unsubstituted C1-C9-alkylene group, C2-C8-alkenylene group, C2-C8-alkynylene or arylene group or a combination of these, —CRR'—, —C=CRR'—, —C=NR—, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene groups, and phenyl or substituted phenyl units; wherein the waved line indicates the position over which D is bound to Ar.

13 Claims, 21 Drawing Sheets

(51) Int. Cl.
  C09K 11/06      (2006.01)
  H01L 51/50      (2006.01)
(52) U.S. Cl.
  CPC ...... *H01L 51/0053* (2013.01); *H01L 51/0058* (2013.01); *H01L 51/0067* (2013.01); *H01L 51/0071* (2013.01); *H01L 51/0072* (2013.01); *H01L 51/50* (2013.01); *C09K 2211/104* (2013.01); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1096* (2013.01); *H01L 51/5012* (2013.01); *Y02E 10/549* (2013.01)

(58) Field of Classification Search
CPC .... C09K 2211/1033; C09K 2211/1037; C09K 2211/104; C09K 2211/1044; C09K 2211/1096; H01L 51/0053; H01L 51/0058; H01L 51/0067; H01L 51/0069; H01L 51/0071; H01L 51/0072; H01L 51/50; H01L 51/5012; Y02E 10/549; H01B 1/12

See application file for complete search history.

(56) References Cited

FOREIGN PATENT DOCUMENTS

| CN | 102344404 A | 2/2012 |
| JP | 2007191636 A | 8/2007 |
| WO | WO2001/044247 A3 | 6/2001 |
| WO | PCT/EP2015/071309 | 12/2015 |

OTHER PUBLICATIONS

Database Registry [online Chemical Abstract Service, US; CAS Reg.No. 1477945-35-9; 5-(5-amino1 H benzimidazole-1-yl)-1H-Isoindole-1,3(2H)-dione Retrieved from STN; Entered STN:Nov. 21, 2013.

Database Registry [online Chemical Abstract Service, US; CAS Reg.No. 1038303-03-5, 5-(2-amino-1H-benzimidazol-1-yl)-1H-Isoindole-1,3(2H9-dione Retrieved from STN; Entered STN: Aug. 4, 2008.

Database Registry [online Chemical Abstract Service, US; CAS Reg.No. 1038302-16-7, 5-(2,3-dihydro-2-thioxo-1H-benzimidazol-1-yl)-1H-Isoindole-1,3(2H)-dione Retrieved from STN; Entered STN: Aug. 4, 2008.

Database Registry [online Chemical Abstract Service, US; CAS Reg.No. 440663-18-3; 5-(2,3-dihydro-1H-indol-1Yl)-2-(4-methylphenyl)-6-nitro-1H-Isondole-1,3(2H2)-dione Retrieved from STN: Jul. 29, 2002.

CAS Registry No. 1477945-35-9, STN, Nov. 22, 2013, 3 pages.
CAS Registry No. 1038303-03-5, STN, Aug. 4, 2008, 3 pages.
CAS Registry No. 1038302-16-7, STN, Aug. 4, 2008, 3 pages.
CAS Registry No. 440663-18-3, STN, Jul. 29, 2002, 3 pages.

* cited by examiner

HOMO　　　　　　　　　　　　LUMO

ORGANIC MOLECULES FOR USE AS EMITTERS

CROSS-REFERENCE TO RELATED APPLICATIONS

This application claims priority to International Application No. PCT/EP2015/071309, filed Sep. 17, 2015, which claims priority to European Patent Application No. 14 185 118.8 filed Sep. 17, 2014 and European Patent Application No. 14 193 686.4 filed Nov. 18, 2014, the disclosures of which are incorporated by reference herein in their entireties.

FIELD OF INVENTION

The invention relates to purely organic molecules (dyes) without metal centers of the general formula A and their use as emitters in OLEDs (organic light emitting diodes) and in other optoelectronic devices.

BACKGROUND

Introduction

Optoelectronic devices are characterized by the fact that either electric energy is converted into photons (OLED, LEEC) or the inverse process takes place (OPV). Thereby, it is important that these processes run as efficiently as possible. Thus, in the area of OLEDs, ideally materials with high photoluminescent quantum yield are used. However, it also has to be taken into account that, as known to the skilled artisan, 25% singlet excitons and 75% triplet excitons are generated in an OLED. This results is an ordinary fluorescence emitter reaching a maximum internal quantum yield of 25%. At the same time, the generated long-lived non-emitting triplet states cause a strongly declining efficiency at higher currents (so-called efficiency roll-of).

In order to avoid these disadvantages and to utilize all charge carriers, the concept of triplet-harvesting, which ist known to a person of skilled in the art, can be used. For this, expensive heavy-atom complexes (e.g. iridium or platinum) generally need to be used (for this see for example: M. A. Baldo, D. F. O'Brian, M. E. Thompson, S. R. Forrest, Phys. Rev. B 1999, 60, 14422 and H. Yersin, Top. Curr. Chem. 2004, 241, 1).

Another alternative is the use of materials that show thermally activated delayed fluorescence (TADF). The triplet excitons generated in this process can be converted into singlet excitons, and from this state photons can be emitted. A prerequisite for such a thermal re-population is a small energetic gap between the lowermost excited singlet-($S_1$) and the triplet-level ($T_1$). This can be achieved, for example, by use of copper(I) complexes (see e.g.: H. Yersin, U. Monkowius, T. Fischer, T. Hofbeck, WO 2010/149748 A1, 2010) but also by using purely organic materials (see e.g.: K. Shizu, H. Tanaka, H. Nakanotani, C. Adachi, WO 2013/172255 A1; H. Uoyama, K. Goushi, K. Shizu, H. Nomura, C. Adachi, Nature 2012, 492, 234).

Intensive research in this area shows that despite some already existing concepts for such emitter materials, there is still great need for new materials. One reason for this is that both different applications (screen technology, lighting, smart packaging, etc.) and differenc production methods (vacuum, liquid or hybrid processings) exist. In particular for liquid processing, the solubility and insolubility in specific solvents needs to be considered (orthogonality) such that layers can be applied in sequence without an already deposited layer dissolving again. Besides the properties of these materials that were already mentioned, their availability is also relevant for a commercialization. This pertains also to the availability of synthesis building blocks as well as to the effort for the synthesis of the functional material, and its purification.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS OF THE INVENTION

Figure 1:
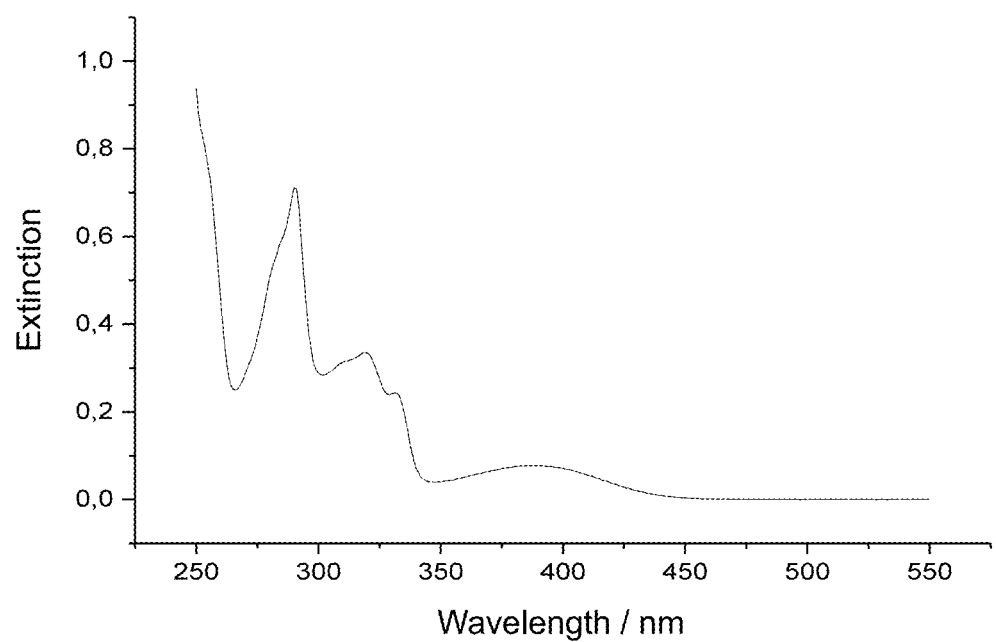
FIG. 1 is an absorption spectrum of product 2 in dichloromethane.

Exemplary embodiments of the invention will now be discussed in further detail. This invention may, however, be embodied in many different forms and should not be construed as limited to the embodiments set forth herein.

In one aspect, the invention relates to the provision of molecules, which comprise a structure of the general formula A or consist thereof.

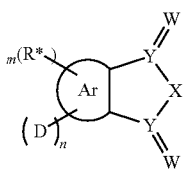

Formula A with

Y=independently from each other selected from the group consisting of C, PR, S, S(=O), wherein C and S(=O) are preferred;

W=independently from each other selected from the group consisting of $C(CN)_2$, NR, O, S, wherein O and S are preferred;

X=selected from the group consisting of $CR^2$, C=C$(CN)_2$, NR, O, S, wherein NR and O are preferred;

and wherein in particular the following combinations of X, Y and W are possible:

| X | Y | W |
|---|---|---|
| NR | C | O |
| NR | PR | O |
| NR | S(=O) | O |
| O | C | O |
| O | PR | O |
| O | S(=O) | O |
| NR | C | $C(CN)_2$ |
| O | C | $C(CN)_2$ |
| NR | S | O |
| O | S | O |
| O | C | S |
| S | C | S |
| S | C | O |
| $CR^2$ | C | O |
| $CR^2$ | PR | O |
| $CR^2$ | S(=O) | O |
| C=C$(CN)_2$ | C | O |
| C=C$(CN)_2$ | PR | O |
| C=C$(CN)_2$ | S(=O) | O |

Ar=a substituted aryl or heteroaryl group with 5 to 40 aromatic ring atoms, which is substituted with m same or different radicals R* and with n same or different donor groups D with electron-donating properties, wherein m+n equals the number of substitutable ring atoms and wherein D comprises a structure of formula I:

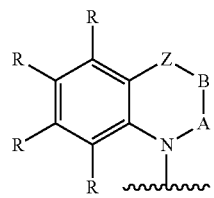

Formula I wherein

A and B=independently from each other selected from the group consisting of CRR', CR, NR, N, wherein there is a single or a double bond between A and B and a single or a double bond between B and Z;

Z=a direct bond or a divalent organic bridge, which is a substituted or unsubstituted C1-C9-alkylene, C2-C8-alkenylene, C2-C8-alkynylene or arylene group or a combination of these, —CRR'—, —C=CRR', —C=NR, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene groups, phenyl or substituted phenyl units; wherein the waved line indicates the position over which D is bound to Ar;

wherein each R*, R and R' at each occurrence is the same or different H, deuterium, F, Cl, Br, I, $N(R^2)_2$, CN, $CF_3$, $NO_2$, OH, COOH, $COOR^2$, $CO(NR^2)_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^2$, wherein one or more not adjacent $CH_2$-groups can be replaced by $R^2C=CR^2$, C=C, $Si(R^2)_2$, $Ge(R^2)_2$, $Sn(R^2)_2$, C=O, C=S, C=Se, C=$NR^2$, P(=O)$(R^2)$, SO, $SO_2$, $NR^2$, O, S or $CONR^2$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^2$, or an aryloxy or heteroaryloxy group with 5 to 60 aromatic ring atoms, which can be substituted by one or more radicals $R^2$, or a diarylamino group, diheteroarylamino group or arylheteroarylamino group with 10 to 40 aromatic ring atoms, which can be substituted by one or more radicals $R^2$, or a combination of these systems, or a cross-linkable unit QE, which can be cross-linked by acid-catalyzed, base-catalyzed, thermal or UV cross-linking processes in presence or absence of a photo initiator or by microwave radiation; thereby two or more of the substituents R*, R and R' can also form with each other a mono- or polycyclic, aliphatic, aromatic and/or benzoannulated ring system;

$R^2$ is at each occurrence same or different H, deuterium, F, Cl, Br, I, $N(R^3)_2$, CN, $CF_3$, $NO_2$, OH, COOH, $COOR^3$, CO(NR$^3$)$_2$, Si(R$^3$)$_3$, B(OR$^3$)$_2$, C(=O)R$^3$, P(=O)(R$^3$)$_2$, S(=O)R$^3$, S(=O)$_2$R$^3$, OSO$_2$R$^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^3$, wherein one or more not adjacent CH$_2$-groups can be replaced by R$^3$C=CR$^3$, C≡C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^3$, or an aryloxy or heteroaryloxy group with 5 to 60 aromatic ring atoms, which can be substituted by one or more radicals R$^3$, or a diarylamino group, diheteroarylamino group or arylheteroarylamino group with 10 to 40 aromatic ring atoms, which can be substituted by one or more radicals R$^3$, or a combination of these systems; thereby two or more of these substituents R$^2$ can also form with each other a mono- or polycyclic, aromatic and/or benzoannulated ring system;

R$^3$ is at each occurrence same or different H, deuterium, F, CF$_3$ or an aliphatic, aromatic and/or heteroaromatic hydrocarbon radical with 1 to 20 C-atoms, in which one or more H-atoms can also be replaced by F oder CF$_3$; thereby two or more substituents R$^3$ can also form with each other a mono- or polycyclic aliphatic ring system.

In one embodiment, the cross-linkable units QE are a compound selected from the group consisting of oxetanes, alkynes and azides, in particular for a click-reaction, as well as the following alkene derivatives:

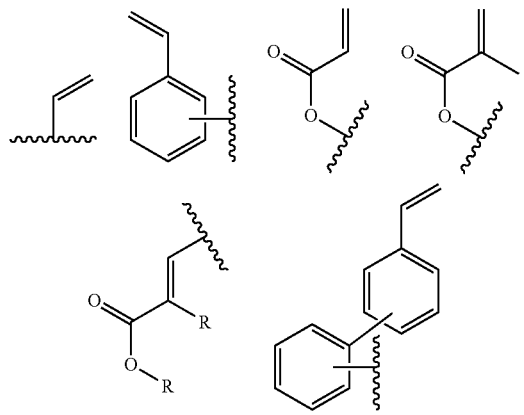

In an alternative embodiment, Z is a covalent single bond or a bivalent organic bridge selected from substituted or unsubstituted alkylene (also branched and cyclic), alkenylene, alkynylene, arylene or heteroarylene groups, O, NR, C=CR$_2$, C=NR, SiR$_2$S, S(O), S(O)$_2$, BR, PR, P(O)R, wherein combinations of these units are also possible (e.g. O-interrupted alkylene (also branched or cyclic), alkenylene, alkynylene, arylene and heteroarylene groups).

In another embodiment, Y=C, W=O and X=NR.

In one embodiment, Ar is a substituted aryl or heteroaryl group with 5 to 40 aromatic ring atoms, which is substituted with m same or different radicals R* and with n donor groups D with electron-donating properties, wherein m+n equals the number of substitutable ring atoms. The donor group D is selected in particular from the group consisting of substituted and unsubstituted carbazole, substituted and unsubstituted indole, substituted and unsubstituted indoline, substituted and unsubstituted dihydroacridine, substituted and unsubstituted benzimidazole, substituted and unsubstituted 2,3,4,9-tetrahydrocarbazole, substituted and unsubstituted 1,2,3,4-tetrahydroquinoline, substituted and unsubstituted phenothiazine, substituted and unsubstituted phenoxazine, substituted and unsubstituted dihydrophenazine, substituted and unsubstituted spiro compounds.

The molecules according to the invention offer the possibility of implementing various properties by insertion of the radicals R$^1$, R$^2$, R$^3$ and in particular R* and R: the solubility in different solvents can be adjusted; groups for cross-linking can be easily inserted (e.g. alkenes, alkynes, ocetanes), the acceptor strength can be varied by more or less electron-donating or electron-accepting substituents, allowing for the emission color of the entire molecule to be influenced.

An aryl group contains 6 to 40 C-Atome; a heteroaryl group contains 2 to 40 C-atoms and at least one heteroatom, with the limitation that the sum of C-atoms and heteroatoms is at least 5. The heteroatoms are preferably selected from N, O and/or S. Thereby an aryl group and accordingly a heteroarylgroup is taken to mean either a simple aromatic cycle, thus benzene, and accordingly a simple heteroaromatic cycle, for example pyridine, pyrimidine, thiophene, etc. or a condensed aryl of heteroaryl group, for example naphthaline, anthracene, phenanthrene, quinolone, isoquinoline, etc. An aromatic ring system in the sense of this invention contains 6 to 60 C-atoms in the ring system. A heteroaromatic ring system in the sense of this invention contains 1 to 60 C-atoms and at least one heteroatom in the ring system, with the provisio that the sum of C-atoms and heteroatoms is at least 5. The heteroatoms are preferably selected from N, O and/or S. An aromatic or heteroaromatic ring system in the sense of the invention is intended to be taken to mean a system that does not necessarily contain only aryl or heteroaryl groups, but instead in which also some aryl or heteroaryl groups can be interrupted by a non-aromatic unit (preferably less then 10% of the atoms other than H), such as for example a C-, N- or O-atom or a carbonyl group. Thus, for example, systems such as 9,9'-spirobifluorene, 9,9-diarylfluorene, triarylamine, diaryl ether, stilbene, etc. are also intended to be taken to be aromatic ring systems in the sense of this invention, and also systems, in which two or more aryl groups are for example interrupted by a linear or cyclic alkyl group or by a silyl group. Furthermore, systems in which two or more aryl or heteroaryl are directly linked to one another, such as for example biphenyl or terphenyl, are also taken to be an aromatic or heteroaromatic ring system. A cyclic alkyl, alkoxy or thioalkoxy group is taken to mean a monocyclic, a bicyclic or a polycyclic group.

In line with the present invention a C$_1$-bis C$_{40}$-alkyl group, in which also single H-atoms or CH$_2$-groups can be substituted with the groups mentioned above, is taken to mean for example the radicals methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, trifluor-methyl, pentafluorethyl, 2,2,2-trifluorethyl, 1,1-dimethyl-n-hex-1-yl-, 1,1-dimethyl-n-hept-1-yl-, 1,1-dimethyl-n-oct-1-yl-, 1,1-dimethyl-n-dec-1-yl-, 1,1-dimethyl-n-dodec-1-yl-, 1,1-dimethyl-n-tetradec-1-yl-, 1,1-dimethyl-n-hexadec-1-yl-, 1,1-dimethyl-n-octadec-1-yl-, 1,1-diethyl-n-hex-1-yl-, 1,1-diethyl-n-hept-1-yl-, 1,1-diethyl-n-oct-1-yl-, 1,1-diethyl-n-dec-1-yl-, 1,1-diethyl-n-dodec-1-yl-, 1,1-diethyl-n-tetradec-1-yl-, 1,1-diethyln-n-hexadec-1-yl-, 1,1-diethyl-n-octadec-1-yl-, 1-(n-propyl)-cyclohex-1-yl-, 1-(n-butyl)-cyclohex-1-yl-, 1-(n-hexyl)-cyclohex-1-yl-, 1-(n-octyl)-cyclohex-1-yl- and 1-(n-decyl)-cyclohex-1-yl-. An alkenyl group is taken to mean for example ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is taken to mean for example ethynyl, propynyl, butynyl, pentynyl, hexynyl, heptynyl or octynyl. A $C_1$ to $C_{40}$-alkoxy group is taken to mean for example methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system with 5-60 aromatic ring atoms, which each can be substituted with the radicals mentioned above and which can be linked via any position at the aromatic compound and accordingly heteroaromatic compound, is taken to mean for example groups derived from benzene, naphthaline, anthracene, benzanthracene, phenanthrene, benzophenanthrene, pyrene, chrysene, perylene, fluoranthene, benzfluoranthene, naphthacene, pentacene, benzpyrene, biphenyl, biphenylene, terphenyl, terphenylen, fluorene, spiro-bifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroiso-truxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinolinr, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazin-imidazole, quinoxalinimidazole, oxazole, benzoxazole, naphthoxazole, anthroxazole, phenanthroxazole, isoxazole, 1,2-thiazole, 1,3-thiazole, benzo-thiazole, pyridazine, benzopyridazine, pyrimidine, benzpyrimidine, chinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In one embodiment of the invention the organic molecule comprises a structure of formula B:

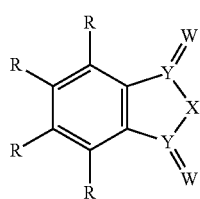

Formula B with

Y=independently from each other selected from the group consisting of C, PR, S, S($=$O), wherein C and S($=$O) are preferred;

W=independently from each other selected from the group consisting of $C(CN)_2$, NR, O, S, wherein O and S are preferred;

X=selected from the group consisting of $CR^2$, C$=$C$(CN)_2$, NR, O, S, wherein $CR^2$, NR and O are preferred;

and wherein in particular the following combinations for X, Y and W are possible:

| X | Y | W |
|---|---|---|
| NR | C | O |
| NR | PR | O |
| NR | S($=$O) | O |
| O | C | O |
| O | PR | O |
| O | S($=$O) | O |
| NR | C | $C(CN)_2$ |
| O | C | $C(CN)_2$ |
| NR | S | O |
| O | S | O |
| O | C | S |
| S | C | S |
| S | C | O |
| $CR^2$ | C | O |
| $CR^2$ | PR | O |
| $CR^2$ | S($=$O) | O |
| C$=$C$(CN)_2$ | C | O |
| C$=$C$(CN)_2$ | PR | O |
| C$=$C$(CN)_2$ | S($=$O) | O | and wherein at least one R at the aryl ring is a donor D, with D=one or more same or different donor groups with electron-donating properties, wherein D comprises a structure of formula I described above.

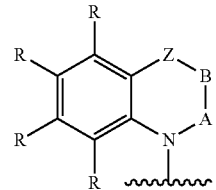

Formula I wherein

A and B=independently from each other selected from the group consisting of CRR', CR, NR, N, wherein there is a single or a double bond between A and B and a single or a double bond between B and Z;

Z=a direct bond or a divalent organic bridge, which is a substituted or unsubstituted C1-C9-alkylene, C2-C8-alkenylene, C2-C8-alkynylene or arylene group or a combination of these, —CRR', —C$=$CRR', —C$=$NR, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene group, phenyl or substituted phenyl units; wherein the waved line indicates the position over which D is bound to the phenyl ring in formula B; each R and R' at each occurrence is same or different H, deuterium, F, Cl, Br, I, $N(R^2)_2$, CN, $CF_3$, $NO_2$, OH, COOH, $COOR^2$, $CO(NR^2)_2$, $Si(R^2)_3$, $B(OR^2)_2$, C($=$O)$R^2$, P($=$O)$(R^2)_2$, S($=$O)$R^2$, S($=$O)$_2R^2$, $OSO_2R^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^2$, wherein one or more not adjacent $CH_2$-groups can be replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, $SO$, $SO_2$, $NR^2$, $O$, $S$ or $CONR^2$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^2$, or an aryloxy or heteroaryloxy group with 5 to 60 aromatic ring atoms, which can be substituted by one or more radicals $R^2$, or a diarylamino group, diheteroarylamino group or arylheteroarylamino group with 10 to 40 aromatic ring atoms, which can be substituted by one or more radicals $R^2$, or a combination of these systems, or a cross-linkable unit QE, which can be cross-linked by acid-catalyzed, base-catalyzed, thermal or UV cross-linking processes in the presence or absence of a photo initiator or by microwave radiation; thereby, two or more of the substituents R and R' can also form a mono- or polycyclic, aliphatic, aromatic and/or benzoannulated ring system with each other;

$R^2$ is at each occurrence same or different H, deuterium, F, Cl, Br, I, $N(R^3)_2$, CN, $CF_3$, $NO_2$, OH, COOH, $COOR^3$, $CO(NR^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^3$, wherein one or more not adjacent $CH_2$-groups can be replaced by $R^3C=CR^3$, $C≡C$, $Si(R^3)_2$, $Ge(R^3)_2$, $Sn(R^3)_2$, $C=O$, $C=S$, $C=Se$, $C=NR^3$, $P(=O)(R^3)$, $SO$, $SO_2$, $NR^3$, $O$, $S$ or $CONR^3$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^3$, or an aryloxy or heteroaryloxy group with 5 to 60 aromatic ring atoms, which can be substituted by one or more radicals $R^3$, or a diarylamino group, diheteroarylamino group or arylheteroarylamino group with 10 to 40 aromatic ring atoms, which can be substituted by one or more radicals $R^3$, or a combination of these systems; thereby two or more of these substituents $R^2$ can also form with each other a mono- or polycyclic, aromatic and/or benzoannulated ring system;

$R^3$ is at each occurrence the same or different H, deuterium, F, $CF_3$ or an aliphatic, aromatic and/or heteroaromatic hydrocarbon radical with 1 to 20 C-atoms, in which one or more H-atoms can be replaced by F oder $CF_3$; thereby two or more substituents $R^3$ can also form with each other a mono- or polycyclic aliphatic ring system.

In one embodiment, the cross-linkable units QE are a compound selected from the group consisting of oxetanes, alkynes and azides, in particular for the performance of a click-reaction, as well as the following alkene derivatives:

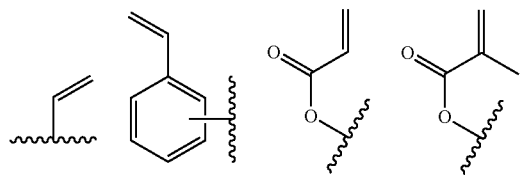

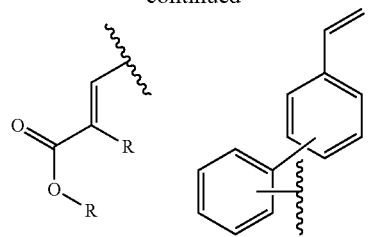

In an alternative embodiment, Z is a covalent single bond or a bivalent organic bridge selected from substituted or unsubstituted alkylene (linear, branched or cyclic), alkenylene, alkynylene, arylene or heteroarylene groups, O, NR, $C=CR_2$, $C=NR$, $SiR_2S$, S(O), $S(O)_2$, BR, PR, P(O)R, wherein combinations of these units are also possible (e.g. O-interrupted alkylene (linear, branched or cyclic), alkenylene, alkynylene, arylene and heteroarylene groups).

In a preferred embodiment, each D is independently from each other a donor group with electron-donating properties, which is selected from the group consisting of substituted and unsubstituted carbazole, substituted and unsubstituted indole, substituted and unsubstituted indoline, substituted and unsubstituted dihydroacridine, substituted and unsubstituted benzimidazole, substituted and unsubstituted 2,3,4,9-tetrahydrocarbazole, substituted and unsubstituted 1,2,3,4-tetrahydroquinoline, substituted and unsubstituted phenothiazine, substituted and unsubstituted phenoxazine, substituted and unsubstituted dihydrophenazine, substituted and unsubstituted spiro compounds.

In a further embodiment of the invention the organic molecule comprises a structure of formula C:

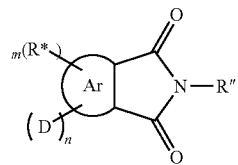

Formula C with

Ar=a substituted aryl or heteroaryl group with 5 to 40 aromatic ring atoms, which is substituted with m same or different radicals R* and with n same or different donor groups D with electron-donating properties, wherein m+n equals the number of substitutable ring atoms and wherein the donor groups D each comprise a structure of formula I:

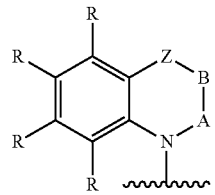

Formula I wherein

A and B=are independently from each other selected from the group consisting of CRR', CR, NR, N, wherein a single or a double bond existents between A and B and a single or a double bond exists between B and Z;

Z=a direct bond or a divalent organic bridge, which is a substituted or unsubstituted C1-C9-alkylene, C2-C8-alkenylene, C2-C8-alkynylene or arylene group or a combination of these, —CRR', —C=CRR', —C=NR, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene group, phenyl or substituted phenyl units; wherein the waved line indicates the position over which D is bound to Ar;

wherein each R*, R and R' at each occurrence is the same or different H, deuterium, azide, F, Cl, Br, I, N(R$^2$)$_2$, CN, CF$_3$, NO$_2$, OH, COOH, COOR$^2$, CO(NR$^2$)$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^2$, wherein one or more not adjacent CH$_2$-groups can be replaced by R$^2$C=CR$^2$, C=C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^2$, or an aryloxy or heteroaryloxy group with 5 to 60 aromatic ring atoms, which can be substituted by one or more radicals R$^2$, or a diarylamino group, diheteroarylamino group or arylheteroarylamino group with 10 to 40 aromatic ring atoms, which can be substituted by one or more radicals R$^2$, or a combination of these systems, or a cross-linkable unit QE, which can be cross-linked by acid-catalyzed, base-catalyzed, thermal or UV cross-linking processes in presence or absence of a photo initiator or by microwave radiation; thereby two or more of the substituents R*, R and R' can also form with each other a mono- or polycyclic, aliphatic, aromatic and/or benzoannulated ring system;

R$^2$ is at each occurrence the same or different H, deuterium, F, Cl, Br, I, N(R$^3$)$_2$, CN, CF$_3$, NO$_2$, OH, COOH, COOR$^3$, CO(NR$^3$)$_2$, Si(R$^3$)$_3$, B(OR$^3$)$_2$, C(=O)R$^3$, P(=O)(R$^3$)$_2$, S(=O)R$^3$, S(=O)$_2$R$^3$, OSO$_2$R$^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^3$, wherein one or more not adjacent CH$_2$-groups can be replaced by R$^3$C=CR$^3$, C=C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^3$, or an aryloxy or heteroaryloxy group with 5 to 60 aromatic ring atoms, which can be substituted by one or more radicals R$^3$, or a diarylamino group, diheteroarylamino group or arylheteroarylamino group with 10 to 40 aromatic ring atoms, which can be substituted by one or more radicals R$^3$, or a combination of these systems; thereby two or more of these substituents R$^2$ can also form with each other a mono- or polycyclic, aromatic and/or benzoannulated ring system;

R$^3$ is at each occurrence same or different H, deuterium, F, CF$_3$ or an aliphatic, aromatic and/or heteroaromatic hydrocarbon radical with 1 to 20 C-atoms, in which one or more H-atoms can also be replaced by F oder CF$_3$; thereby two or more substituents R$^3$ can also form with each other a mono- or polycyclic aliphatic ring system;

and R" bears the same meaning as R or is in one embodiment an organic bridge via which the same or a different second unit of formula C is bound, thus forming a dimeric system, or is in a further embodiment a cross-linkable unit QE, which can be cross-linked by acid-catalyzed, base-catalyzed, thermal or UV cross-linking processes in the presence or absence of a photo initiator or by microwave radiation.

In one embodiment, the cross-linkable units QE are a compound selected from the group consisting of oxetanes, alkynes and azides, in particular for a click-reaction, as well as the following alkene derivatives:

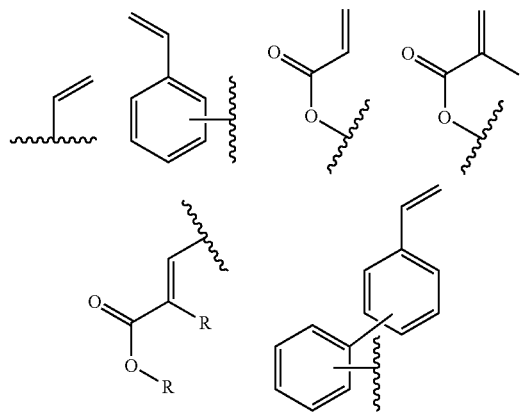

In an alternative embodiment, Z is a covalent single bond or a bivalent organic bridge selected from substituted or unsubstituted alkylene (also branched or cyclic), alkenylene, alkynylene, arylene or heteroarylene groups, O, NR, C=CR$_2$, C=NR, SiR$_2$S, S(O), S(O)$_2$, BR, PR, P(O)R, wherein combinations of these units are also possible (e.g. O-interrupted alkylene (also branched or cyclic), alkenylene, alkynylene, arylene and heteroarylene groups).

In one embodiment, Ar is a substituted aryl or heteroaryl group with 5 to 40 aromatic ring atoms, which is substituted with m same or different radicals R* and with n donor groups D with electron-donating properties, wherein m+n equals the number of substitutable ring atoms and wherein the donor group D is selected from the group consisting of substituted and unsubstituted carbazole, substituted and unsubstituted indole, substituted and unsubstituted indoline, substituted and unsubstituted dihydroacridine, substituted and unsubstituted benzimidazole, substituted and unsubstituted 2,3,4,9-tetrahydrocarbazole, substituted and unsubstituted 1,2,3,4-tetrahydroquinoline, substituted and unsubstituted phenothiazine, substituted and unsubstituted phenoxazine, substituted and unsubstituted dihydrophenazine, substituted and unsubstituted spiro compounds.

In a further embodiment of the invention, the organic molecule comprises a structure of formula D:

Formula D

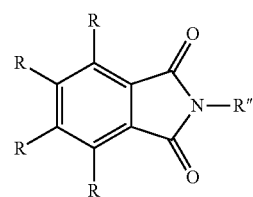

wherein at least one R at the aryl ring is a donor D, with D=one or more identical or different donor groups with electron-donating properties, which comprises a structure of formula I:

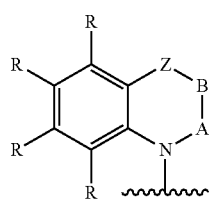

Formula I wherein

A and B=are independently from each other selected from the group consisting of CRR', CR, NR, N, wherein there is a single or a double bond between A and B and a single or a double bond between B and Z;

Z=a direct bond or a divalent organic bridge, which is a substituted or unsubstituted C1-C9-alkylene, C2-C8-alkenylene, C2-C8-alkynylene or arylene group or a combination of these, —CRR', —C=CRR', —C=NR, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene group, phenyl or substituted phenyl units; wherein the waved line indicates the position over which D is bound to the phenyl ring in formula D;

wherein each R and R' at each occurrence is same or different H, deuterium, azide, F, Cl, Br, I, N(R$^2$)$_2$, CN, CF$_3$, NO$_2$, OH, COOH, COOR$^2$, CO(NR$^2$)$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^2$, wherein one or more not adjacent CH$_2$-groups can be replaced by R$^2$C=CR$^2$, C=C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^2$, or an aryloxy or heteroaryloxy group with 5 to 60 aromatic ring atoms, which can be substituted by one or more radicals R$^2$, or a diarylamino group, diheteroarylamino group or arylheteroarylamino group with 10 to 40 aromatic ring atoms, which can be substituted by one or more radicals R$^2$, or a combination of these systems, or a cross-linkable unit QE, which can be cross-linked by acid-catalyzed, base-catalyzed, thermal or UV cross-linking processes in presence or absence of a photo initiator or by microwave radiation; thereby two or more of the substituents R and R' can also form with each other a mono- or polycyclic, aliphatic, aromatic and/or benzoannulated ring system;

R$^2$ is at each occurrence the same or different H, deuterium, F, Cl, Br, I, N(R$^3$)$_2$, CN, CF$_3$, NO$_2$, OH, COOH, COOR$^3$, CO(NR$^3$)$_2$, Si(R$^3$)$_3$, B(OR$^3$)$_2$, C(=O)R$^3$, P(=O)(R$^3$)$_2$, S(=O)R$^3$, S(=O)$_2$R$^3$, OSO$_2$R$^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^3$, wherein one or more not adjacent CH$_2$-groups can be replaced by R$^3$C=CR$^3$, C≡C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^3$, or an aryloxy or heteroaryloxy group with 5 to 60 aromatic ring atoms, which can be substituted by one or more radicals R$^3$, or a diarylamino group, diheteroarylamino group or arylheteroarylamino group with 10 to 40 aromatic ring atoms, which can be substituted by one or more radicals R$^3$, or a combination of these systems; thereby two or more of these substituents R$^2$ can also form with each other a mono- or polycyclic, aromatic and/or benzoannulated ring system;

R$^3$ is at each occurrence the same or different H, deuterium, F, CF$_3$ or an aliphatic, aromatic and/or heteroaromatic hydrocarbon radical with 1 to 20 C-atoms, in which one or more H-atoms can also be replaced by F oder CF$_3$; thereby two or more substituents R$^3$ can also form with each other a mono- or polycyclic aliphatic ring system;

and R" bears the same meaning as R or is in one embodiment an organic bridge via which a second same or different unit of formula D is bound, thus forming a dimeric system, or is in a further embodiment a cross-linkable unit QE, which can be cross-linked by acid-catalyzed, base-catalyzed, thermal or UV cross-linking processes.

In one embodiment, the cross-linkable units QE are a compound selected from the group consisting of oxetanes, alkynes and azides for a click-reaction, as well as the following alkene derivatives:

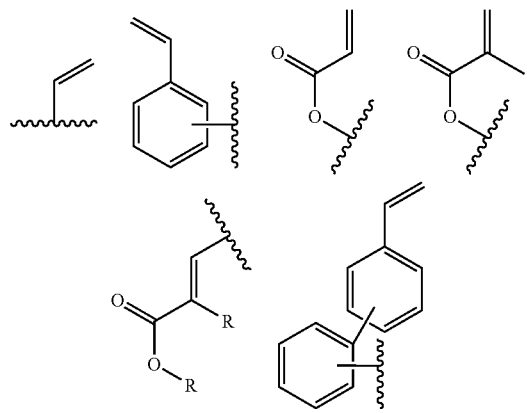

In an alternative embodiment, Z is a covalent single bond or a bivalent organic bridge selected from substituted or unsubstituted alkylene (linear, branched or cyclic), alkenylene, alkynylene, arylene or heteroarylene groups, O, NR, C=CR$_2$, C=NR, SiR$_2$S, S(O), S(O)$_2$, BR, PR, P(O)R, wherein combinations of these units are also possible (e.g. O-interrupted alkylene (linear, branched or cyclic), alkenylene, alkynylene, arylene and heteroarylene groups).

In one embodiment, each D is independently from each a donor group with electron-donating properties, which is selected from the group consisting of substituted and unsubstituted carbazole, substituted and unsubstituted indole, substituted and unsubstituted indoline, substituted and unsubstituted dihydroacridine, substituted and unsubstituted benzimidazole, substituted and unsubstituted 2,3,4,9-tetrahydrocarbazole, substituted and unsubstituted 1,2,3,4-tetrahydroquinoline, substituted and unsubstituted phenothiazine, substituted and unsubstituted phenoxazine, substituted and unsubstituted dihydrophenazine, substituted and unsubstituted spiro compounds.

In one embodiment, R″ is selected from the following groups:

Alkyl radicals (linear, branched, partly fluorinated, (hetero)aryl substituted, (poly)ether, ester, alcohol substituted) such as, for example,

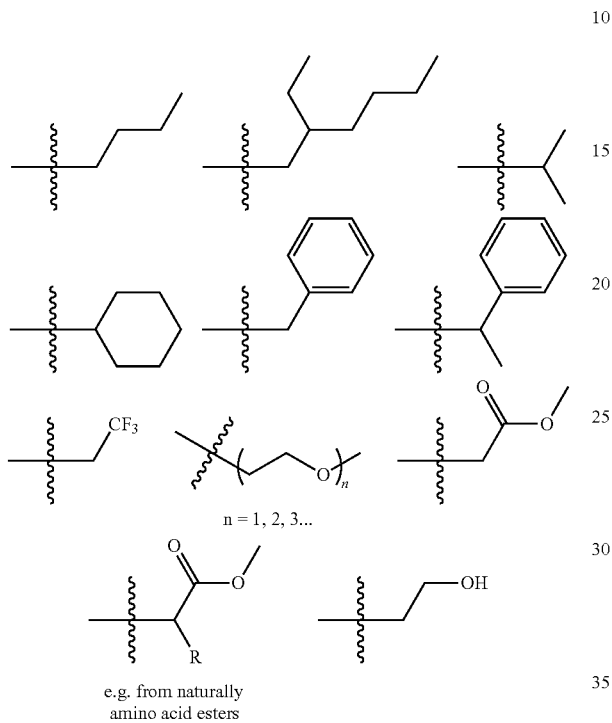

n = 1, 2, 3...

e.g. from naturally amino acid esters (Hetero-)aryl radicals (alkyl substituted, substituted with electron-withdrawing and/or electron-donating groups) such as, for example,

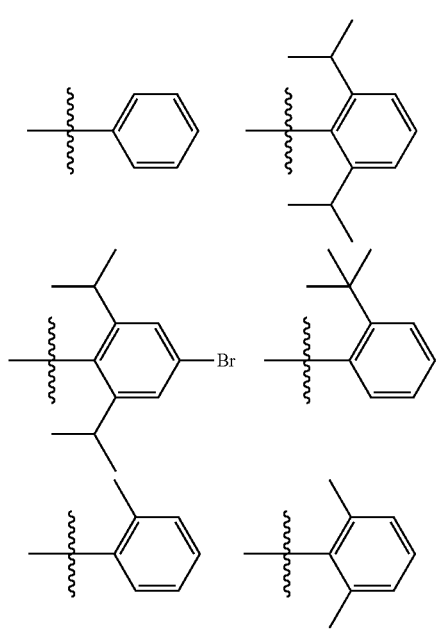

-continued

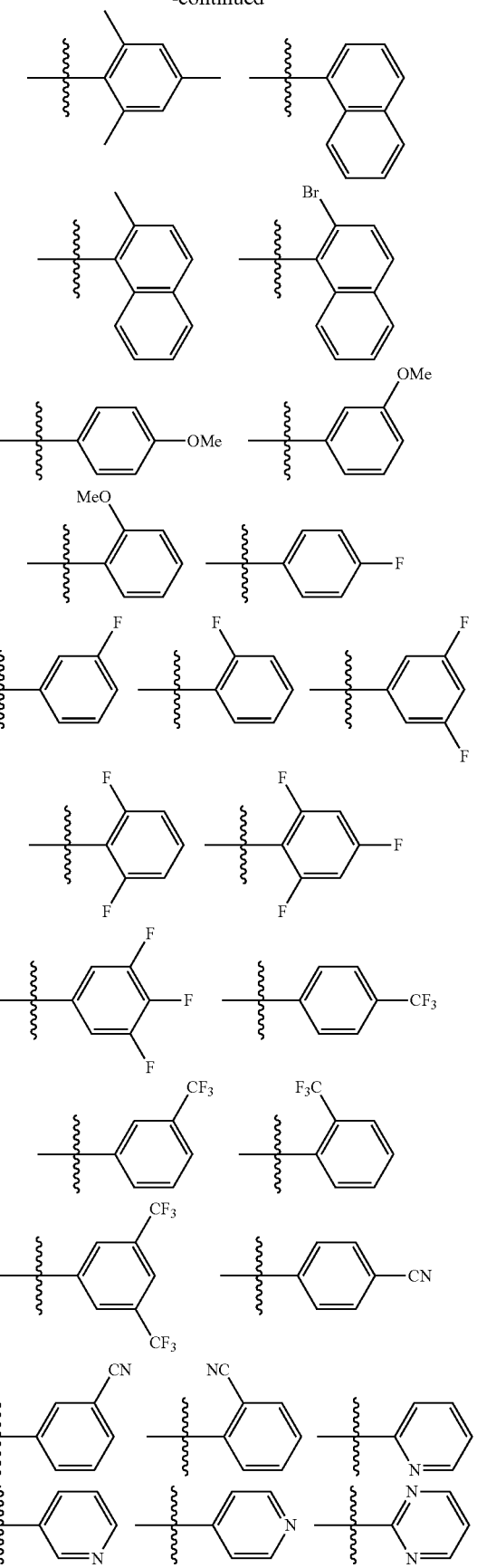

-continued

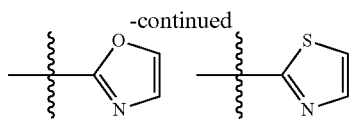

In a preferred embodiment, the organic molecule comprises a structure of formula D*:

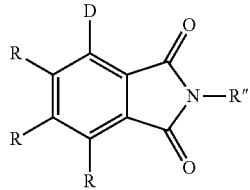

Formula D* wherein R, R" and D are defined as in formula D, with the provisio that R cannot be a donor.

In a particularly preferred embodiment, the organic molecule comprises a structure of formula D**:

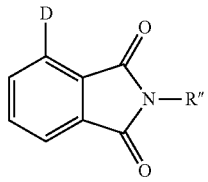

Formula D** wherein R" and D are defined as in formula D.

In a further embodiment of the invention, the organic molecule comprises a structure of formula E:

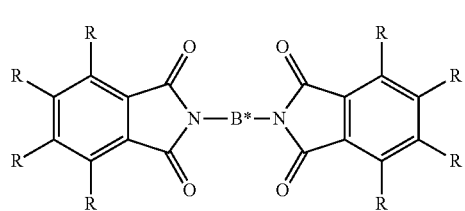

Formula E wherein at least one R at the aryl ring is a donor D, with

D=each a donor group with electron-donating properties, which comprises a structure of formula I:

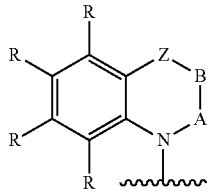

Formula I wherein

A and B=are independently from each other selected from the group consisting of CRR', CR, NR, N, wherein there is a single or a double bond between A and B and a single or a double bond between B and Z;

Z=a direct bond or a divalent organic bridge, which is a substituted or unsubstituted C1-C9-alkylene, C2-C8-alkenylene, C2-C8-alkynylene or arylene group or a combination of these, —CRR', —C=CRR', —C=NR, —NR—, —O—, —SiRR'—, —S—, —S(O)—, —S(O)$_2$—, O-interrupted substituted or unsubstituted C1-C9-alkylene, C2-C8-alkenylene, C2-C8-alkynylene or arylene group, phenyl or substituted phenyl units; wherein the waved line indicates the position over which D is bound to the phenyl ring in formula E;

B*=an organic bridge, which is a substituted or unsubstituted alkylene, alkenylene, alkynylene or arylene group or a combination of those, or —O—, —NR—, —C=CR$_2$, —C=NR, —SiR$_2$— —S—, —S(O)—, —S(O)$_2$—, O-interrupted alkyl (also branched or cyclic), heteroalkyl, aryl, heteroaryl, alkenyl groups, phenyl and substituted phenyl units, wherein each R and R' at each occurrence is the same or different H, deuterium, azide, F, Cl, Br, I, N(R$^2$)$_2$, CN, CF$_3$, NO$_2$, OH, COOH, COOR$^2$, CO(NR$^2$)$_2$, Si(R$^2$)$_3$, B(OR$^2$)$_2$, C(=O)R$^2$, P(=O)(R$^2$)$_2$, S(=O)R$^2$, S(=O)$_2$R$^2$, OSO$_2$R$^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^2$, wherein one or more not adjacent CH$_2$-groups can be replaced by R$^2$C=CR$^2$, C=C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^2$, or an aryloxy or heteroaryloxy group with 5 to 60 aromatic ring atoms, which can be substituted by one or more radicals R$^2$, or a diarylamino group, diheteroarylamino group or arylheteroarylamino group with 10 to 40 aromatic ring atoms, which can be substituted by one or more radicals R$^2$, or a combination of these systems, or a cross-linkable unit QE, which can be cross-linked by acid-catalyzed, base-catalyzed, thermal or UV cross-linking processes in presence or absence of a photo initiator or by microwave radiation; wherein two or more of the substituents R and R' can also form a mono- or polycyclic, aliphatic, aromatic and/or benzoannulated ring system with each other;

R$^2$ is at each occurrence same or different H, deuterium, F, Cl, Br, I, N(R$^3$)$_2$, CN, CF$_3$, NO$_2$, OH, COOH, COOR$^3$, CO(NR$^3$)$_2$, Si(R$^3$)$_3$, B(OR$^3$)$_2$, C(=O)R$^3$, P(=O)(R$^3$)$_2$, S(=O)R$^3$, S(=O)$_2$R$^3$, OSO$_2$R$^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R$^3$, wherein one or more not adjacent CH$_2$-groups can be replaced by R$^3$C=CR$^3$, C≡C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and wherein one or more H-atoms can be replaced by deuterium, F, Cl, Br, I, CN, CF$_3$ or NO$_2$, or an aromatic or heteroaromatic ring system with 5 to 60 aromatic ring atoms, which each can be substituted by one or more radicals R$^3$, or an aryloxy or heteroaryloxy group with 5 to 60 aromatic ring atoms, which can be substituted by one or more radicals R$^3$, or a diarylamino group, diheteroarylamino group or arylheteroarylamino group with 10 to 40 aromatic ring atoms, which can be substituted by one or more radicals R³, or a combination of these systems; thereby two or more of these substituents R² can also form with each other a mono- or polycyclic, aromatic and/or benzoannulated ring system;

R³ is at each occurrence same or different H, deuterium, F, CF₃ or an aliphatic, aromatic and/or heteroaromatic hydrocarbon radical with 1 to 20 C-atoms, in which one or more H-atoms can also be replaced by F oder CF₃; thereby two or more substituents R³ can also form with each other a mono- or polycyclic aliphatic ring system.

Exemplary, but not exhaustive, B* can be:

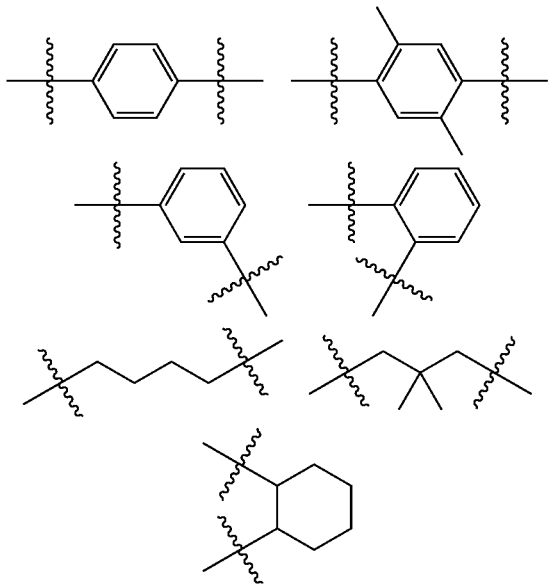

In one embodiment, the cross-linkable units QE are compounds selected from the group consisting of oxetanes, alkynes and azides for a click-reaction, as well as the following alkene derivatives:

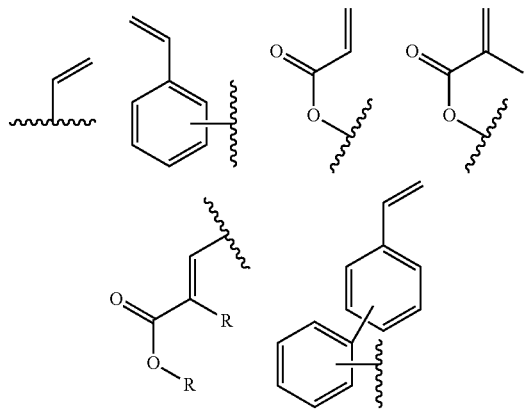

In an alternative embodiment, Z is a covalent single bond or a bivalent organic bridge selected from substituted or unsubstituted alkylene (also branched or cyclic), alkenylene, alkynylene, arylene or heteroarylene groups, O, NR, C=CR₂, C=NR, SiR₂S, S(O), S(O)₂, BR, PR, P(O)R, wherein combinations of these units are also possible (e.g., O-interrupted alkylene (also branched or cyclic), alkenylene, alkynylene, arylene and heteroarylene groups).

In an alternative embodiment, B is a bivalent organic bridge selected from substituted and unsubstituted alkylene (also branched or cyclic), alkenylene, alkynylene, arylene and heteroarylene groups, O, NR, C=CR₂, C=NR, SiR₂S, S(O), S(O)₂, BR, PR, P(O)R, wherein combinations of these units are also possible (e.g. O-interrupted alkylene (also branched or cyclic), alkenylene, alkynylene, arylene and heteroarylene groups).

In one embodiment, each D is independently from each a donor group with electron-donating properties, which is selected from the group consisting of substituted and unsubstituted carbazole, substituted and unsubstituted indole, substituted and unsubstituted indoline, substituted and unsubstituted dihydroacridine, substituted and unsubstituted benzimidazole, substituted and unsubstituted 2,3,4,9-tetrahydrocarbazole, substituted and unsubstituted 1,2,3,4-tetrahydroquinoline, substituted and unsubstituted phenothiazine, substituted and unsubstituted phenoxazine, substituted and unsubstituted dihydrophenazine, substituted and unsubstituted spiro compounds.

In a further embodiment of the invention, the donor group with electron-donating properties of formula I comprises a structure of formula II:

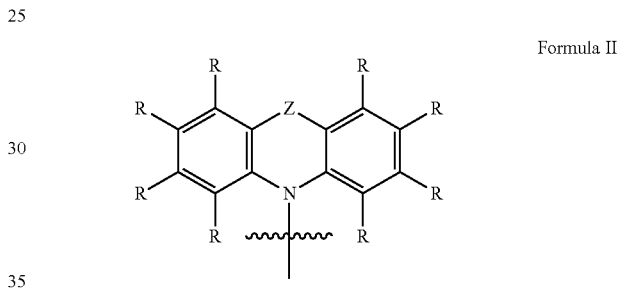

Formula II wherein

Z=a direct bond or a divalent organic bridge, which is a substituted or unsubstituted C1-C9-alkylene, C2-C8-alkenylene, C2-C8-alkynylene or arylene group or a combination of these, —CRR', —C=CRR', —C=NR, —NR—, —O—, —SiRR'—, —S—, —S(O)—, —S(O)₂—, O-interrupted substituted or unsubstituted C1-C9-alkylene, C2-C8-alkenylene, C2-C8-alkynylene or arylene group, phenyl or substituted phenyl units; wherein the waved line indicates the position over which D is bound to Ar;

each R and R' are at each occurrence the same or different H, deuterium, F, Cl, Br, I, N(R²)₂, CN, CF₃, NO₂, OH, COOH, COOR², CO(NR²)₂, Si(R²)₃, B(OR²)₂, C(=O)R², P(=O)(R²)₂, S(=O)R², S(=O)₂R², OSO₂R², a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R², wherein one or more not adjacent CH₂-groups can be replaced by R²C=CR², C=C, Si(R²)₂, Ge(R²)₂, Sn(R²)₂, C=O, C=S, C=Se, C=NR², P(=O)(R²), SO, SO₂, NR², O, S or CONR² and wherein one or more H-atoms can be replaced by deuterium, F, Cl, Br, I, CN, CF₃ or NO₂, or an aromatic or heteroaromatic ring system with 5 to 60 aromatic ring atoms, which each can be substituted by one or more radicals R², or an aryloxy or heteroaryloxy group with 5 to 60 aromatic ring atoms, which can be substituted by one or more radicals R², or a diarylamino group, diheteroarylamino group or arylheteroarylamino group with 10 to 40 aromatic ring atoms, which can be substituted by one or more radicals R², or a combination of these systems, or a cross-linkable unit QE, which can be cross-linked by acid-catalyzed, base-catalyzed, thermal or UV cross-linking processes in presence or absence of a photo initiator or by microwave radiation; thereby two or more of the substituents R can form with each other a mono- or polycyclic, aliphatic, aromatic and/or benzoannulated ring system;

$R^2$ is at each occurrence the same or different H, deuterium, F, Cl, Br, I, $N(R^3)_2$, CN, $CF_3$, $NO_2$, OH, COOH, $COOR^3$, $CO(NR^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^3$, wherein one or more not adjacent $CH_2$-groups can be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^3$, or an aryloxy or heteroaryloxy group with 5 to 60 aromatic ring atoms, which can be substituted by one or more radicals $R^3$, or a diarylamino group, diheteroarylamino group or arylheteroarylamino group with 10 to 40 aromatic ring atoms, which can be substituted by one or more radicals $R^3$, or a combination of these systems; thereby two or more of these substituents $R^2$ can also form with each other a mono- or polycyclic, aromatic and/or benzoannulated ring system;

$R^3$ is at each occurrence same or different H, deuterium, F, $CF_3$ or an aliphatic, aromatic and/or heteroaromatic hydrocarbon radical with 1 to 20 C-atoms, in which one or more H-atoms can also be replaced by F oder $CF_3$; thereby two or more substituents $R^3$ can also form with each other a mono- or polycyclic aliphatic ring system.

In one embodiment, the cross-linkable units QE are compounds selected from the group consisting of oxetanes, alkynes and azides for a click-reaction, as well as the following alkene derivatives:

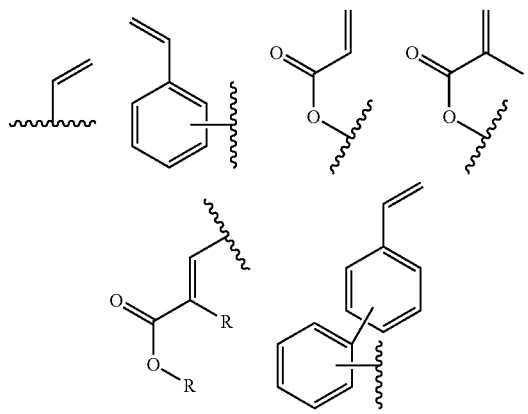

In an alternative embodiment, Z is a covalent single bond or a bivalent organic bridge selected from substituted or unsubstituted alkylene (also branched or cyclic), alkenylene, alkynylene, arylene or heteroarylene groups, O, NR, $C=CR_2$, $C=NR$, $SiR_2S$, $S(O)$, $S(O)_2$, BR, PR, $P(O)R$, wherein combinations of these units are also possible (e.g., O-interrupted alkylene (also branched or cyclic), alkenylene, alkynylene, arylene and heteroarylene groups).

In a further embodiment of the invention, the donor group with electron-donating properties of formula I comprises a structure of formula III:

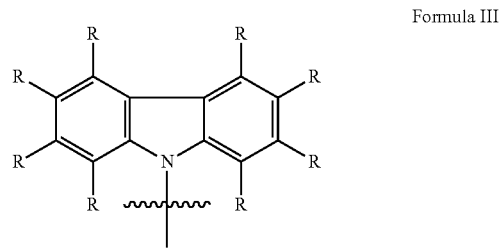

Formula III wherein each R at each occurrence is the same or different H, deuterium, F, Cl, Br, I, $N(R^2)_2$, CN, $CF_3$, $NO_2$, OH, COOH, $COOR^2$, $CO(NR^2)_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^2$, wherein one or more not adjacent $CH_2$-groups can be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^2$, or an aryloxy or heteroaryloxy group with 5 to 60 aromatic ring atoms, which can be substituted by one or more radicals $R^2$, or a diarylamino group, diheteroarylamino group or arylheteroarylamino group with 10 to 40 aromatic ring atoms, which can be substituted by one or more radicals $R^2$, or a combination of these systems, or a cross-linkable unit QE, which can be cross-linked by acid-catalyzed, base-catalyzed, thermal or UV cross-linking processes in presence or absence of a photo initiator or by microwave radiation; thereby two or more of these substituents R can form with each other a mono- or polycyclic, aliphatic, aromatic and/or benzoannulated ring system;

$R^2$ is at each occurrence the same or different H, deuterium, F, Cl, Br, I, $N(R^3)_2$, CN, $CF_3$, $NO_2$, OH, COOH, $COOR^3$, $CO(NR^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^3$, wherein one or more not adjacent $CH_2$-groups can be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^3$, or an aryloxy or heteroaryloxy group with 5 to 60 aromatic ring atoms, which can be substituted by one or more radicals $R^3$, or a diarylamino group, diheteroarylamino group or arylheteroarylamino group with 10 to 40 aromatic ring atoms, which can be substituted by one or more radicals R³, or a combination of these systems; thereby two or more of these substituents R² can also form with each other a mono- or polycyclic, aromatic and/or benzoannulated ring system;

R³ is at each occurrence same or different H, deuterium, F, CF₃ or an aliphatic, aromatic and/or heteroaromatic hydrocarbon radical with 1 to 20 C-atoms, in which one or more H-atoms can also be replaced by F oder CF₃; thereby two or more substituents R³ can also form with each other a mono- or polycyclic, aliphatic ring system.

In one embodiment, the cross-linkable units QE are compounds selected from the group consisting of oxetanes, alkynes and azides for a click-reaction, as well as the following alkene derivatives:

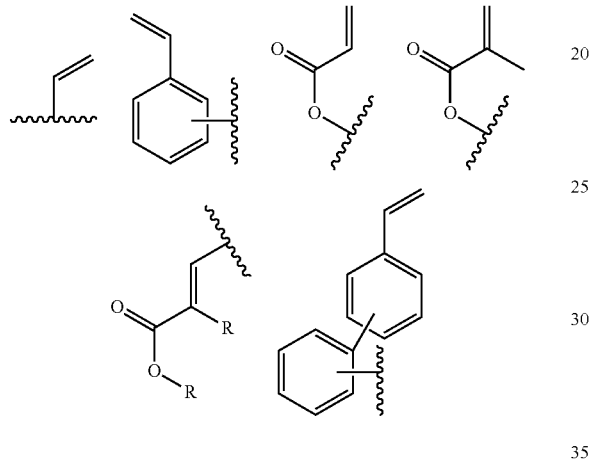

Examples of donors according to the invention:

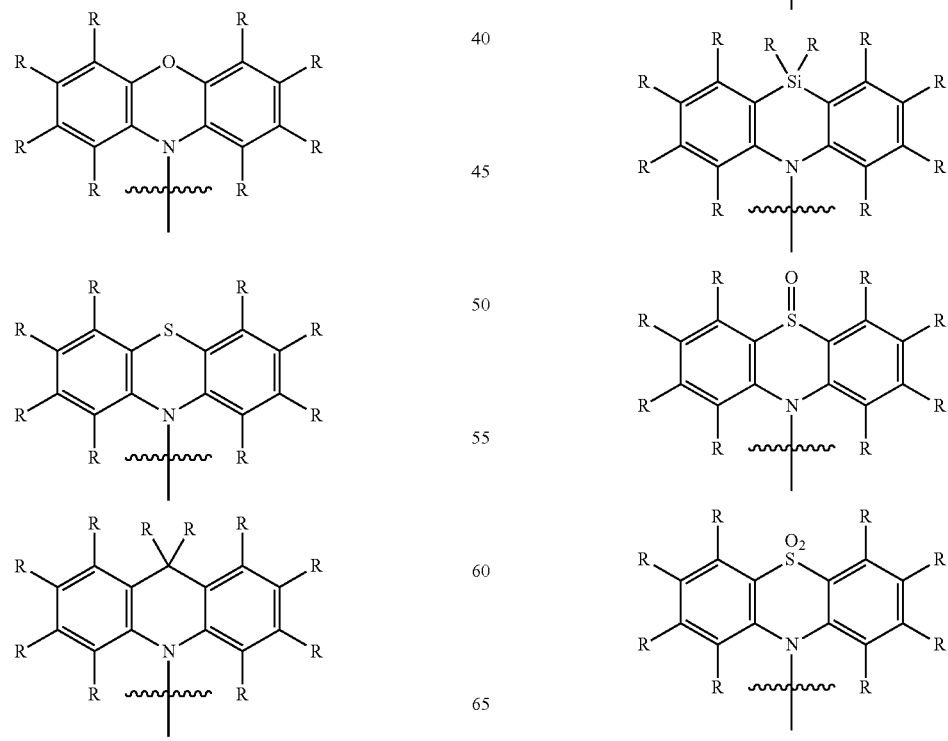

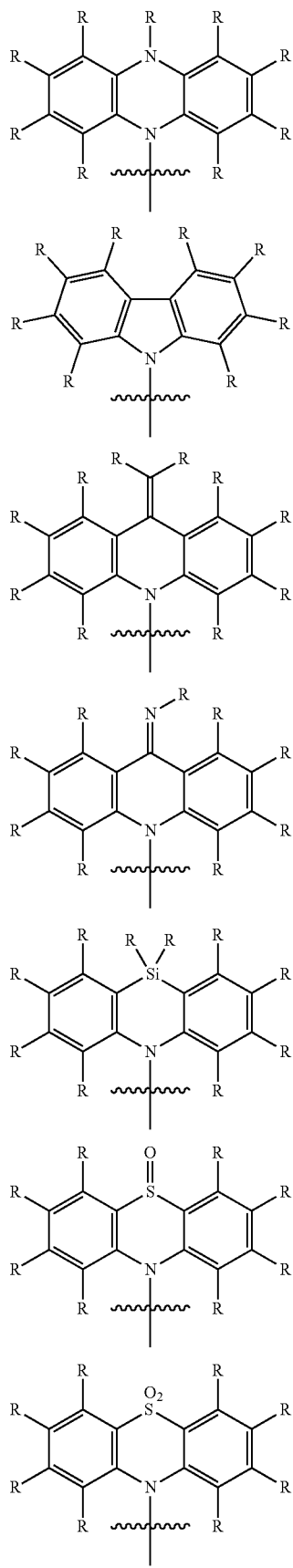

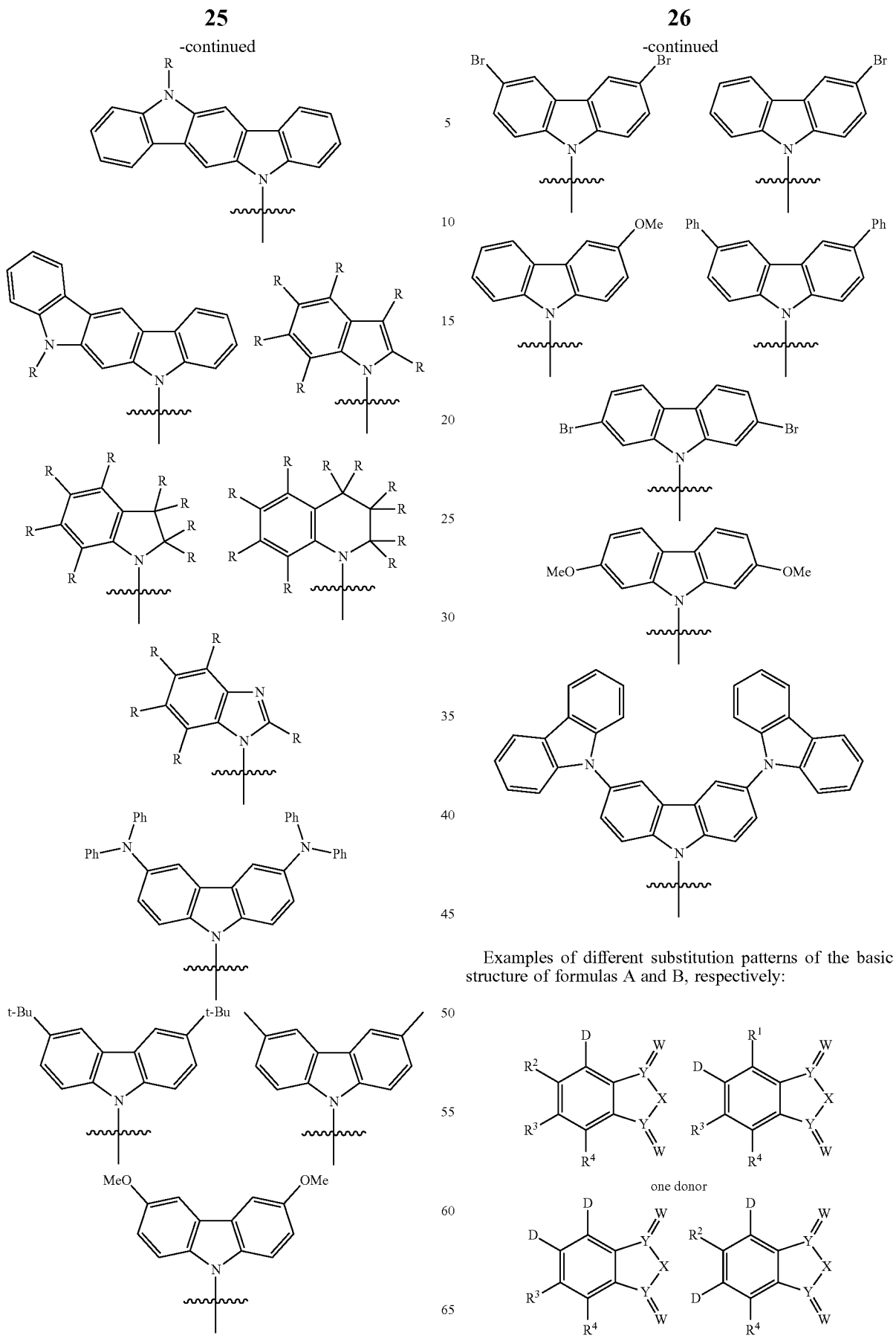
Examples of different substitution patterns of the basic structure of formulas A and B, respectively:
one donor -continued

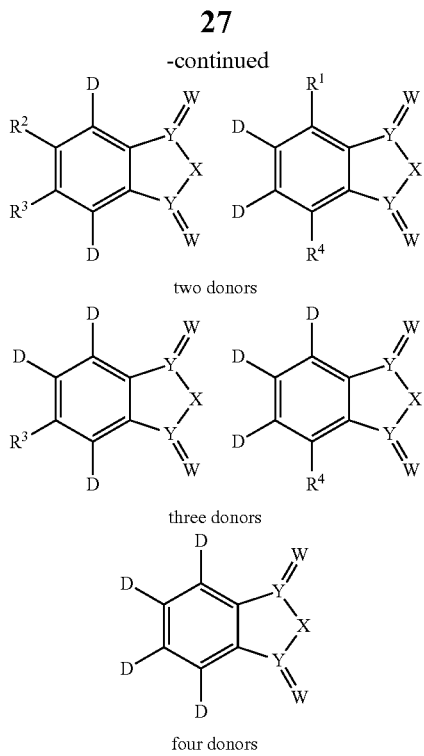

two donors three donors four donors

Examples of different substitution patterns of the basic structure of formula D:

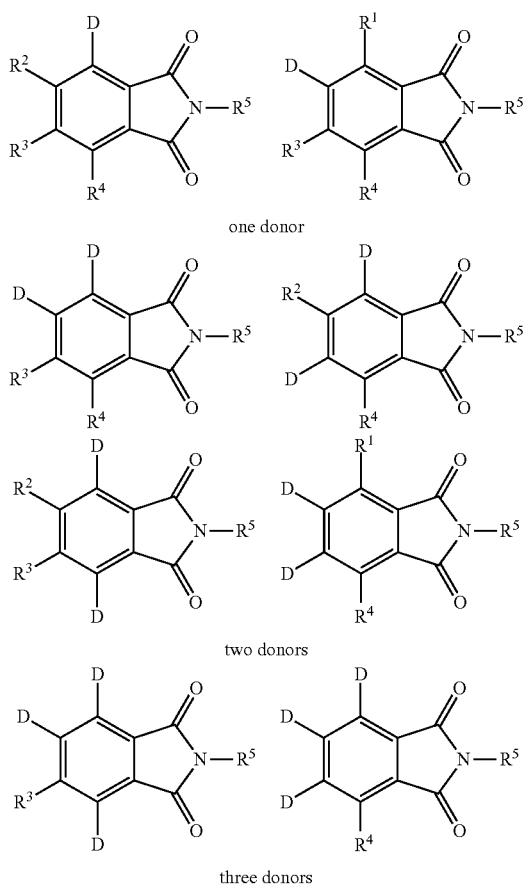

one donor two donors three donors

-continued

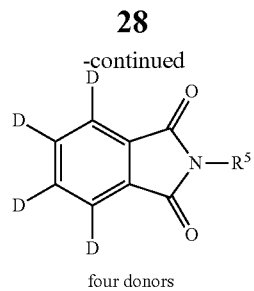

four donors

In one embodiment, the molecules according to the invention are substituted with one, two or four donors D.

The invention also relates to a process for preparing organic molecules according to the invention.

In one embodiment, the process comprises the step of a nucleophilic aromatic substitution ($S_NAr$) of a N-nucleophile with a compound comprising a structure of formula A*

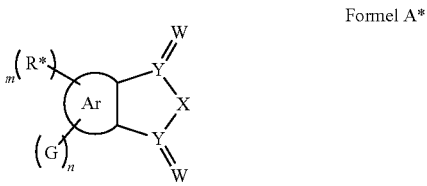

Formel A* wherein Ar=a substituted aryl or heteroaryl group with 5 to 40 aromatic ring atoms, which is substituted with m same or different radicals R* and with n same or different groups G, wherein m+n is the number of substitutable ring atoms; wherein G=Cl or F and wherein further the definitions given for formula A apply.

In one embodiment, the process according to the invention comprises the nucleophilic aromatic substitution ($S_NAr$) of a nucleophile with a chloro- or fluoro-substituted phthalimide.

In another embodiment, the process according to the invention additionally comprises the synthesis of the chloro/fluoro-substituted phthalimide by reaction of the corresponding anhydride with a corresponding primary amine.

In a further embodiment, the process according to the invention additionally comprises the step of the substitution of at least one of the Ar-groups and/or the donor group with electron-donating properties with at least one substituent for increasing the solubility, which is selected from the group consisting of:
- long-chained, branched or unbranched or cyclic alkyl chains with a length of C1 to C30,
- long-chained, branched or unbranched or cyclic alkoxy chains with a length of C1 to C30,
- branched or unbranched or perfluoro alkyl chains with a length of C1 to C30 and
- short-chained polyethers with a chain length of 3 to 50 repeating units.

In a further embodiment, the process according to the invention additionally comprises the step of the substitution of at least one of the Ar-groups and/or the donor group with electron-donating properties and/or the radical R' of formula C and/or D with at least one cross-linkable unit, which can be cross-linked by acid-catalyzed, base-catalyzed, thermal or UV cross-linking processes in presence or absence of a photo initiator or by microwave radiation and which is selected from the group consisting of:

Oxetanes, azides und alkynes for a click-reaction as well as the following alkene derivatives:

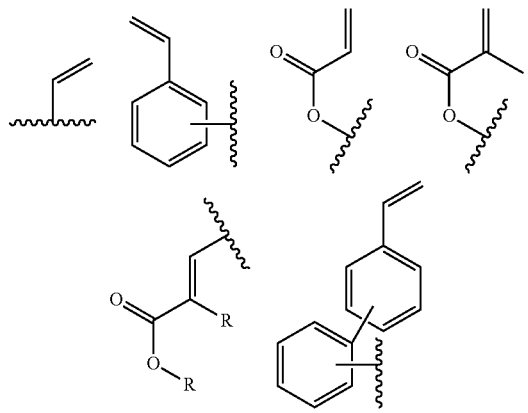

The invention also relates to the use of the molecules according to the invention as an emitter or an absorber in an optoelectronic device, which is produced by a vacuum evaporation method or from solution, wherein the optoelectronic device is especially selected from the group consisting of:
- organic light-emitting devices (OLEDs),
- light-emitting electrochemical cells,
- OLED sensors, especially in gas and vapor sensors not hermetically shielded from the outside,
- organic solar cells,
- organic field-effect transistors,
- organic lasers, and
- down-conversion elements.

According to at least one embodiment, an organic light emitting device on a substrate comprises at least two electrodes, of which at least one is transparent and between which an organic functional layer stack is arranged. The organic functional layer stack comprises at least one organic light-emitting layer in the form of an organic electroluminescent layer, which generates light when the organic light-emitting device is in operation. The organic light-emitting device may in particular be formed as an organic light-emitting diode (OLED).

"Translucent" is used here and hereinafter to describe a layer which is transmissive to visible light. The translucent layer can be transparent, i.e. clear, or at least partially light-scattering and/or partially light-absorptive, such that the translucent layer may for example also be diffusely or milkily translucent. A layer here described as translucent may particularly preferably be maximally transparent, such that in particular light absorption is as low as possible.

The organic functional layer stack may comprise layers with organic polymers, organic oligomers, organic monomers, organic small non-polymeric molecules ("small molecules") or combinations thereof. Materials suitable as materials for the organic light-emitting layer are materials which have radiation emission based on fluorescence or phosphorescence, for example polyfluorene, polythiophene or polyphenylene or derivates, compounds, mixtures or copolymers thereof. The organic functional layer stack may also comprise a plurality of organic light-emitting layers, which are arranged between the electrodes. The organic functional layer stack may moreover comprise a functional layer which takes the form of a hole transport layer, in order to allow effective hole injection into the at least one light-emitting layer. Materials which may prove advantageous for a hole transport layer are for example tertiary amines, carbazole derivatives, polyaniline doped with camphorsulfonic acid or polyethylendioxythiophene doped with polystyrenesulfonic acid. The organic functional layer stack may further comprise a functional layer, which takes the form of an electron transport layer. Furthermore, the layer stack may also comprise electron and/or hole blocking layers.

The substrate (solid support) may, for example, comprise one or more materials in the form of a layer, a sheet, a film or a laminate, which are selected from glass, quartz, plastics, metal, silicon wafer. The substrate particularly preferably comprises or consists of glass, for example in the form of a glass layer, glass film or glass sheet.

With regard to the basic structure of an organic light-emitting device, for example, in terms of the structure, the layer composition and the materials of the organic functional layer stack, reference is made to the document WO 2010/066245 A1, which is hereby explicitly included by reference, in particular in relation to the structure of an organic light-emitting device.

The two electrodes between which the organic functional layer stack is arranged may for example both be translucent, such that the light generated in the at least one light-emitting layer between the two electrodes may be emitted in both directions, i.e. in the direction of the substrate and in the direction away from the substrate. Furthermore, for example all layers of the organic light-emitting device may be translucent, such that the organic light-emitting device forms a translucent and in particular a transparent OLED. It may furthermore also be possible for one of the two electrodes between which the organic functional layer stack is arranged to be non-translucent and preferably reflective, such that the light generated in the at least one light-emitting layer between the two electrodes may be emitted in just one direction by the translucent electrode. If the electrode arranged on the substrate is translucent and the substrate is also translucent, the term "bottom emitter" may also be used, while if the electrode arranged remote from the substrate is translucent, the term "top emitter" is used.

According to a further embodiment, the translucent electrode comprises a transparent conductive oxide or consists of a transparent conductive oxide. Transparent conductive oxides (TCO: "transparent conductive oxide") are transparent, conductive materials, generally metal oxides, such as for example zinc oxide, tin oxide, cadmium oxide, titanium oxide, indium oxide, indium tin oxide (ITO) or aluminium zinc oxide (AZO). Besides binarymetal-oxygen compounds, such as for example ZnO, $SnO_2$ or $In_2O_3$ ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, TCOs do not necessarily correspond to a stoichiometric composition and may also be p- or n-doped.

Furthermore, the translucent electrode may comprise a metal layer with a metal or an alloy, for example with one or more of the following materials: Ag, Pt, Au, Mg, Ag:Mg. Other metals are also possible. In a preferred embodiment, one ore more metals are used which are stable in air and/or which are self-passivating, for example through the formation of a thin protective oxide layer. In this case, the metal layer has such a small thickness that it is at least in part permeable to the light generated by the at least one organic light-emitting layer when in operation, for example, a thickness of less than or equal to 50 nm.

The translucent electrode can also comprise a combination of at least one or more TCO layers and at least one translucent metal layer.

The electrodes may in each case be configured to have a large surface area. This allows large-area emission of the light generated in the at least one organic light-emitting layer. "Large-area" may mean that the organic light-emitting device comprises an area of greater than or equal to a few square millimeters, preferably greater than or equal to one square centimeter and particularly preferably greater than or equal to one square decimeter.

According to a further embodiment, the organic functional layer stack comprises directly adjacent to both of the two electrodes between which the organic functional layer stack is arranged in each case a charge generating layer. In this case, an electron-conducting layer adjoins the electrode taking the form of an anode and a hole-conducting layer adjoins the electrode taking the form of a cathode. The organic functional layer stack with the two electrodes forms in this case a so-called inverted OLED, in which injection of the corresponding charge carrier type is replaced in each case by the inverse process described above.

According to a further embodiment, the organic functional layer stack between the electrodes comprises at least two organic light-emitting layers, between which a further charge-generation layer may furthermore be arranged. Such an organic functional layer stack with the electrodes may also be designated as a so-called stacked OLED, in which a plurality of organic OLED units are accommodated vertically one above the other by charge-generation layers arranged therebetween. Stacking a plurality of organic light-emitting layers on top of one another makes it possible on the one hand to generate mixed light. Furthermore, in multiply stacked OLEDs it is possible to achieve markedly longer lifetimes with virtually identical efficiency and identical luminance relative to OLEDs with just one light-emitting layer, since the multiple luminance can be achieved at identical current densities.

According to a further embodiment, a further organic functional layer stack with a further electrode thereover are arranged over the two electrodes with the organic functional layer stack arranged therebetween and the at least one charge-generation layer. In other words, the organic light-emitting device comprises at least three electrodes, wherein an organic functional layer stack is arranged between each neighbouring electrodes. In this way, the electrode arranged between the organic functional layer stack and the further organic functional layer stack takes the form of an so-called intermediate electrode, which may be directly driven, for example, to control the colour of emission of the organic light-emitting device in the case of different light-emitting layers in the organic functional layer stacks. In particular, directly adjacent to at least one of the two electrodes between which the further organic functional layer stack is arranged, the further organic functional layer stack may comprise a further charge generating layer.

According to a further embodiment, the organic light-emitting device comprises a charge-generation layer directly adjacent to each electrode on the side facing an organic light-emitting layer.

For example, the charge-generation layer may comprise as a hole-conducting layer a p-doped layer comprising an inorganic or organic dopant in an organic hole-conducting matrix. Examples of suitable inorganic dopants are transition metal oxides such as for instance vanadium oxide, molybdenum oxide or tungsten oxide. Examples of suitable organic dopants are tetrafluorotetracyanoquinodimethane (F4-TCNQ) or copper pentafluorobenzoate (Cu(I)pFBz). Furthermore, examples of suitable organic dopants are transition metal complexes. These may preferably comprise a central atom, for example Cu, with ligands, for example acetylacetonate (acac). Furthermore, copper complexes, for example copper carboxylates, are suitable examples. Such and further dopants are described in documents WO 2011/033023 A1 and WO 2011/120709 A1, the respective disclosure content of which is hereby included in its entirety by reference in relation to the dopants described therein.

Furthermore, metal complexes with bismuth and/or chromium are also suitable, as described in DE 10 2012 209 523 A1 and DE 10 2012 209 520 A1, the respective disclosure of which is hereby included in its entirety by reference in relation to the dopants described therein.

As electron-conducting layer, the charge-generation layer may for example comprise an n-doped layer with an n-dopant in an organic electron-conducting matrix, for example a metal with a low work function such as for example Cs, Li, Ca, Na, Ba or Mg or compounds thereof, for example $Cs_2CO_3$ or $Cs_3PO_4$. Such and further dopants are described, for example, in document WO 2011/039323 A2, the respective disclosure content of which is hereby included in its entirety by reference in relation to the dopants described therein.

Furthermore, organic p- and n-dopants are also available under the trade names NDP-2®, NDP-9®, NDN-1®, NDN-26® (Novaled GmbH).

An encapsulation arrangement may moreover also be arranged over the electrodes and the organic layers. The encapsulation arrangement may for example be accomplished in the form of a glass cover or, preferably, the form of a thin-film encapsulation.

A glass cover, for example, in the form of a glass substrate, which may comprise a cavity, may be adhesively bonded to the substrate by means of an adhesive layer or of a glass solder or fused together with the substrate. A moisture-absorbing substance (getter), for example of zeolite, may furthermore be adhesively bonded in the cavity, to bind moisture or oxygen which may penetrate through the adhesive. Furthermore, an adhesive containing a getter material may be used to fasten the cover to the substrate.

An encapsulation arrangement configured as a thin-film encapsulation is here understood to refer to a device which is suitable for forming a barrier against atmospheric substances, in particular against moisture and oxygen and/or against further harmful substances such as for instance corrosive gases, for example hydrogen sulfide. The encapsulation arrangement may to this end comprise one or more layers each with a thickness of less than or equal to a few 100 nm.

In particular, the thin-film encapsulation may comprise or consist of thin layers which are applied for example by means of an atomic layer deposition method ("atomic layer deposition", ALD). Suitable materials for the layers of the encapsulation arrangement are for example aluminium oxide, zinc oxide, zirconium oxide, titanium oxide, hafnium oxide, lanthanum oxide or tantalum oxide. The encapsulation arrangement preferably comprises a layer sequence with a plurality of the thin layers which each comprise a thickness of between one atom layer and 10 nm, limit values included.

Thin-film encapsulations are known, for example, from documents WO 2009/095006 A1 and WO 2010/108894 A1, the respective disclosure of which is hereby included in its entirety by reference.

In the case of the organic light-emitting device described here, which may, for example, take the form of a lighting device in the form of an OLED luminaire, the charge carrier injection into the organic functional layer stack is advantageously replaced at least at one electrode, in particular at the translucent electrode, by the above-described inverse process. This way, a reduction of the voltage drop at such boundary surfaces may be achieved. As a consequence thereof, a transparent conductive oxide such as for example ITO or AZO may be used as the material for the translucent electrode, alone or in combination with a metal such as for example Ag. In particular, the translucent electrode may also form the top electrode remote from the substrate. This allows OLEDs to be produced with very high transparency values, so also enabling the efficiency of such a transparent device to be increased. This may also have a positive effect on the lifetime of the organic light-emitting device and the possibility arises of producing novel OLED devices.

In one embodiment, the ratio of the organic molecule in the emitter or absorber is 1% bis 99%, preferable the ratio of the organic molecule as emitter in organic light-emitting devices, in particularly in OLEDs, is between 5% and 80%. In one alternative embodiment the ratio of the organic molecule in the emitter or absorber is 100%.

The invention also relates to an optoelectronic device comprising an organic molecule according to the invention, wherein the optoelectronic device is in particular shaped as a device selected from the group consisting of organic light-emitting devices, organic diodes, organic solar cells, organic transistors, organic light-emitting diodes, light-emitting electrochemical cells, organic field effect transistors and organic lasers.

In one embodiment of the optoelectronic device according to the invention, the compound according to the invention is employed as emission material in a light-emitting layer, wherein it is either employed as pure layer or in combination with a matrix material.

The ratio of the organic molecule according to the invention as emission material is in a further embodiment in a light-emitting layer in optical light-emitting devices, in particular in OLEDs, between 5% und 80%. In one embodiment of the optoelectronic device according to the invention the light-emitting layer is deposited on a substrate, wherein preferably one anode and one cathode is deposited on the substrate and the light-emitting layer is deposited between anode and cathode.

The light-emitting layer may comprise solely an organic molecule according to the invention in a concentration of 100%, wherein the anode and the cathode is deposited on the substrate and the light-emitting layer is deposited between anode and cathode.

In one embodiment the light-emitting layer comprises in addition to the organic molecule according to the invention a host material which triplet (T1)- and singlet (S1)-energy levels lie energetically higher than the triplet (T1)- and singulet (S1)-energy levels of the organic molecule.

In one embodiment of the optoelectronic device according to the invention, a hole- or electron-injecting layer is deposited between the anode and the cathode, a hole- and electron-transporting layer is deposited between the hole- and electron-injecting layer and the light-emitting layer is deposited between the hole- and electron-transporting layer.

The optoelectronic device comprises in a further embodiment of the invention: a substrate, an anode, a cathode and at least one hole- and electron-injecting layer each and at least one light-emitting layer, which comprises an organic molecule according to the invention and a host material, whose triplet (T1)- and singlet (S1)-energy levels lie energetically higher than the triplet (T1)- and singlet (S1)-energy levels of the organic molecule, wherein the anode and the cathode is deposited on the substrate, and the hole- and electron-injecting layer is deposited between anode and cathode, and the hole- and electron-transporting layer is deposited between hole- and electron-injecting layer, and the light-emitting layer is deposited between hole- and electron-transporting layer.

A light-emitting material according to the invention is also a light-emitting material comprising a organic molecule according to the invention and a host material, wherein the triplet (T1)- and singlet (S1)-energy levels of the host material lie energetically higher than the triplet (T1)- and singlet (S1)-energy levels of the organic molecule and wherein the light-emitting material emits fluorescence or thermally activated fluorescence and comprises a deltaE (S1−T1)-value between the lowermost excited singlet (S1)- and the triplet (T1)-state below it of smaller than 3000 cm$^{-1}$.

The invention also relates to a process for preparing an optoelectronic device, wherein an organic molecule according to the invention is used.

In one embodiment of this process according to the invention the organic molecule according to the invention is deposited on a support, wherein the deposition is carried out in particular wet-chemically, by means of colloidal suspension or by means of sublimation A process according to the invention is also a process for producing a optoelectronic device according to the invention, in which at least one layer of the optoelectronic device
  is coated by means of a sublimation process,
  is coated by means of an OVPD (organic vapour phase deposition) process,
  is coated by means of a carrier gas sublimation process and/or
  is produced from solution or with a printing process.

The invention also relates to a method for altering the emission and/or absorption properties of an electronic device, characterized by introducing an organic molecule according to the invention into a matrix material for the conduction of electrons or holes in an optoelectronic device.

Furthermore the invention relates to the use of an organic molecule according to claim 1 to 9, in particular in an optoelectronic device, for conversion of UV radiation or of blue light into visible light, especially to green, yellow or red light (down-conversion).

EXAMPLES

The delayed lifetime referred to in the examples is the long-living component of the exciton decay time (=without spontaneous fluorescence). The given values are the weighted averages of bi- or triexponential fits.

Example 1

Step 1:

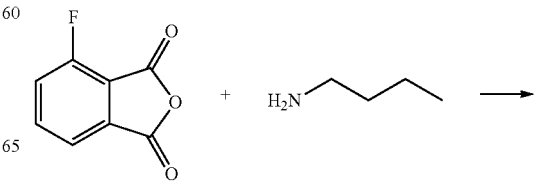

-continued

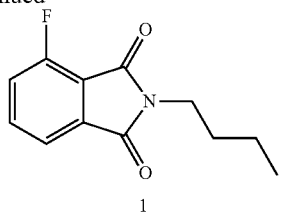

1

3-Fluorophthalic anhydride (3.32 g, 20 mmol) is suspended in 20 mL glacial acetic acid in a 50 mL round-bottom flask with reflux condenser. After addition of 1-butylamine (2.17 mL, 22 mmol) it is initially stirred for one hour at 90° C., then for another hour at 100° C. After cooling, the reaction solution is poured on 150 mL saturated $Na_2CO_3$-solution and extracted with 2×75 mL EtOAc. The combined organic phases are dried over $MgSO_4$. The solvent is removed at the rotary evaporator. After drying in high-vacuum the product 1 (3.9 g, 17.6 mmol, 88%) is obtained as slightly yellow oil.

$^1$H-NMR (500 MHz, $CDCl_3$): δ=7.72-7.66 (m, 1H), 7.65-7.60 (m, 1H), 7.34 (td, J=8.5, 1.7 Hz, 1H), 3.64 (td, J=7.4, 3.1 Hz, 2H), 1.67-1.58 (m, 2H), 1.38-1.27 (m, 2H), 0.91 (td, J=7.4, 3.0 Hz, 3H).

$^{19}$F NMR (471 MHz, $CDCl_3$): δ=−113.2.

Step 2:

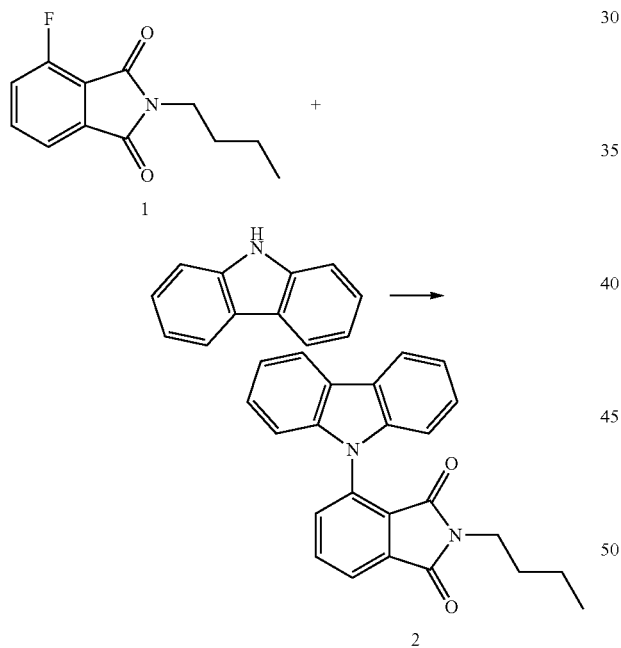

Imide 1 (1.55 g, 7 mmol), Carbazol (1.17 g, 7 mmol) and $K_3PO_4$ (2.97 g, 14 mmol) are provided in a 50 mL round bottom flask and evacuated for 5 min. After supplying inert gas, 15 mL DMSO (dry) are added and heated for 3 h at 100° C. The reaction solution is poured on 200 mL water and extracted with 200 mL EtOAc. After anew extraction with 100 mL EtOAc the combined organic phases are washed with 2×50 mL water each and with saturated NaCl-solution. Afterwards it is dried over $MgSO_4$ and the solvent is removed at the rotary evaporator. Recrystallization from EtOH provides the product 2 (1.21 g, 47%) as slightly yellow solid. The product can be purified by sublimation.

$^1$H NMR (500 MHz, $CDCl_3$): δ=8.16 (d, J=7.9 Hz, 2H), 7.98 (dd, J=7.2, 1.0 Hz, 1H), 7.91 (t, J=7.6 Hz, 1H), 7.85 (dd, J=8.0, 1.0 Hz, 1H), 7.42-7.37 (m, 2H), 7.32 (t, J=7.5 Hz, 2H), 7.16 (d, J=8.1 Hz, 2H), 3.62 (t, J=7.3 Hz, 2H), 1.63-1.54 (m, 2H), 1.30 (h, J=7.4 Hz, 2H), 0.89 (t, J=7.3 Hz, 3H).

$^{13}$C NMR (126 MHz, $CDCl_3$): δ=167.8, 165.7, 140.7, 135.6, 134.8, 134.4, 134.4, 127.0, 126.1, 124.0, 122.6, 120.8, 120.7, 110.0, 38.1, 30.6, 20.2, 13.7.

The absorption spectrum of 2 in dichloromethane is shown in FIG. 1.

Figure 2:
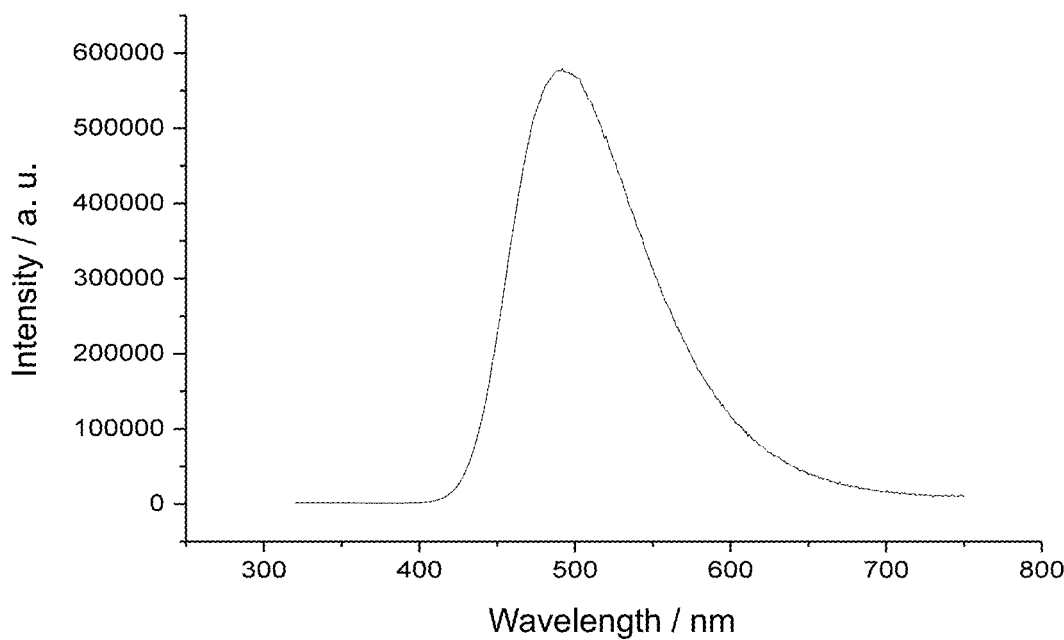
FIG. 2 is a film emission of product 2 (10% in PMMA).

The film emission of 2 (10% in PMMA) is shown in FIG. 2.

According to the above synthesis instruction, the following further examples were prepared:

Example 2

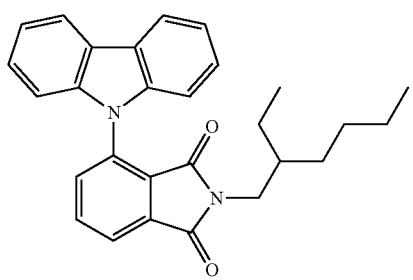

3

$^1$H NMR (500 MHz, $CDCl_3$): δ=8.16 (d, J=7.7 Hz, 2H), 7.98 (d, J=7.2 Hz, 1H), 7.91 (t, J=7.6 Hz, 1H), 7.85 (d, J=8.0 Hz, 2H), 7.39 (t, J=7.7 Hz, 2H), 7.32 (t, J=7.4 Hz, 2H), 7.17 (d, J=8.1 Hz, 2H), 3.52 (d, J=7.3 Hz, 2H), 1.78 (hept, J=6.3 Hz, 1H), 1.35-1.16 (m, 8H), 0.89-0.82 (m, 6H).

$^{13}$C NMR (126 MHz, $CDCl_3$): δ=168.0, 165.9, 140.7, 135.6, 134.7, 134.4, 126.9, 126.1, 124.1, 122.6, 120.9, 120.7, 110.1, 42.2, 38.2, 30.6, 28.6, 23.9, 23.1, 14.2.

Figure 3:
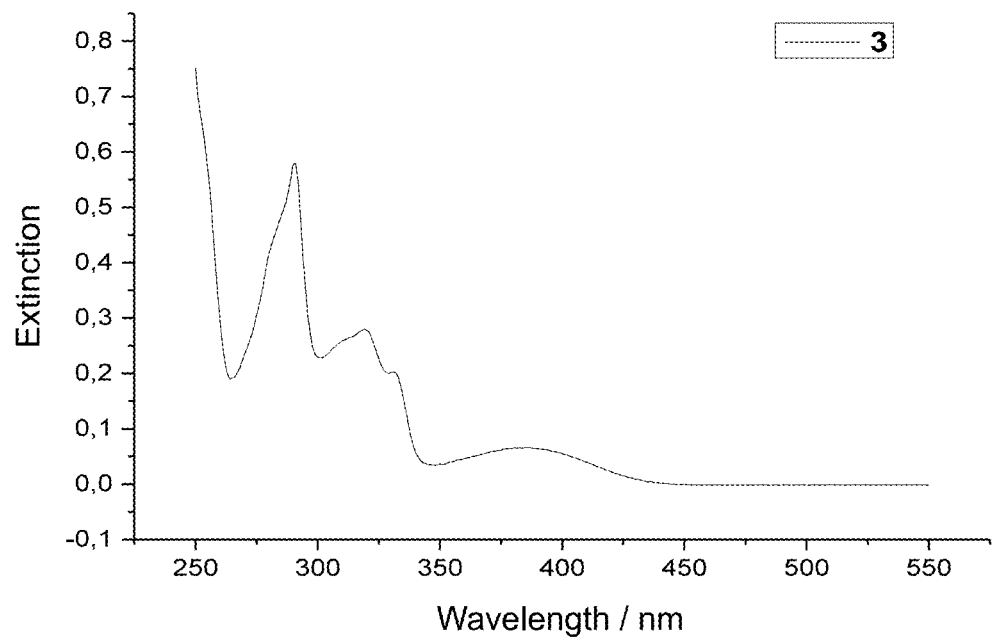
FIG. 3 is an absorption spectrum of product 3 in dichloromethane.

The absorption spectrum of 3 in dichloromethane is shown in FIG. 3.

Figure 4:
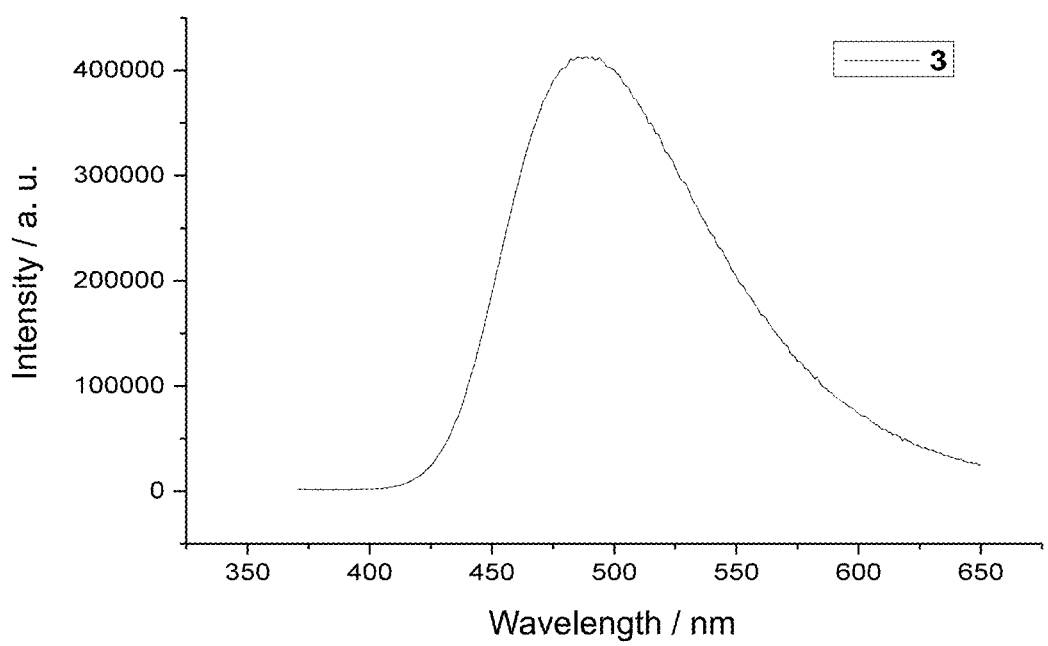
FIG. 4 is a film emission of product 3 (10% in PMMA).

The film emission of 3 (10% in PMMA) is shown in FIG. 4.

Example 3

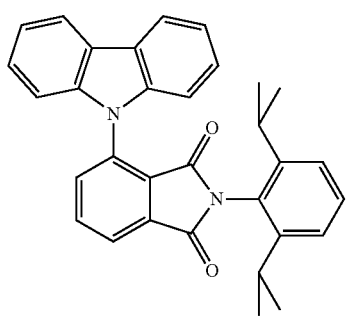

4

$^1$H NMR (500 MHz, $CDCl_3$): δ=8.13 (d, J=7.7 Hz, 2H), 8.10 (dd, J=4.7, 3.6 Hz, 1H), 8.03-8.00 (m, 2H), 7.42-7.35 (m, 3H), 7.30 (td, J=7.4, 1.0 Hz, 2H), 7.28-7.25 (m, 2H), 7.23 (d, J=7.8 Hz, 2H), 2.76 (hept, J=6.9 Hz, 2H), 1.21 (d, J=6.8 Hz, 6H), 1.12 (d, J=6.8 Hz, 6H).

$^{13}$C NMR (126 MHz, CDCl$_3$): δ=167.5, 165.3, 147.3, 140.4, 136.0, 134.9, 134.5, 134.3, 130.3, 126.8, 126.1, 126.0, 124.2, 124.0, 123.0, 121.0, 120.7, 110.2, 29.6, 24.2.

Figure 5:
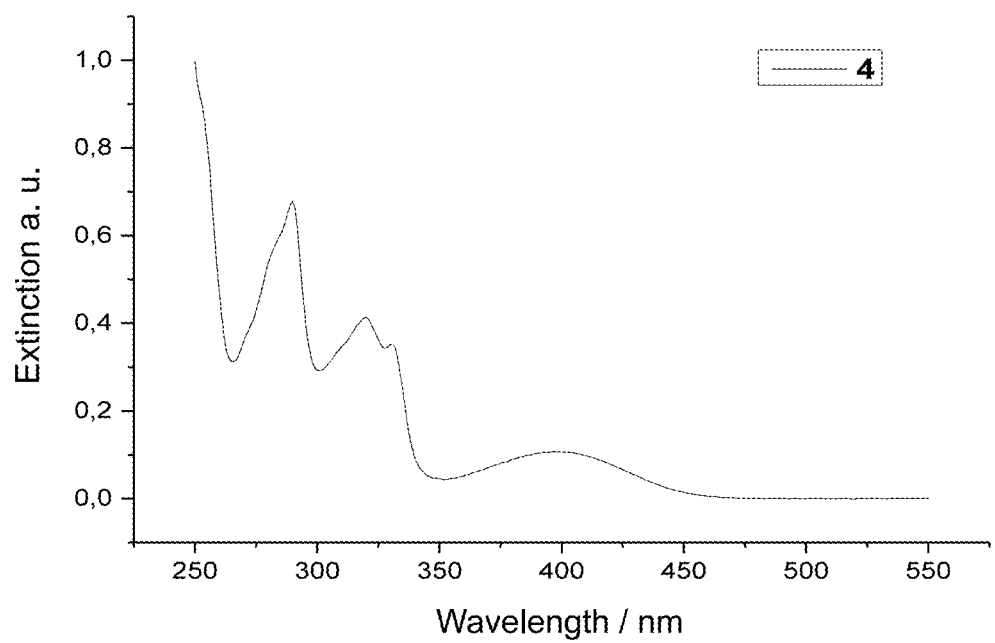
FIG. 5 is an absorption spectrum of product 4 in dichloromethane.

The absorption spectrum of 4 in dichloromethane is shown in FIG. 5.

Figure 6:
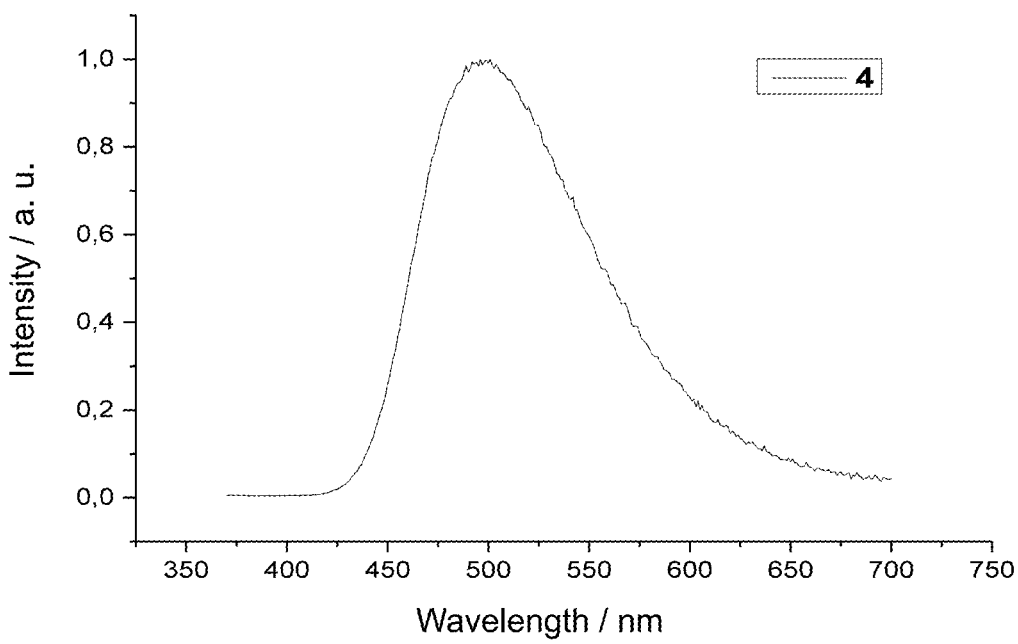
FIG. 6 is a film emission of product 4 (10% in PMMA).

The film emission of 4 (10% in PMMA) is shown in FIG. 6.

The photoluminescence quantum yield of 4 (10% in PMMA) is 48%. The delayed lifetime of 4 (10% in PMMA) is 6.2 μs.

Example 4

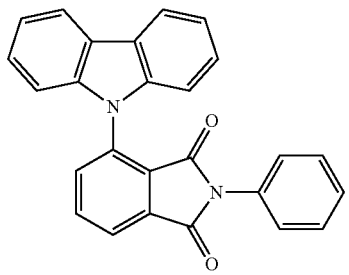

5

$^1$H NMR (500 MHz, CDCl$_3$): δ=8.15 (dt, J=7.7, 0.9 Hz, 2H), 8.11 (dd, J=7.3, 1.0 Hz, 1H), 8.00 (t, J=7.6 Hz, 1H), 7.94 (dd, J=8.1, 1.0 Hz, 1H), 7.45-7.37 (m, 6H), 7.36-7.29 (m, 3H), 7.21 (dt, J=8.2, 0.9 Hz, 2H).

$^{13}$C NMR (126 MHz, CDCl$_3$): δ=166.6, 164.4, 140.8, 136.1, 135.1, 135.0, 134.4, 131.5, 129.1, 128.2, 126.7, 126.5, 126.2, 124.1, 123.3, 120.9, 120.7, 110.0.

Figure 7:
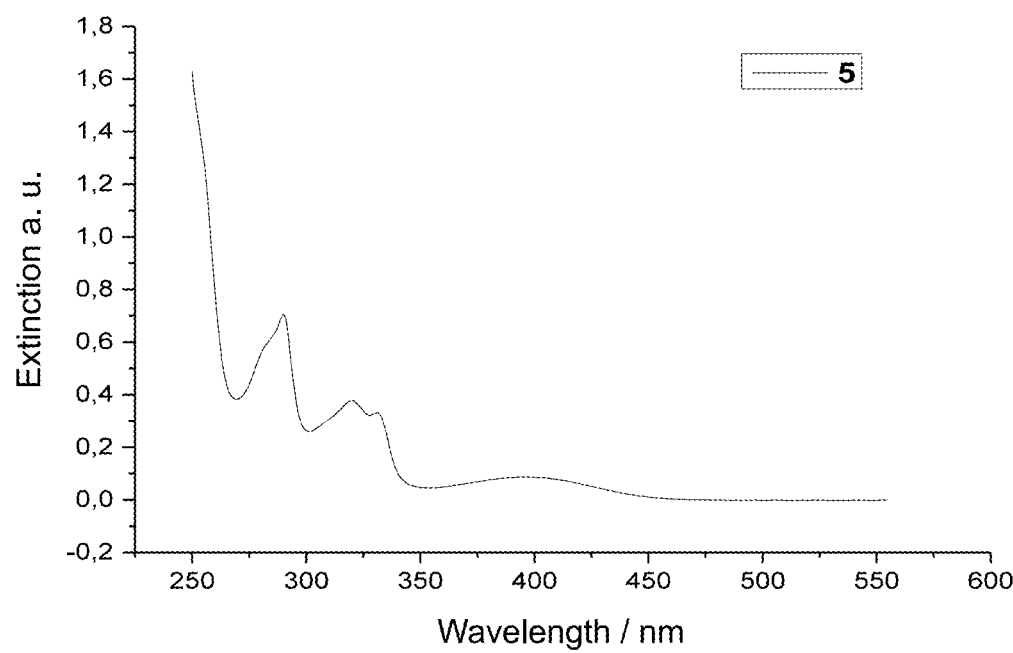
FIG. 7 is an absorption spectrum of product 5 in dichloromethane.

The absorption spectrum of 5 in dichloromethane is shown in FIG. 7.

Figure 8:
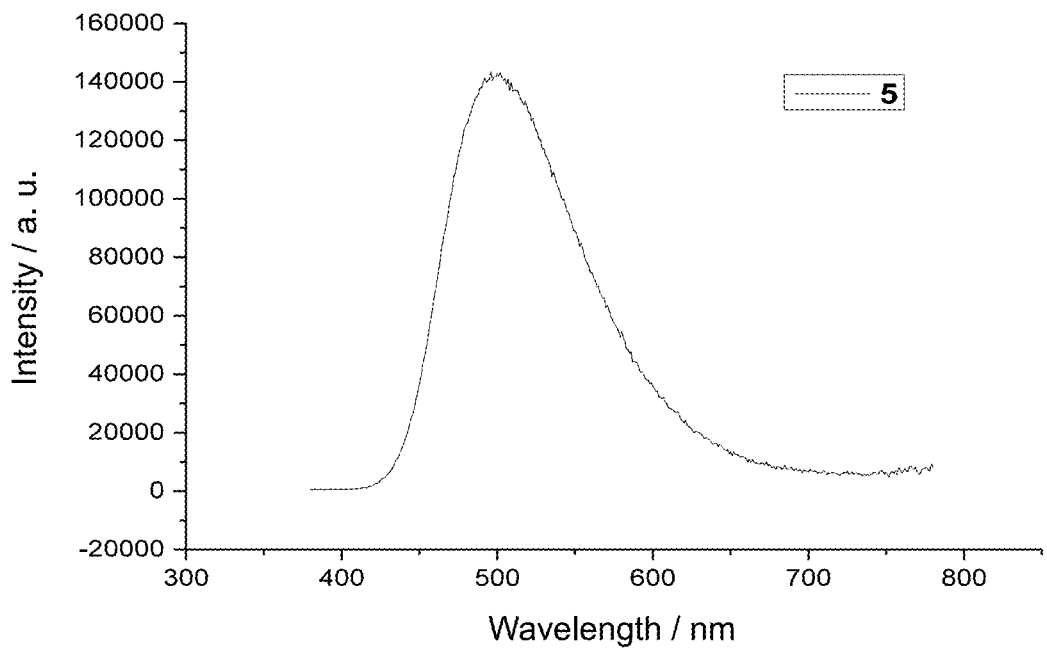
FIG. 8 is a film emission of product 5 (10% in PMMA).

The film emission of 5 (10% in PMMA) is shown in FIG. 8.

Example 5

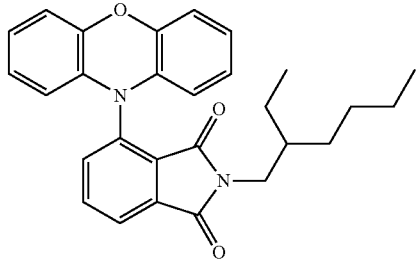

6

$^1$H NMR (500 MHz, CDCl$_3$): δ=7.96 (dd, J=7.5, 1.2 Hz, 1H), 7.93 (t, J=7.5 Hz, 1H), 7.70 (dd, J=7.6, 1.2 Hz, 1H), 6.74 (dd, J=8.0, 1.5 Hz, 2H), 6.68 (t, J=8.0 Hz, 2H), 6.57 (td, J=7.7, 1.5 Hz, 2H), 5.83 (d, J=7.9 Hz, 2H), 3.50 (d, J=7.3 Hz, 2H), 1.76 (hept, J=6.3 Hz, 1H), 1.33-1.09 (m, 8H), 0.87-0.79 (m, 6H).

$^{13}$C NMR (126 MHz, CDCl$_3$): δ=167.9, 165.7, 144.1, 138.4, 136.7, 135.7, 133.2, 123.5, 123.2, 122.2, 116.1, 112.9, 42.2, 38.2, 30.6, 28.5, 24.0, 23.1, 14.1, 10.6.

Figure 9:
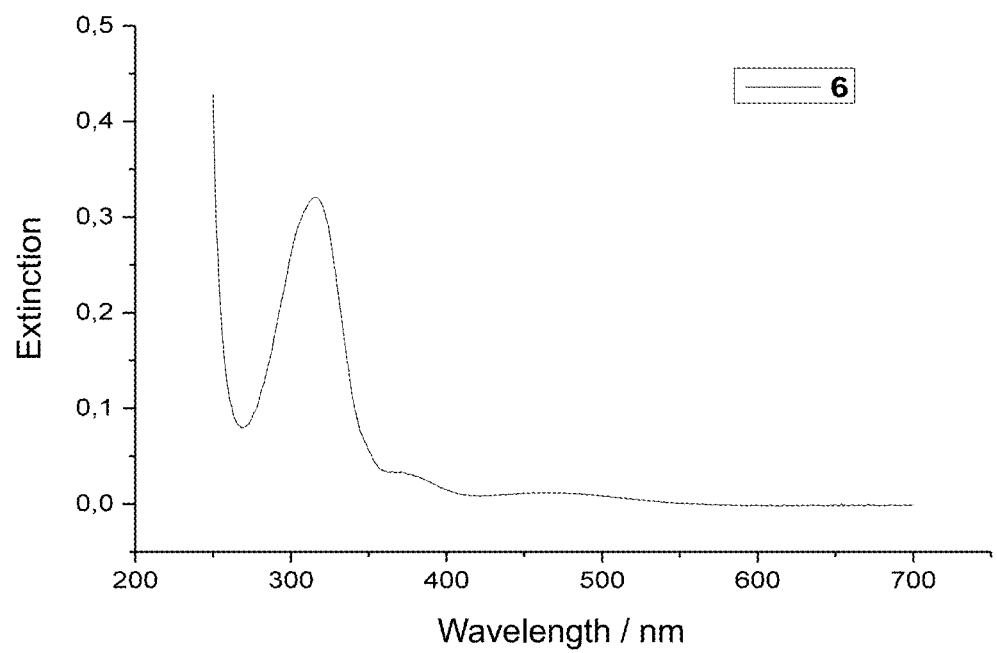
FIG. 9 is an absorption spectrum of product 6 in dichloromethane.

The absorption spectrum of 6 in dichloromethane is shown in FIG. 9.

Figure 10:
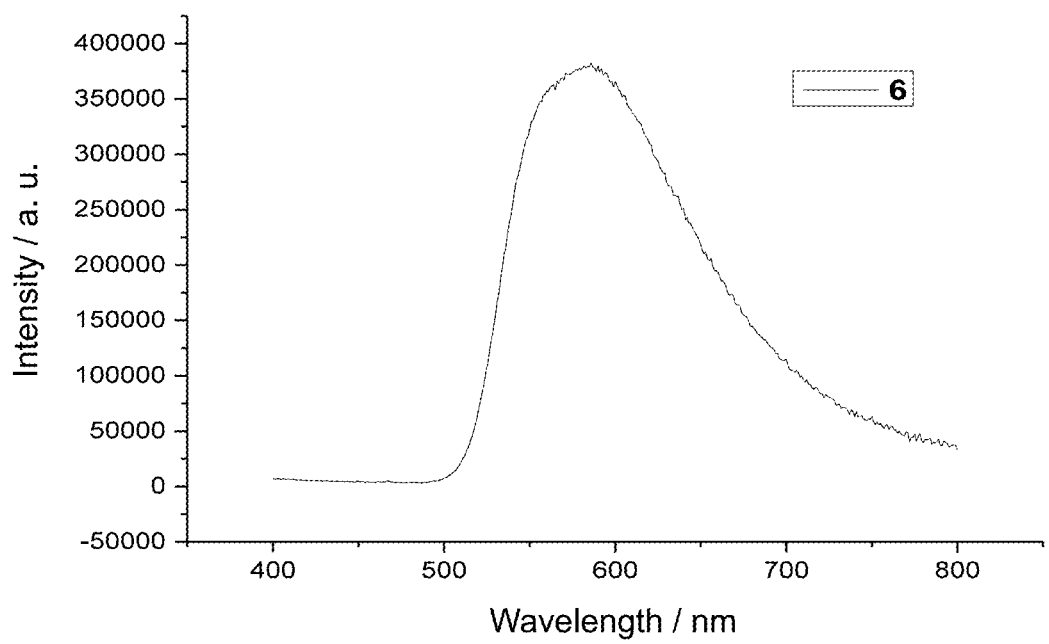
FIG. 10 is a film emission of product 6 (10% in PMMA).

The film emission of 6 (10% in PMMA) is shown in FIG. 10.

Example 6

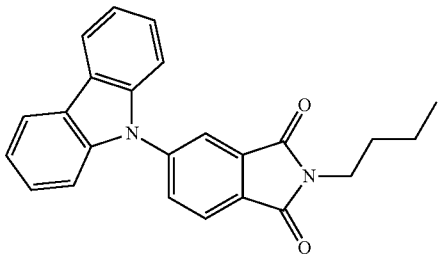

7

$^1$H NMR (500 MHz, CDCl$_3$): δ=8.15 (d, J=7.7 Hz, 2H), 8.09 (d, J=1.8 Hz, 1H), 8.06 (d, J=7.9 Hz, 1H), 7.93 (dd, J=7.9, 1.8 Hz, 1H), 7.48 (dt, J=8.3, 1.1 Hz, 2H), 7.44 (ddd, J=8.2, 6.7, 1.2 Hz, 2H), 7.34 (ddd, J=8.0, 6.7, 1.4 Hz, 2H), 3.75 (t, J=7.3 Hz, 2H), 1.77-1.68 (m, 2H), 1.48-1.37 (m, 2H), 0.99 (t, J=7.4 Hz, 3H).

$^{13}$C NMR (126 MHz, CDCl$_3$): δ=167.8, 167.7, 143.5, 140.1, 134.5, 131.5, 129.9, 126.6, 125.0, 124.2, 121.2, 121.2, 120.7, 109.7, 38.2, 30.8, 20.2, 13.8.

Figure 11:
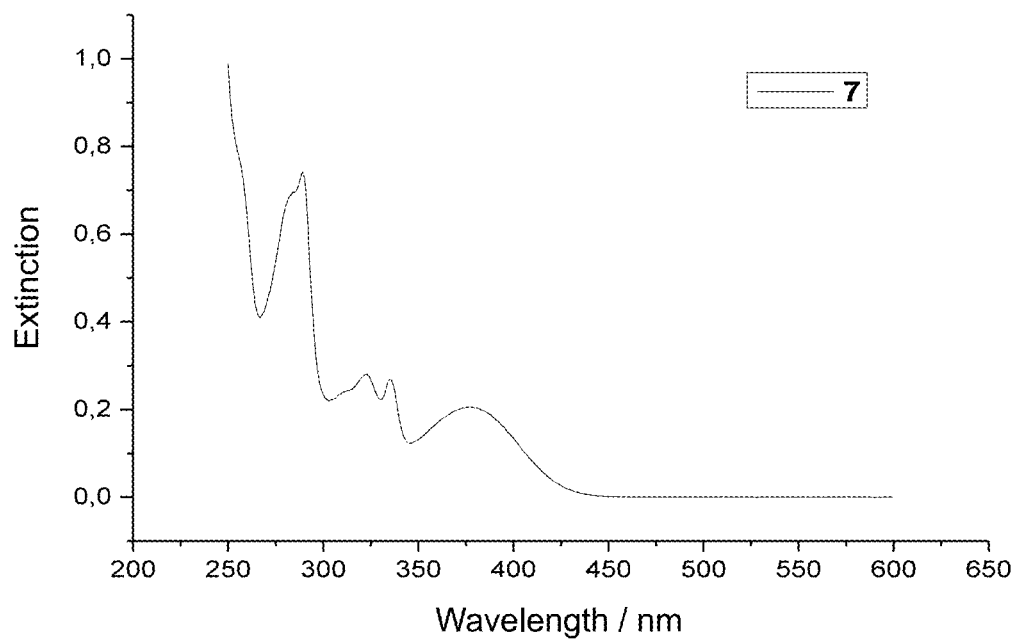
FIG. 11 is an absorption spectrum of product 7 in dichloromethane.

The absorption spectrum of 7 in dichloromethane is shown in FIG. 11.

Figure 12:
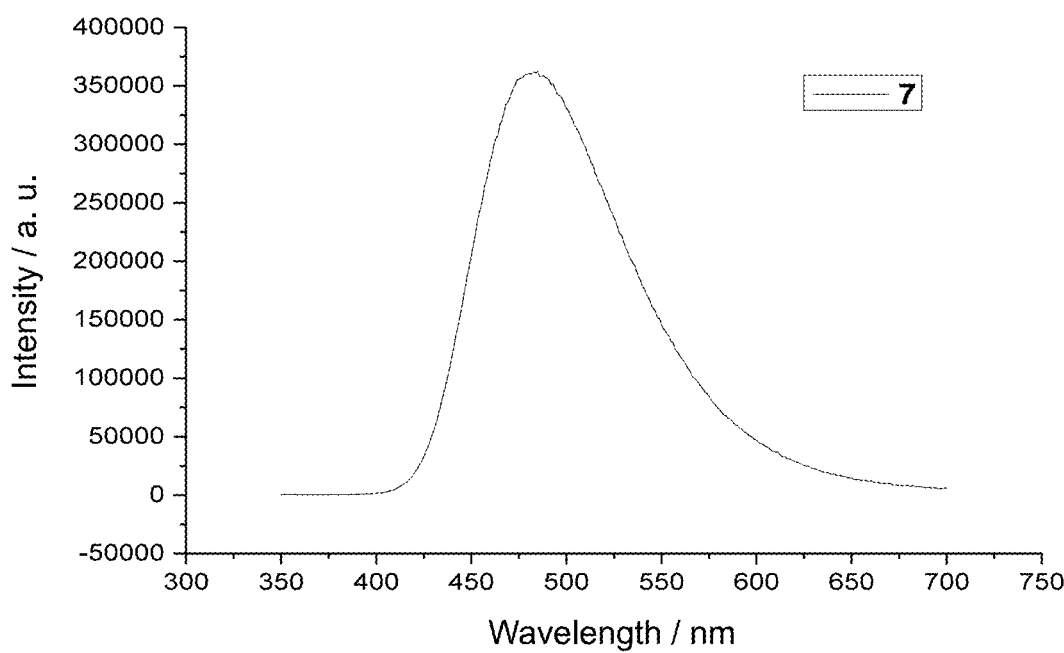
FIG. 12 is a film emission of product 7 (10% in PMMA).

The film emission of 7 (10% in PMMA) is shown in FIG. 12.

Example 7

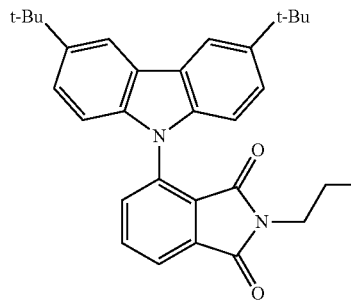

8

$^1$H NMR (500 MHz, CDCl$_3$): δ=8.15 (d, J=1.8 Hz, 2H), 7.94 (dd, J=7.2, 1.0 Hz, 1H), 7.86 (t, J=7.6 Hz, 1H), 7.80 (dd, J=8.0, 1.1 Hz, 1H), 7.43 (dd, J=8.6, 1.9 Hz, 2H), 7.08 (d, J=8.6 Hz, 2H), 3.65 (t, J=7.3 Hz, 2H), 1.66-1.56 (m, 2H), 1.46 (s, 18H), 1.38-1.26 (m, 2H), 0.90 (t, J=7.4 Hz, 3H).

$^{13}$C NMR (126 MHz, CDCl$_3$): δ=167.9, 165.8, 143.7, 139.2, 135.4, 135.1, 134.7, 134.2, 126.6, 124.2, 123.7, 122.2, 116.7, 109.6, 38.1, 34.9, 32.1, 30.6, 20.2, 13.8.

Figure 13:
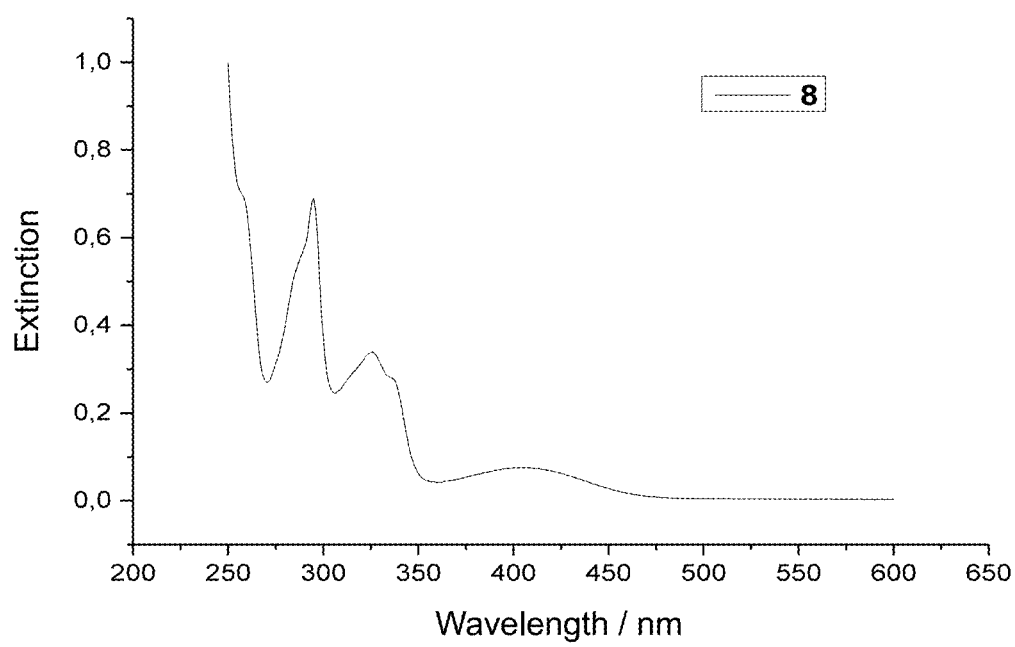
FIG. 13 is an absorption spectrum of product 8 in dichloromethane.

The absorption spectrum of 8 in dichloromethane is shown in FIG. 13.

Figure 14:
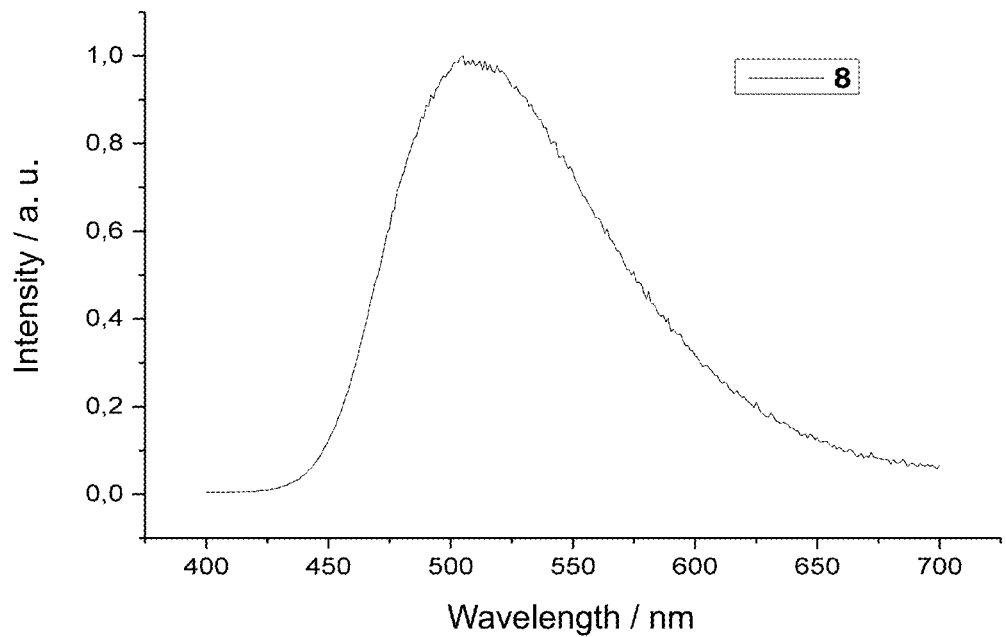
FIG. 14 is a film emission of product 8 (10% in PMMA).

The film emission of 8 (10% in PMMA) is shown in FIG. 14.

The photoluminescence quantum yield of 8 (10% in PMMA) is 37%. The delayed lifetime of 8 (10% in PMMA) is 4.2 μs.

Example 8

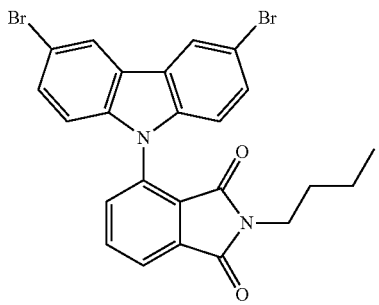

9

$^1$H NMR (500 MHz, CDCl$_3$): δ=8.21 (d, J=1.9 Hz, 2H), 8.02 (dd, J=7.4, 0.9 Hz, 1H), 7.94 (t, J=7.7 Hz, 1H), 7.80 (dd, J=8.0, 0.9 Hz, 1H), 7.49 (dd, J=8.7, 1.9 Hz, 2H), 7.01 (d, J=8.7 Hz, 2H), 3.60 (t, J=7.3 Hz, 2H), 1.62-1.53 (m, 2H), 1.35-1.23 (m, 2H), 0.89 (t, J=7.3 Hz, 3H).

$^{13}$C NMR (126 MHz, CDCl$_3$): δ=167.4, 165.5, 139.8, 135.9, 134.9, 134.2, 133.3, 129.6, 127.2, 124.6, 123.6, 123.4, 114.0, 111.7, 38.2, 30.6, 20.2, 13.7.

Figure 15:
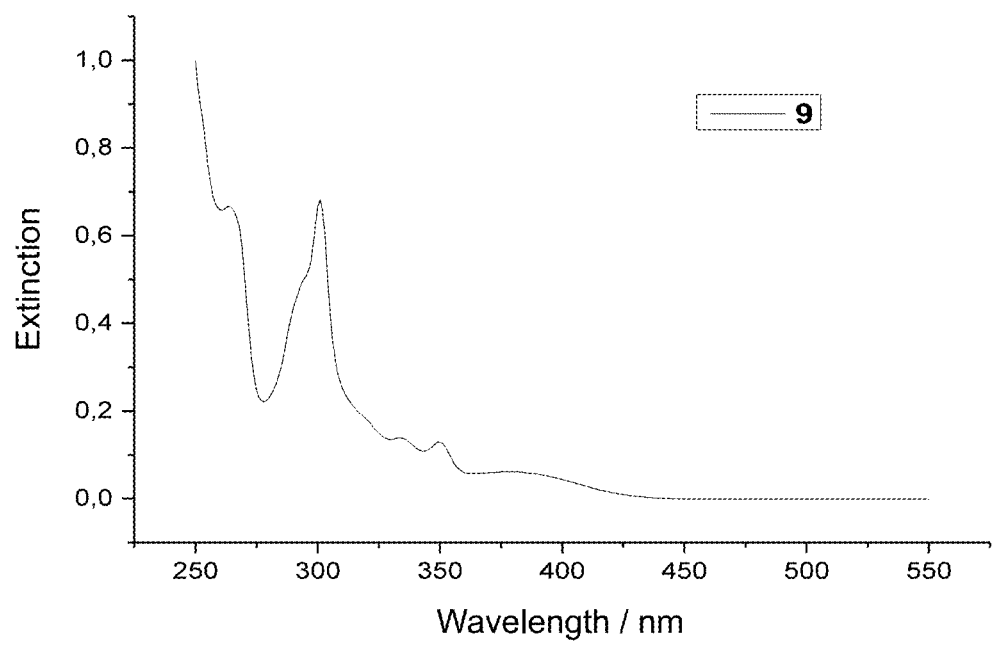
FIG. 15 is an absorption spectrum of product 9 in dichloromethane.

The absorption spectrum of 9 in dichloromethane is shown in FIG. 15.

Figure 16:
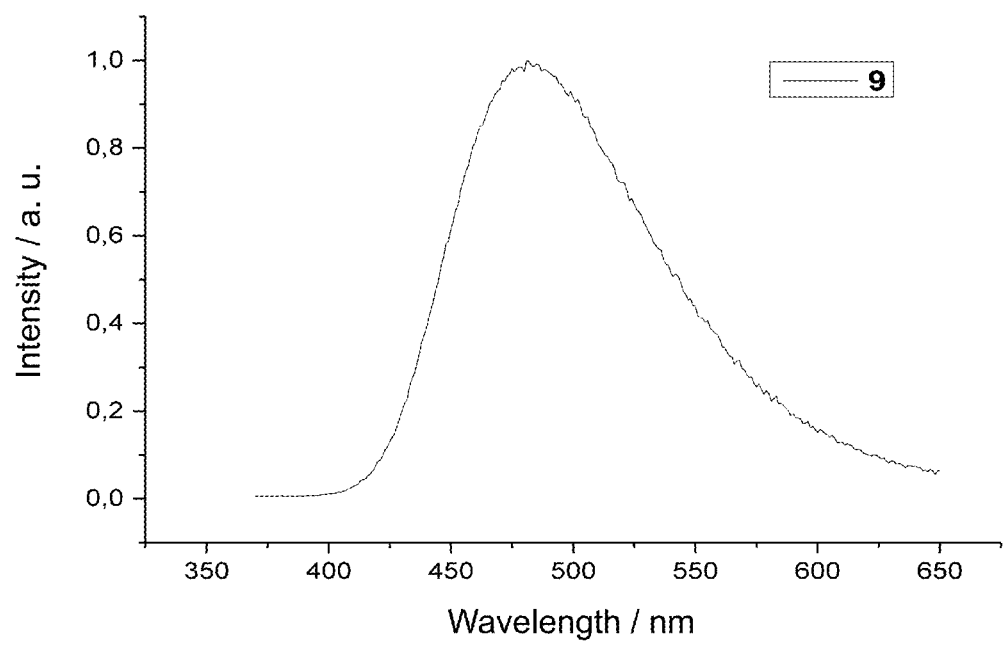
FIG. 16 is a film emission of product 9 (10% in PMMA).

The film emission of 9 (10% in PMMA) is shown in FIG. 16.

Example 9

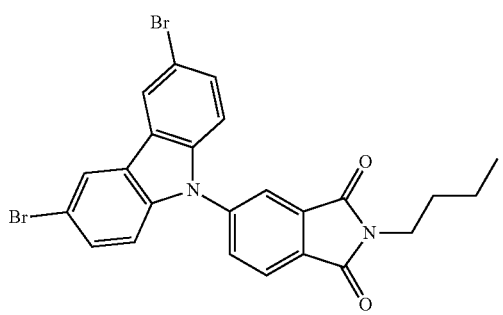

10

$^1$H NMR (500 MHz, CDCl$_3$): δ=8.20 (d, J=1.9 Hz, 2H), 8.08 (d, J=7.9 Hz, 1H), 8.01 (d, J=1.8 Hz, 1H), 7.87 (dd, J=7.9, 1.9 Hz, 1H), 7.54 (dd, J=8.7, 1.9 Hz, 2H), 7.30 (d, J=8.7 Hz, 2H), 3.75 (t, J=7.3 Hz, 2H), 1.76-1.66 (m, 2H), 1.41 (h, J=7.4 Hz, 2H), 0.98 (t, J=7.4 Hz, 3H).

$^{13}$C NMR (126 MHz, CDCl$_3$): δ=167.6, 167.5, 142.5, 139.2, 134.7, 131.6, 130.7, 130.1, 125.3, 124.7, 123.7, 121.2, 114.4, 111.4, 38.3, 30.8, 20.3, 13.8.

Figure 17:
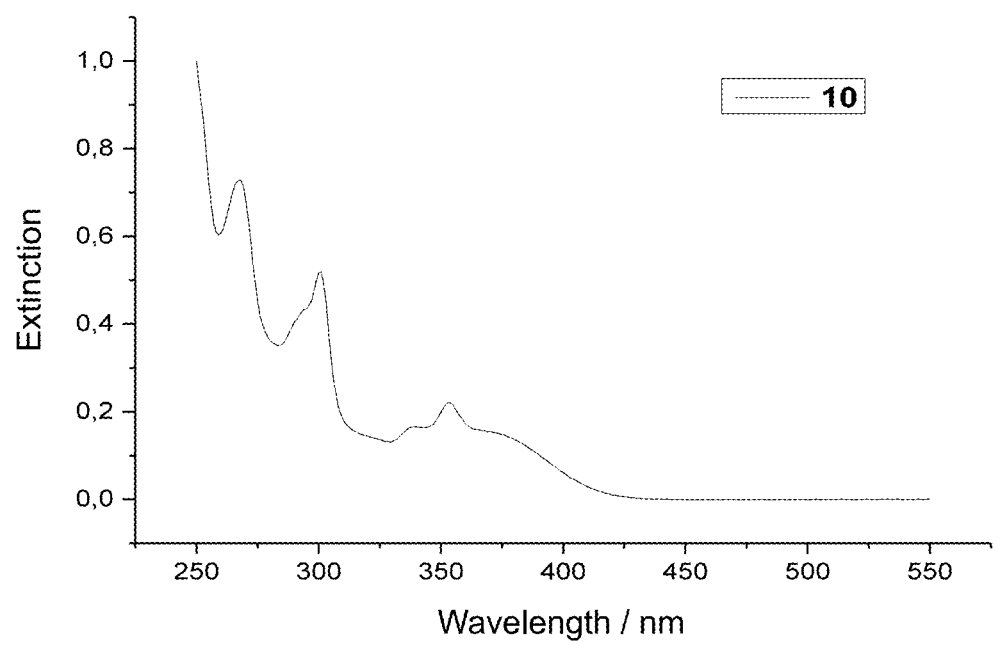
FIG. 17 is an absorption spectrum of product 10 in dichloromethane.

The absorption spectrum of 10 in dichloromethane is shown in FIG. 17.

Figure 18:
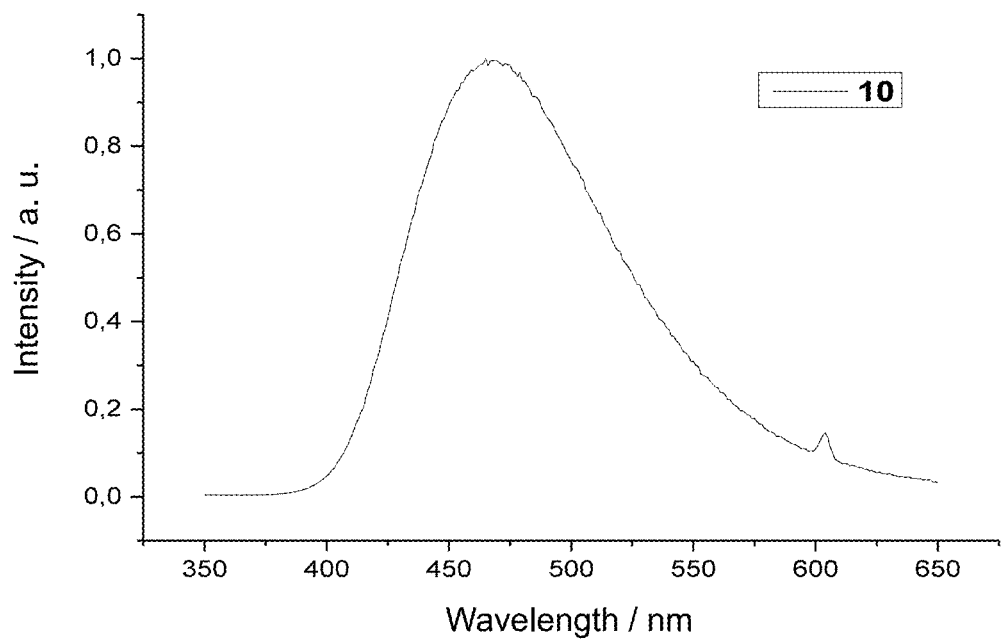
FIG. 18 is a film emission of product 10 (10% in PMMA).

The film emission of 10 (10% in PMMA) is shown in FIG. 18.

Example 10

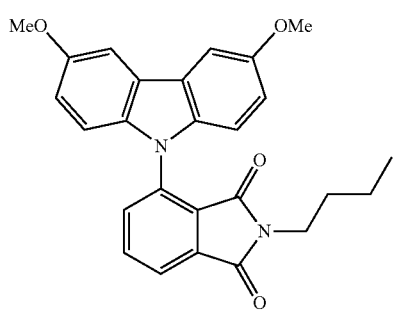

11

$^1$H NMR (500 MHz, CDCl$_3$): δ=7.93 (dd, J=7.2, 1.2 Hz, 1H), 7.87 (t, J=7.5 Hz, 1H), 7.83 (dd, J=8.0, 1.2 Hz, 1H), 7.56 (d, J=2.5 Hz, 2H), 7.07 (d, J=8.9 Hz, 2H), 7.01 (dd, J=8.9, 2.5 Hz, 2H), 3.95 (s, 6H), 3.62 (t, J=7.3 Hz, 2H), 1.65-1.53 (m, 2H), 1.31 (dt, J=15.1, 7.4 Hz, 2H), 0.89 (t, J=7.3 Hz, 3H).

$^{13}$C NMR (126 MHz, CDCl$_3$): δ=167.8, 165.8, 154.7, 136.1, 135.5, 134.9, 134.8, 134.0, 126.4, 124.5, 122.1, 115.2, 111.1, 103.3, 56.2, 38.1, 30.6, 20.2, 13.7.

Figure 19:
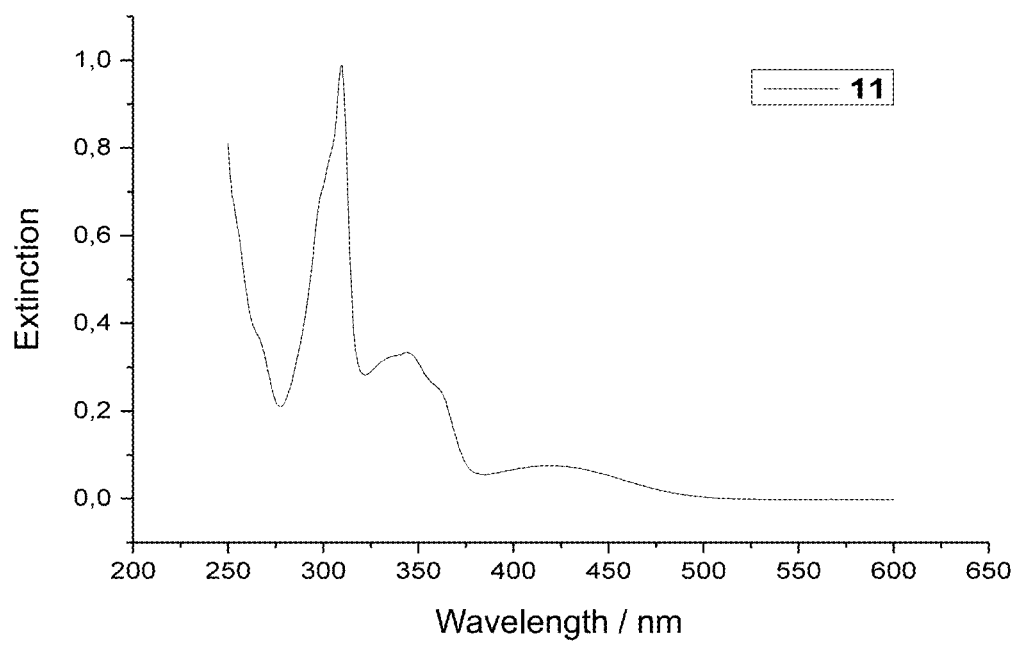
FIG. 19 is an absorption spectrum of product 11 in dichloromethane.

The absorption spectrum of 11 in dichloromethane is shown in FIG. 19.

Figure 20:
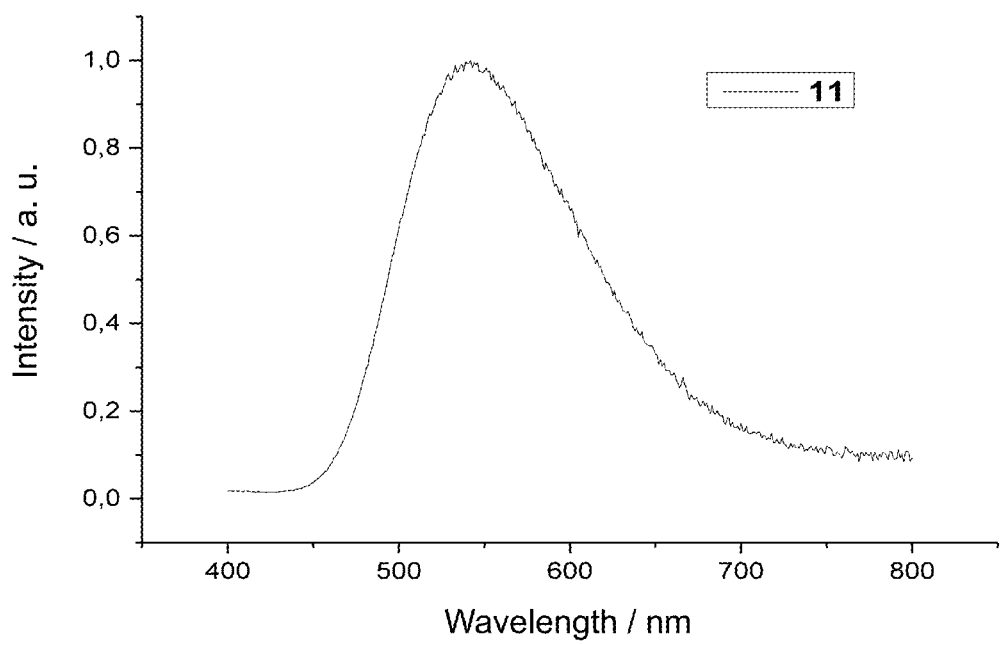
FIG. 20 is a film emission of product 11 (10% in PMMA).

The film emission of 11 (10% in PMMA) is shown in FIG. 20.

Example 11

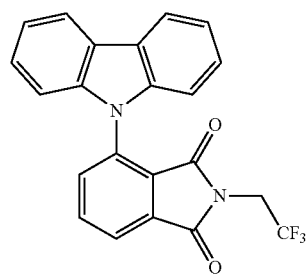

12

$^1$H NMR (500 MHz, CDCl$_3$): δ=8.16 (d, J=7.7 Hz, 2H), 8.06 (dd, J=7.2, 1.2 Hz, 1H), 7.99 (t, J=7.6 Hz, 1H), 7.95 (dd, J=7.9, 1.2 Hz, 1H), 7.40 (ddd, J=8.3, 7.2, 1.3 Hz, 2H), 7.33 (td, J=7.4, 1.0 Hz, 2H), 7.16 (d, J=8.3 Hz, 2H), 4.24 (q, J=8.5 Hz, 2H).

$^{19}$F NMR (471 MHz, CDCl$_3$): δ=−70.48.

Figure 21:
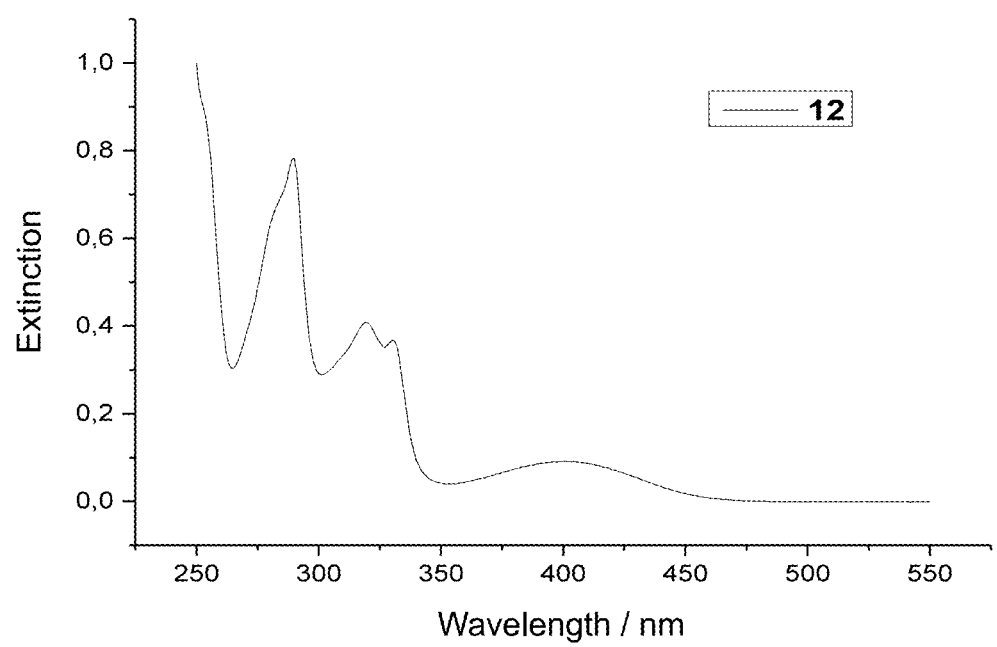
FIG. 21 is an absorption spectrum of product 12 in dichloromethane.

The absorption spectrum of 12 in dichloromethane is shown in FIG. 21.

Figure 22:
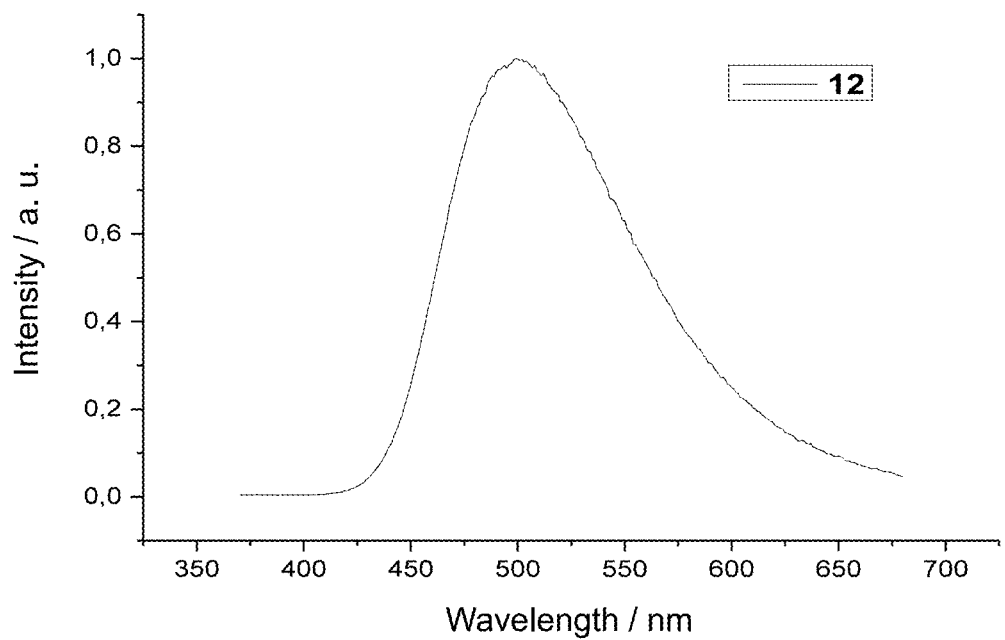
FIG. 22 is a film emission of product 12 (10% in PMMA).

The film emission of 12 (10% in PMMA) is shown in FIG. 22.

Example 12

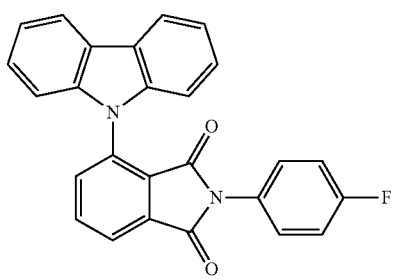

13

$^1$H NMR (500 MHz, CDCl$_3$): δ=8.16 (d, J=7.9 Hz, 2H), 8.11 (d, J=7.3 Hz, 1H), 8.01 (t, J=7.6 Hz, 1H), 7.95 (d, J=8.1 Hz, 1H), 7.43-7.34 (m, 4H), 7.32 (t, J=7.5 Hz, 2H), 7.20 (d, J=8.1 Hz, 2H), 7.15-7.07 (m, 2H).

$^{19}$F NMR (471 MHz, CDCl$_3$): δ=−113.0.

Figure 23:
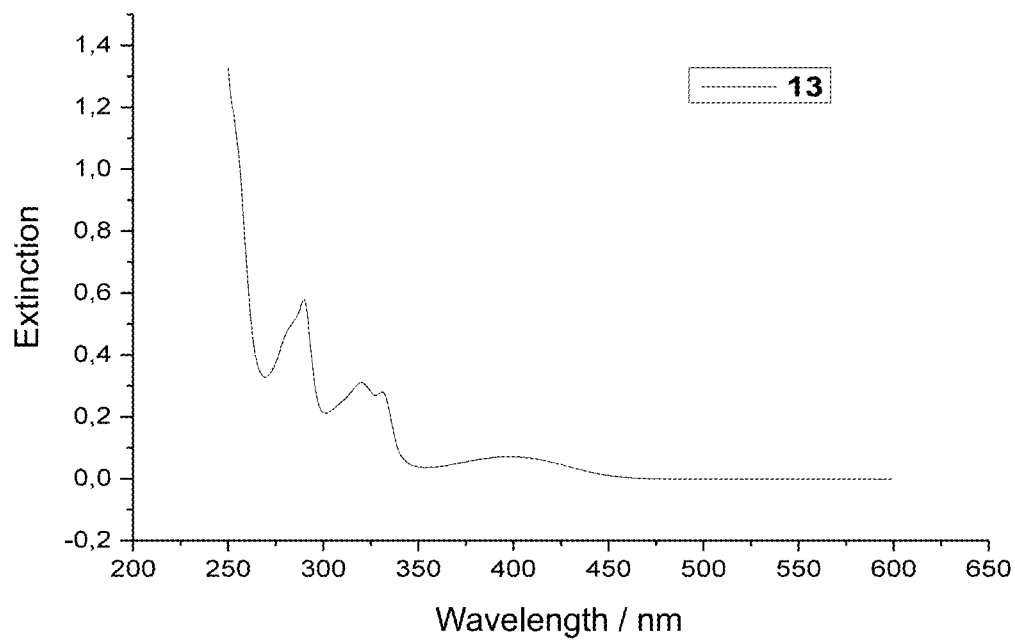
FIG. 23 is an absorption spectrum of product 13 in dichloromethane.

The absorption spectrum of 13 in dichloromethane is shown in FIG. 23.

Figure 24:
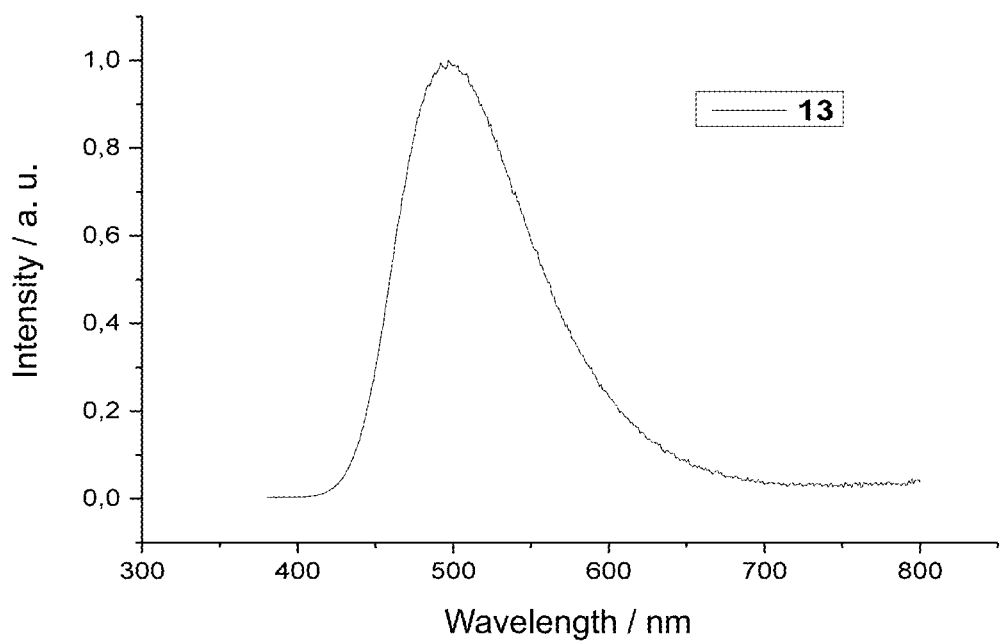
FIG. 24 is a film emission of product 13 (10% in PMMA).

The film emission of 13 (10% in PMMA) is shown in FIG. 24.

Example 13

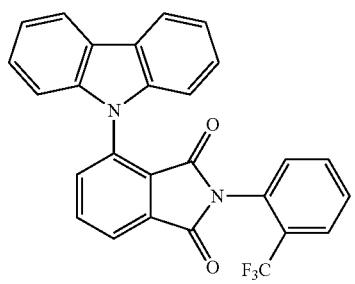

14

$^1$H NMR (500 MHz, CDCl$_3$): δ=8.13 (t, J=7.5 Hz, 2H), 8.10 (dd, J=7.0, 1.4 Hz, 1H), 8.01 (t, J=7.5 Hz, 1H), 7.98 (dd, J=8.0, 1.4 Hz, 1H), 7.79 (t, J=7.9 Hz, 1H), 7.63 (t, J=7.7 Hz, 1H), 7.56 (t, J=7.7 Hz, 1H), 7.43-7.37 (m, 2H), 7.35-7.27 (m, 4H), 7.16 (d, J=8.2 Hz, 1H).

$^{19}$F NMR (471 MHz, CDCl$_3$): δ=−61.2.

Figure 25:
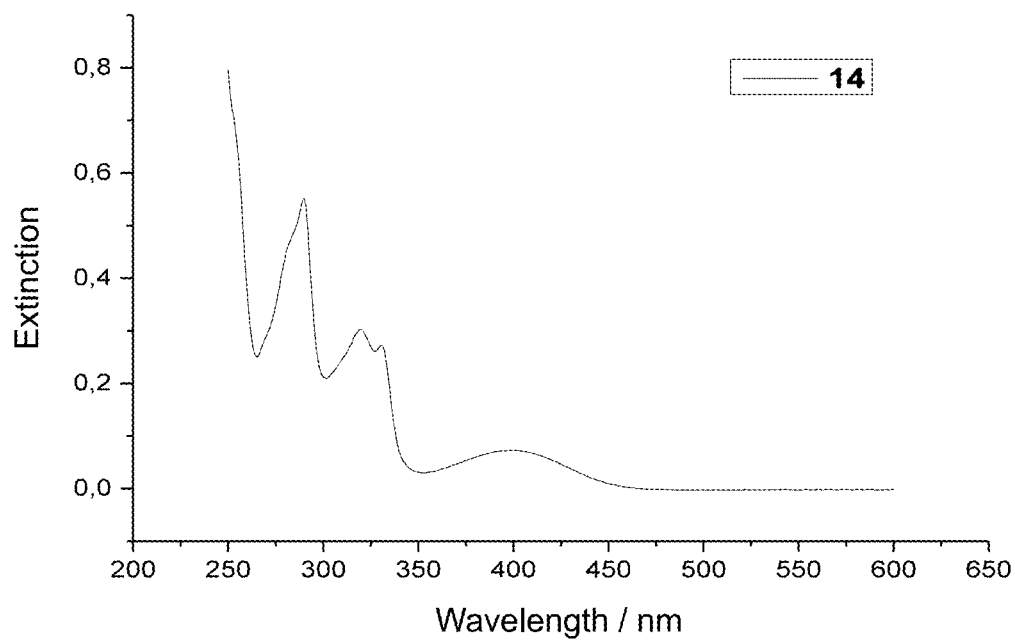
FIG. 25 is an absorption spectrum of product 14 in dichloromethane.

The absorption spectrum of 14 in dichloromethane is shown in FIG. 25.

Figure 26:
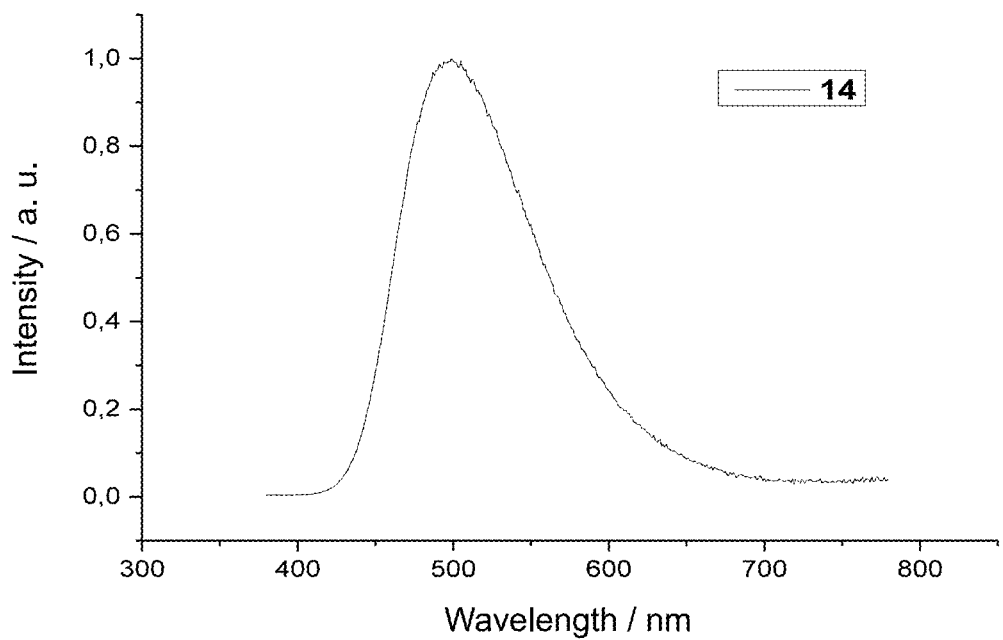
FIG. 26 is a film emission of product 14 (10% in PMMA).

The film emission of 14 (10% in PMMA) is shown in FIG. 26.

Example 14

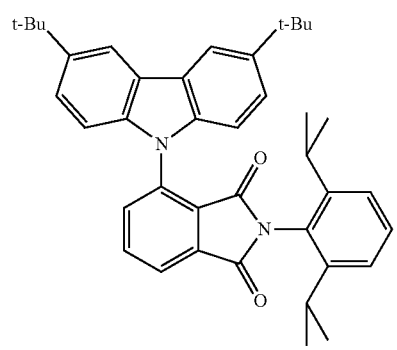

15

$^1$H NMR (500 MHz, CDCl$_3$): δ=8.12 (d, J=1.9 Hz, 2H), 8.05 (dd, J=6.2, 2.1 Hz, 1H), 8.00-7.95 (m, 2H), 7.44-7.38 (m, 3H), 7.25 (d, J=7.8 Hz, 2H), 7.19 (d, J=8.6 Hz, 2H), 2.79 (hept, J=6.8 Hz, 2H), 1.44 (s, 18H), 1.22 (d, J=6.8 Hz, 6H), 1.15 (d, J=6.8 Hz, 6H).

$^{13}$C NMR (126 MHz, CDCl$_3$): δ=167.7, 165.5, 147.3, 143.9, 138.7, 135.8, 135.5, 134.4, 134.0, 130.3, 126.8, 125.5, 124.3, 124.0, 123.6, 122.5, 116.7, 109.9, 34.9, 32.1, 29.6, 24.2.

Figure 27:
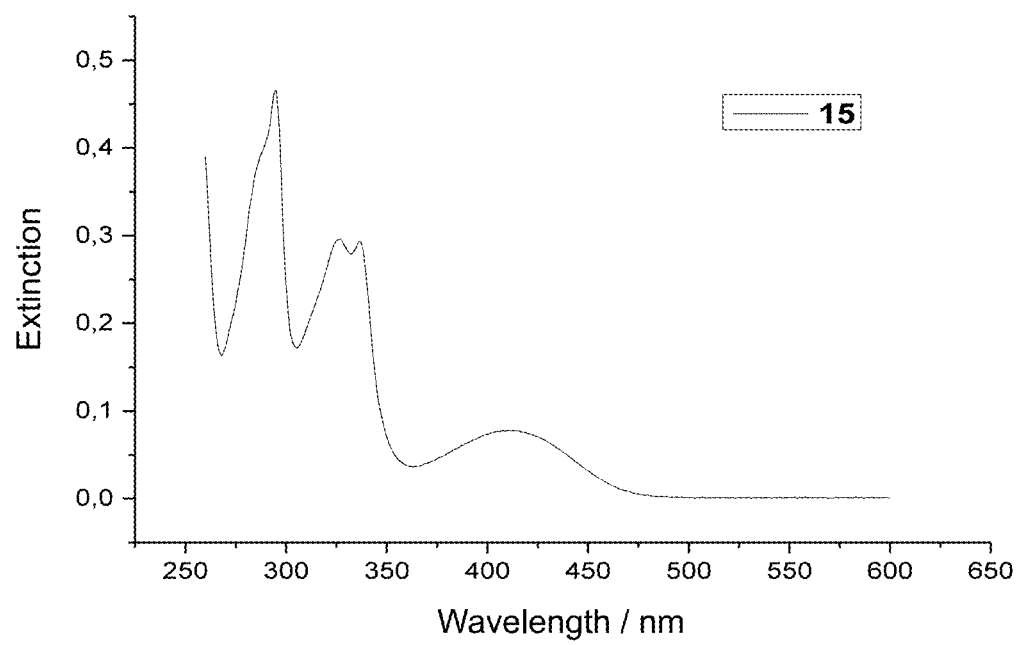
FIG. 27 is an absorption spectrum of product 15 in dichloromethane.

The absorption spectrum of 15 in dichloromethane is shown in FIG. 27.

Figure 28:
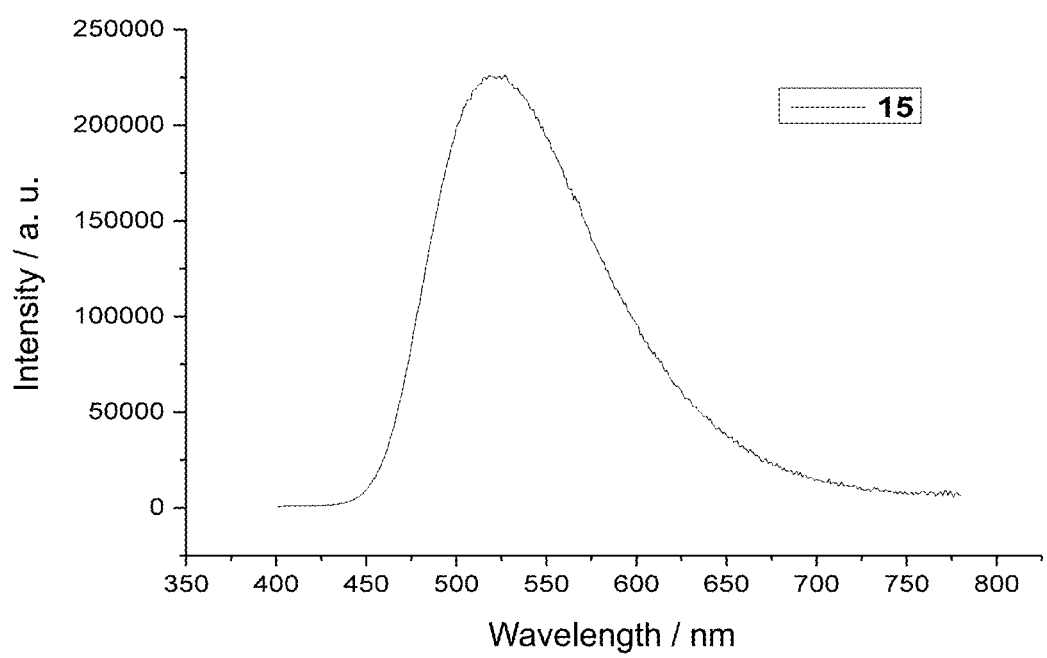
FIG. 28 is a film emission of product 15 (10% in PMMA).

The film emission of 15 (10% in PMMA) is shown in FIG. 28.

Example 15

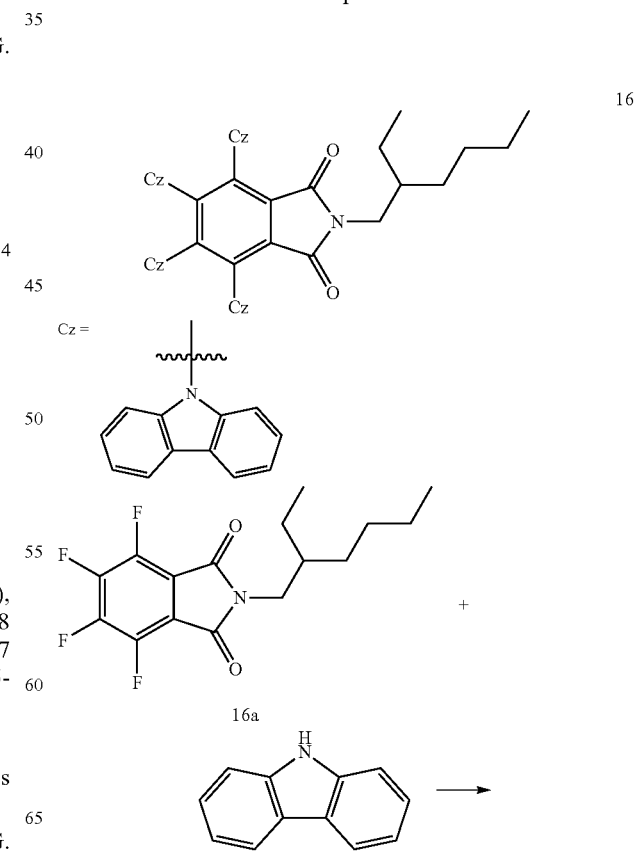

-continued

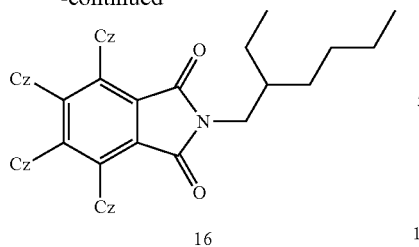

16

Molecule 16 was not prepared according to the above synthesis instruction, but according to the following synthesis instruction. In a 250 mL nitrogen flask 1.2 g sodium hydride (60% in mineral oil, 30 mmol) are added and afterwards stirred for 15 min at RT. Imide 16a, dissolved in 20 mL absolute THF, is added. After stirring at room temperature for 2 hours the solvent is removed at the rotary evaporator. The residue is solved in 150 mL EtOAc and washed with 100 mL water. The aqueous layer is extracted 2× with 50 mL EtOAc each. The combined organic layers are washed with saturated NaCl-solution and dried over MgSO$_4$. After removing the solvent at the rotary evaporator the residue is filtered over a little silica gel (eluent: Pentan/EtOAc 1:1). The solvent is removed at the rotary evaporator and the residue is solved in 50 mL CHCl$_3$ and participated by addition 200 mL EtOH. The solid thus obtained is purified by column chromatography at silica gel (eluent: Pentan/DCM). 1.45 g (1.58 mmol, 32%) of product 16 as orange solid are obtained.

$^1$H NMR (500 MHz, CDCl$_3$): δ=7.75 (d, J=8.2 Hz, 4H), 7.29 (d, J=7.9 Hz, 4H), 7.11-7.02 (m, 8H), 7.02-6.92 (m, 8H), 6.74 (t, J=7.4 Hz, 4H), 6.59-6.40 (m, 4H), 3.53 (d, J=7.4 Hz, 2H), 1.77 (hept, J=6.5 Hz, 1H), 1.39-1.14 (m, 8H), 0.90-0.81 (m, 6H).
$^{13}$C NMR (126 MHz, CDCl$_3$): δ=164.3, 141.2, 139.4, 137.8, 133.3, 129.2, 125.2, 125.2, 124.5, 124.1, 123.8, 120.8, 120.6, 120.2, 119.5, 110.4, 110.3, 42.6, 38.0, 30.5, 28.6, 23.8, 23.2, 14.3, 10.5.

Figure 29:
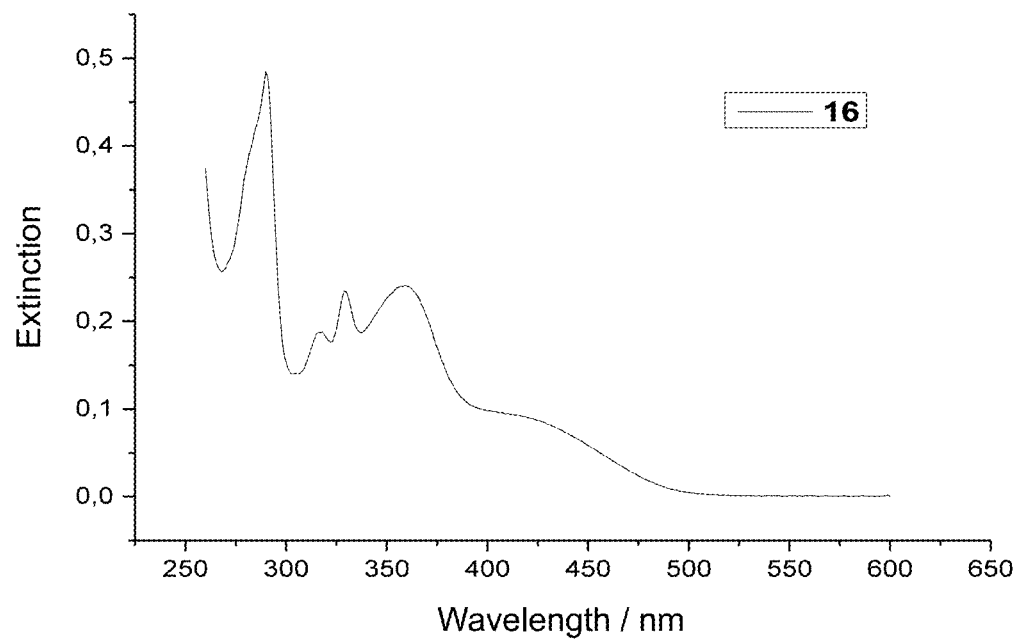
FIG. 29 is an absorption spectrum of product 16 in dichloromethane.

The absorption spectrum of 16 in dichloromethane is shown in FIG. 29.

Figure 30:
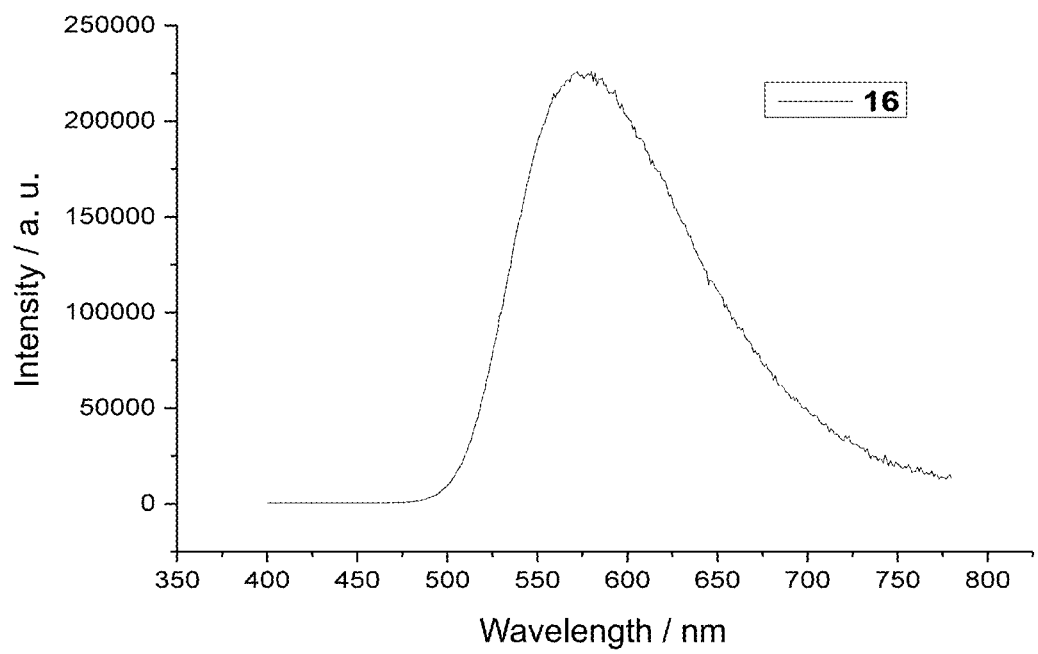
FIG. 30 is an absorption spectrum of product 16 (10% in PMMA).

The film emission of 16 (10% in PMMA) is shown in FIG. 30.

The photoluminescence quantum yield of 16 (10% in PMMA) is 28%. The delayed lifetime of 16 (10% in PMMA) is 0.3 μs.

Example 16

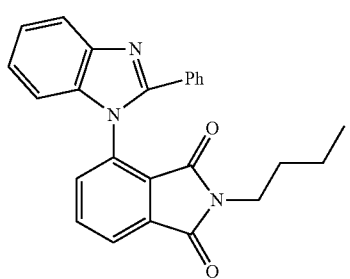

17

$^1$H NMR (500 MHz, CDCl$_3$): δ=7.96 (dd, J=7.4, 1.1 Hz, 1H), 7.93 (dt, J=8.0, 0.9 Hz, 1H) 7.91 (t, J=7.6 Hz, 1H), 7.80 (dd, J=7.7, 1.1 Hz, 1H), 7.52-7.47 (m, 2H), 7.36 (ddd, J=8.2, 7.2, 1.1 Hz, 1H), 7.34-7.24 (m, 4H), 7.13 (dt, J=8.2, 0.9 Hz, 1H), 3.54-3.36 (m, 2H), 1.50-1.30 (m, 2H), 1.07 (hept, J=6.8 Hz, 2H), 0.82 (t, J=7.3 Hz, 3H).

Example 17

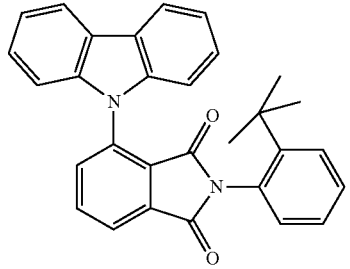

18

Example 18

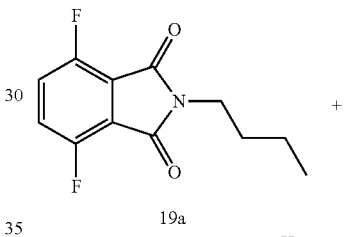

19a

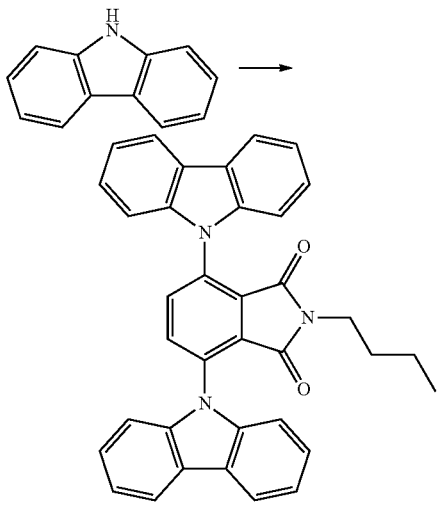

Imide 19a (598 mg, 2.5 mmol), Carbazol (1.05 g, 6.25 mmol) und K$_3$PO$_4$ (2.65 g, 12.5 mmol) are provided in a 50 mL round bottom flask and evacuated for 5 min. After supplying inert gas, 10 mL DMSO (dry) are added and heated for 16 h at 100° C. The reaction solution is poured on 100 mL water and filtered. The solid is dissolved in 100 mL CH2Cl2 and washed with 20 mL water. The aqueous layer is extracted with 50 mL CH$_2$Cl$_2$ extrahiert. The combined organic phases are washed with saturated NaCl-solution and dried over MgSO$_4$. Afterwards the solvent is removed at the rotary evaporator. Afterwards it is dried over MgSO$_4$ and the solvent is removed at the rotary evaporator. Recrystallization from a mixture of EtOH and CHCl₃ provides the product 19 (365 mg, 27%%) as yellow solid.

¹H NMR (500 MHz, CDCl₃): δ=8.20 (d, J=7.9, 4H), 8.06 (s, 2H), 7.47 (ddd, J=8.3, 7.2, 1.2 Hz, 4H), 7.43-7.35 (m, 4H), 7.33 (d, J=8.1 Hz, 4H), 3.54 (t, J=7.4 Hz, 2H), 1.58-1.46 (m, 2H), 1.32-1.17 (m, 2H), 0.83 (t, J=7.4 Hz, 3H).

¹³C NMR (126 MHz, CDCl₃): δ=δ 164.9, 140.7, 136.0, 133.6, 128.9, 126.2, 124.2, 121.2, 120.8, 110.1, 38.3, 30.4, 20.1, 13.7.

Figure 31:
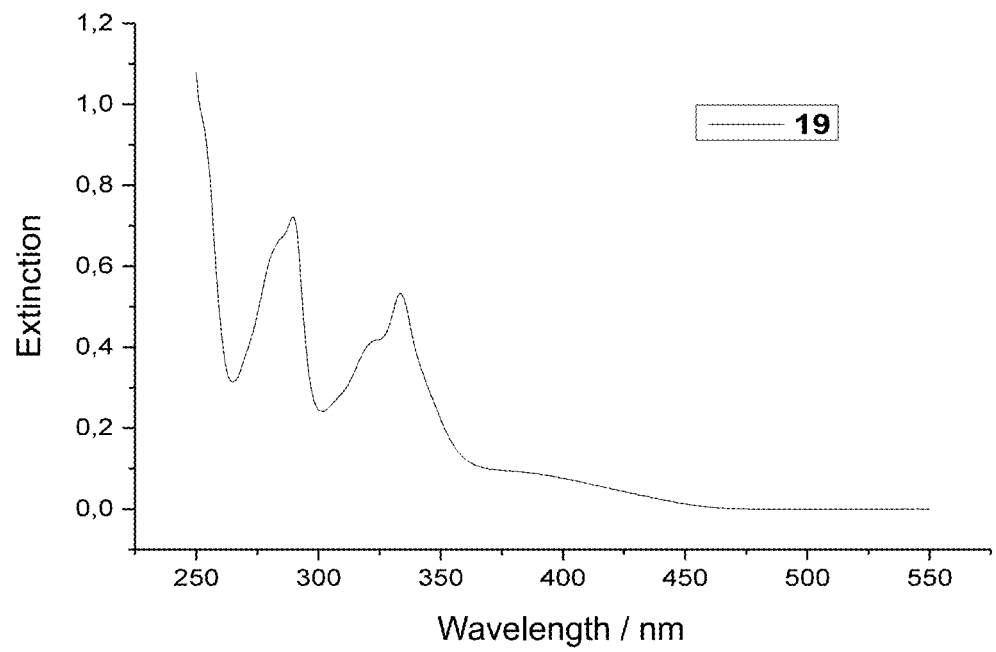
FIG. 31 is an absorption spectrum of product 19 in 2-methyltetrahydrofuran.

The absorption spectrum of 19 in 2-methyltetrahydrofuran is shown in FIG. 31.

Figure 32:
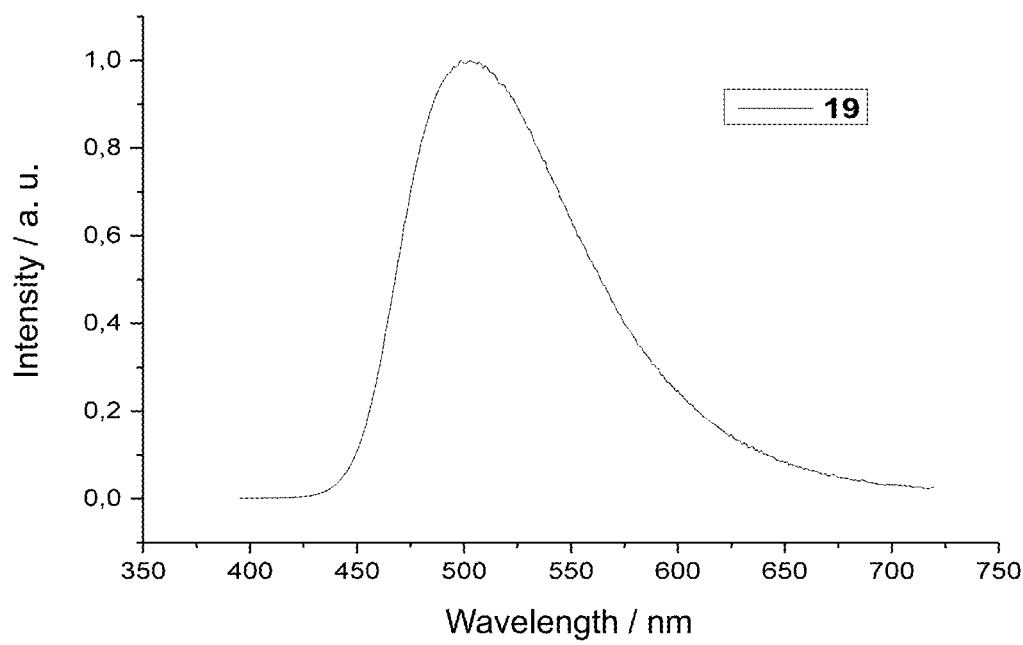
FIG. 32 is a film emission of product 19 (10% in PMMA).

The film emission of 19 (10% in PMMA) is shown in FIG. 32.

Example 19

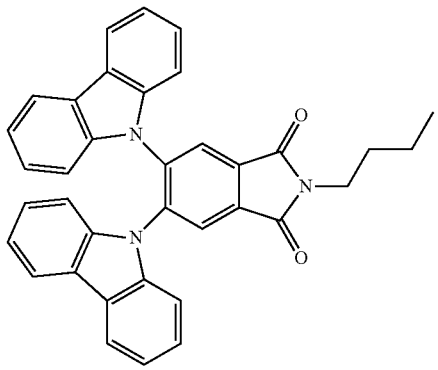

Example 20

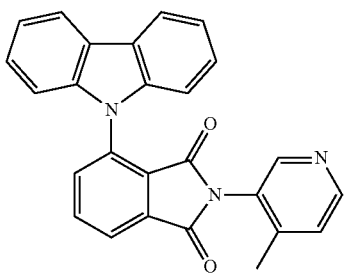

21

The synthesis was carried out along the lines of 2.

¹H NMR (500 MHz, CDCl₃): δ=8.44 (dd, J=4.7, 1.7 Hz, 1H), 8.17-8.09 (m, 3H), 8.01 (t, J=7.6 Hz, 1H), 7.96 (dd, J=7.9, 1.1 Hz, 1H), 7.64 (ddd, J=7.8, 1.7, 0.8 Hz, 1H), 7.40 (dddd, J=8.3, 7.3, 2.7, 1.2 Hz, 2H), 7.34-7.26 (m, 3H), 7.23 (dd, J=16.2, 8.2 Hz, 2H), 2.23 (s, 3H).

Figure 33:
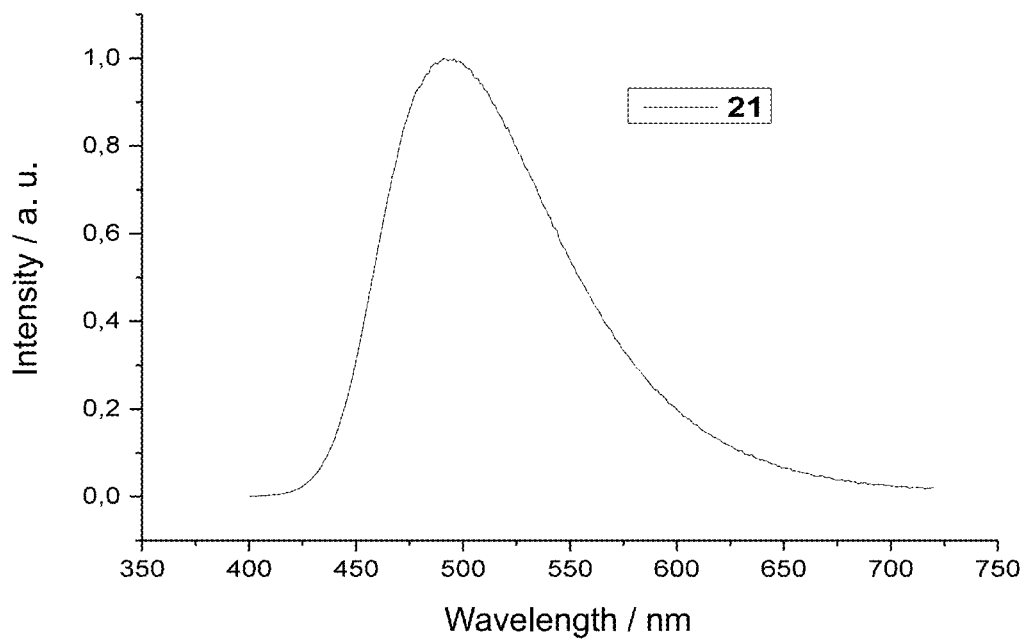
FIG. 33 is a film emission of product 21 (10% in PMMA).

The film emission of 21 (10% in PMMA) is shown in FIG. 33. The photoluminescence quantum yield of 21 (10% in PMMA) is 54%. The delayed lifetime of 21 (10% in PMMA) is 6.4 μs.

Example 21

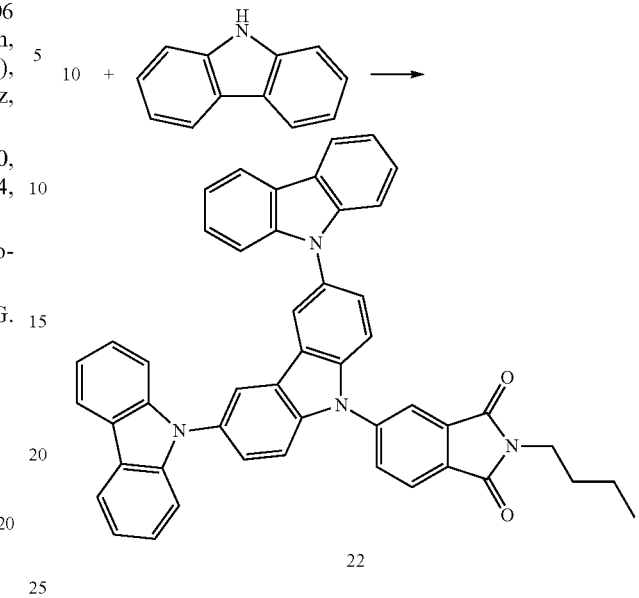

22

10 (1.58 g, 3 mmol), carbazole (1.25 g, 7.5 mmol), K₃PO₄ (2.55 g, 12 mmol) and copper(I)-iodide (286 mg, 1.5 mmol) are provided in a 50 mL round bottom flask and evacuated for 5 min. After supplying inert gas, 10 mL dioxane (dry) and (±)-trans-1,2-diaminocyclohexane (0.54 mL, 4.5 mmol) are added and stirred at 100° C. for 2 days. After cooling to room temperature 50 mL CH₂Cl₂ are added and filtered over a little silica gel (eluent: CH₂Cl₂) Afterwards the solvent is removed at the rotary evaporator. The residue is purified by column chromatography (eluent: cyclohexane/CH₂Cl₂) aufgereinigt. Afterwards the product is further purified by additional crystalline transformation (EtOH/CHCl₃). Product 22 is obtained as yellow solid (220 mg, 11%).

¹H NMR (500 MHz, CDCl₃): δ=8.31 (d, J=1.9 Hz, 2H), 8.26 (d, J=1.8 Hz, 1H), 8.19 (d, J=7.9 Hz, 1H), 8.17 (d, J=7.9 Hz, 4H), 8.12 (dd, J=7.9, 1.8 Hz, 1H), 7.72 (d, J=8.7 Hz, 2H), 7.67 (dd, J=8.7, 2.0 Hz, 2H), 7.44-7.38 (m, 8H), 7.30 (ddd, J=8.0, 6.0, 2.1 Hz, 4H), 3.80 (t, J=7.3 Hz, 2H), 1.81-1.70 (m, 2H), 1.49-1.39 (m, 2H), 1.01 (t, J=7.3 Hz, 3H).

Figure 34:
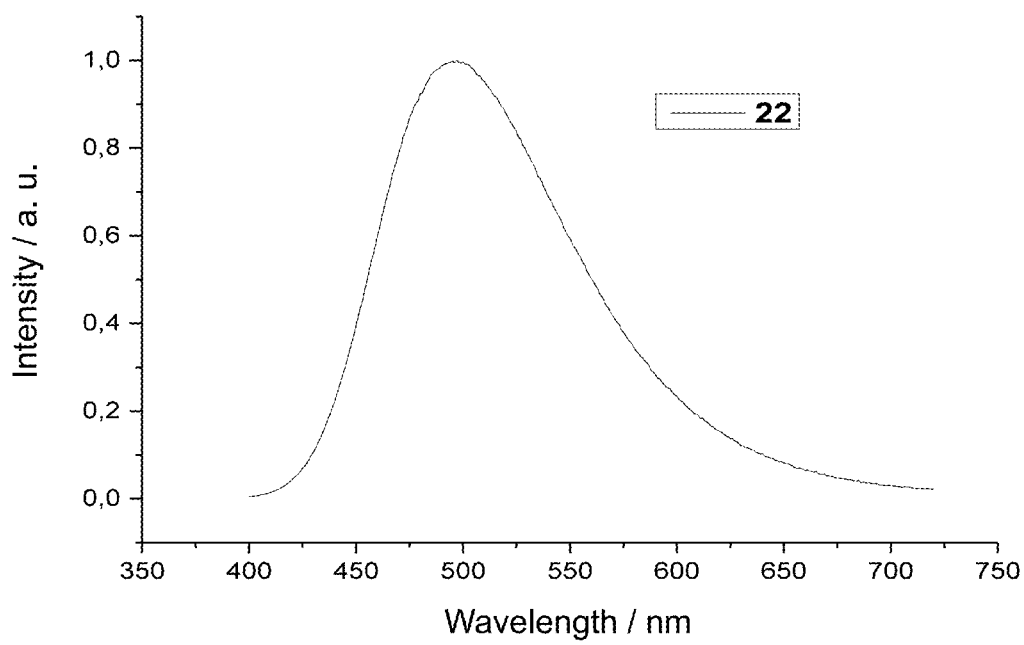
FIG. 34 is a film emission of product 22 (10% in PMMA).

The film emission of 22 (10% in PMMA) is shown in FIG. 34.

Further Examples

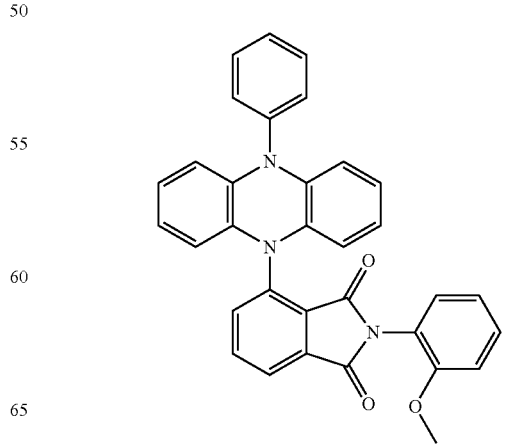

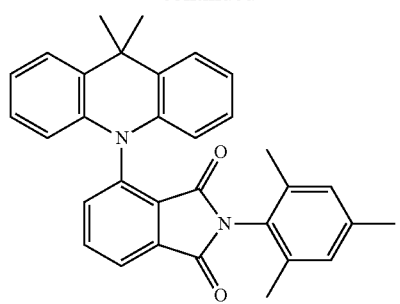
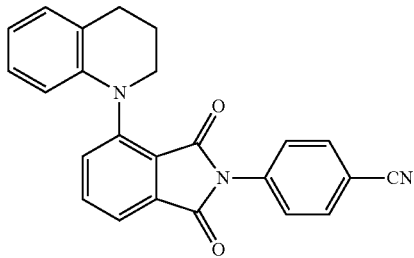
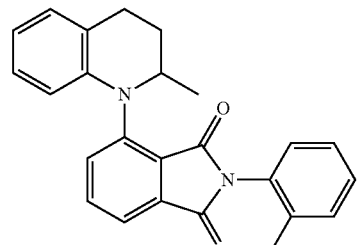
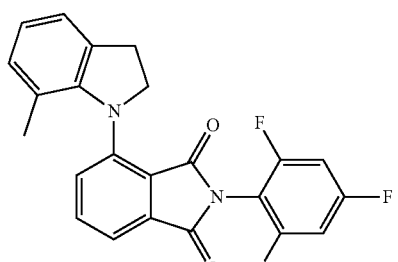
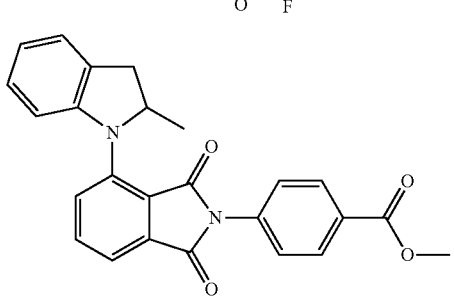
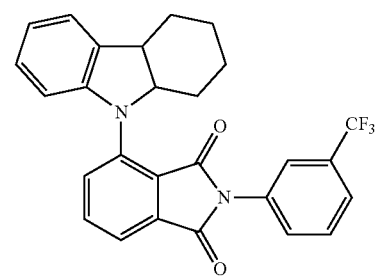
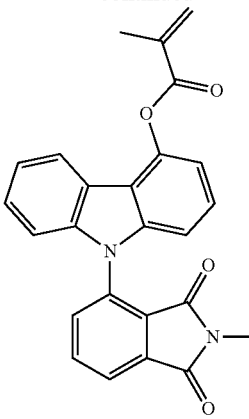
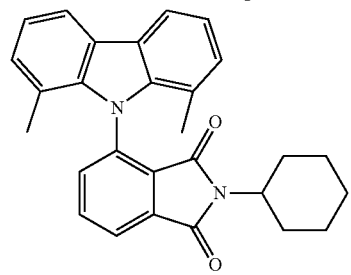
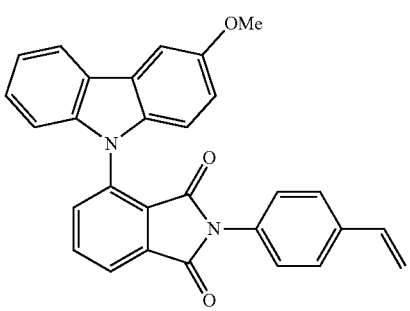
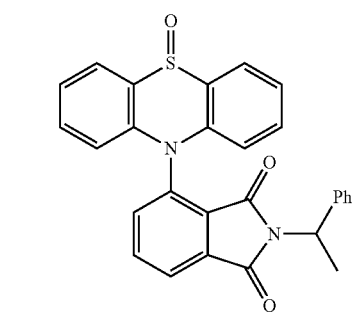
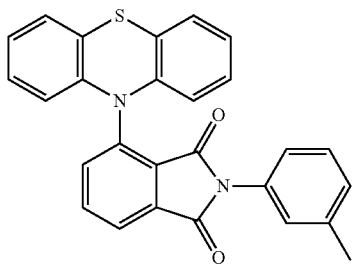

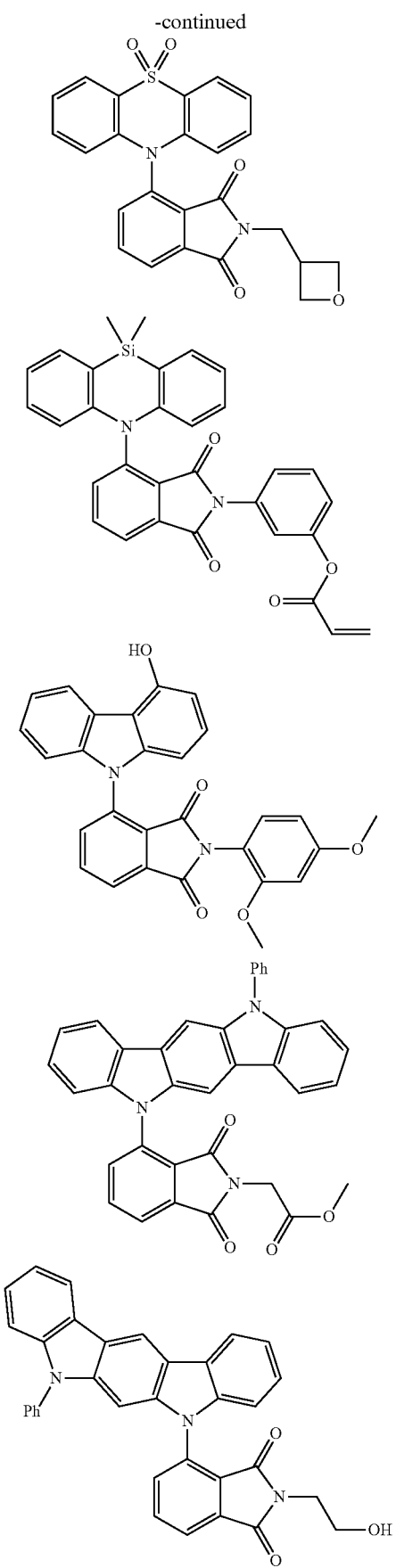
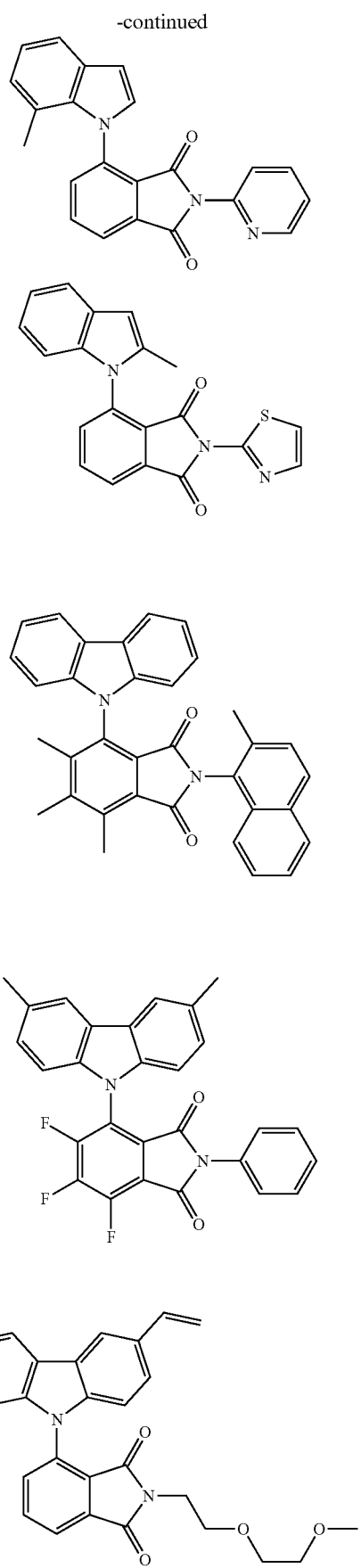

51
-continued
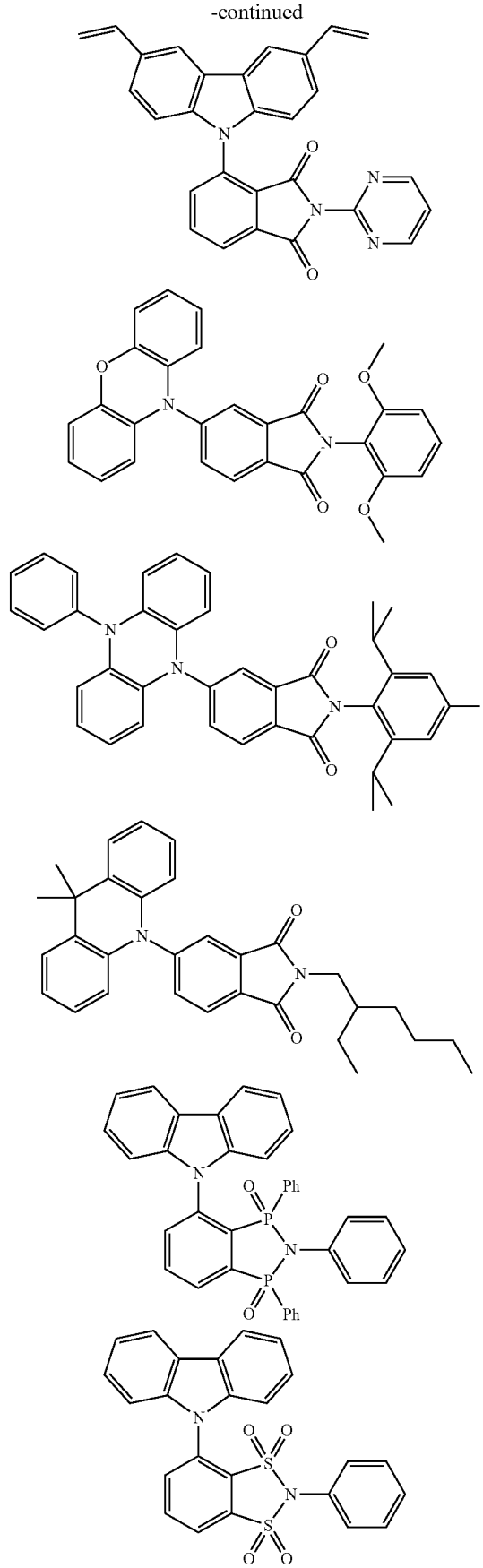
52
-continued
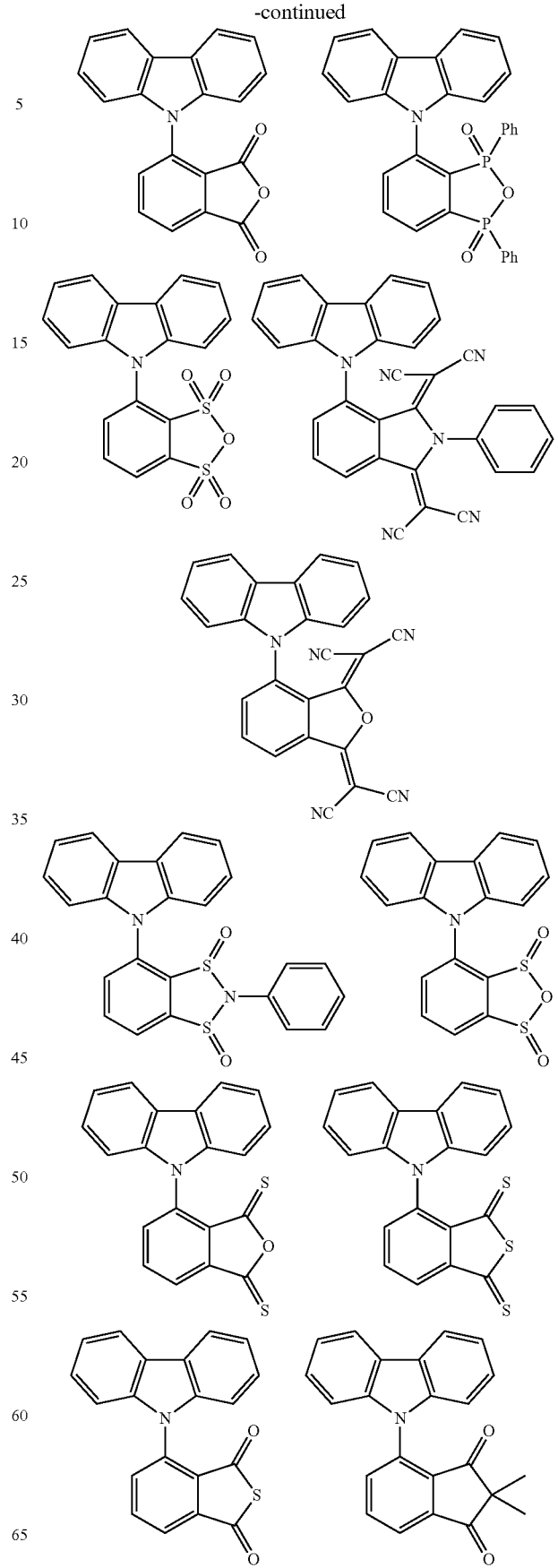

53
-continued
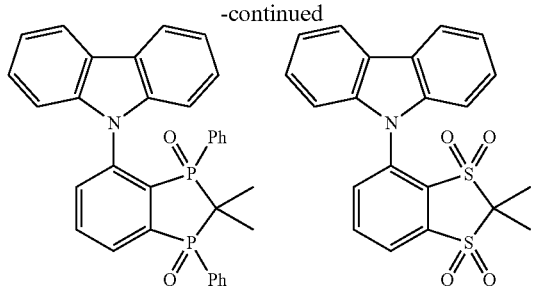
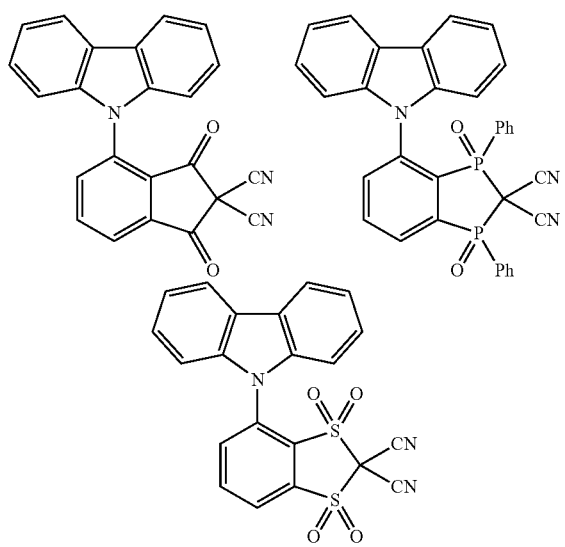
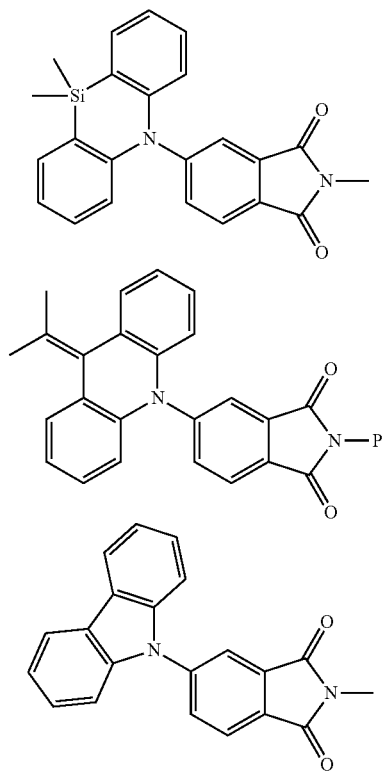
54
-continued
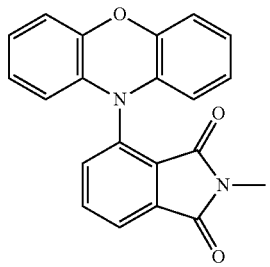
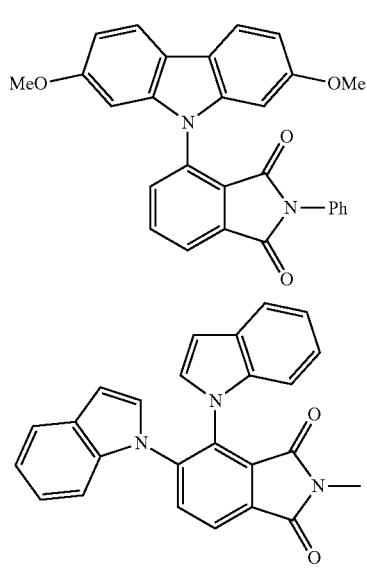
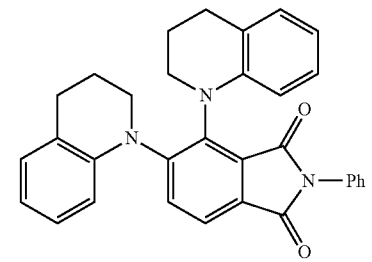
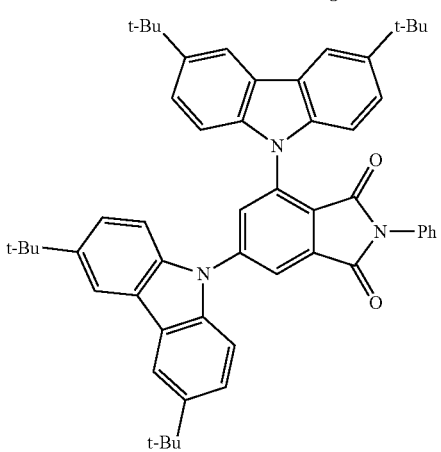

55
-continued
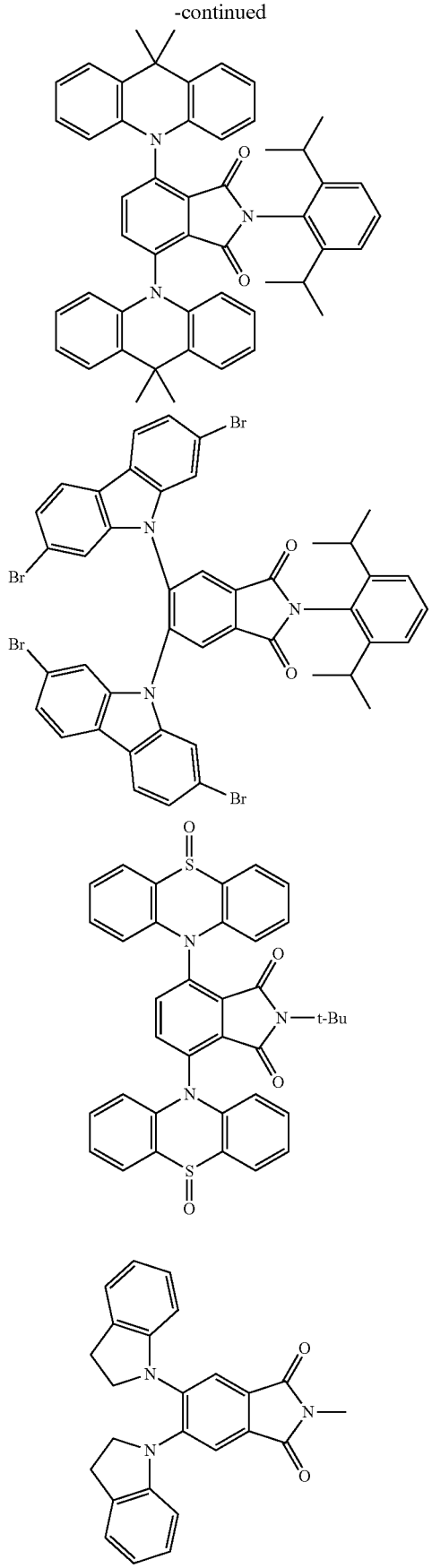
56
-continued
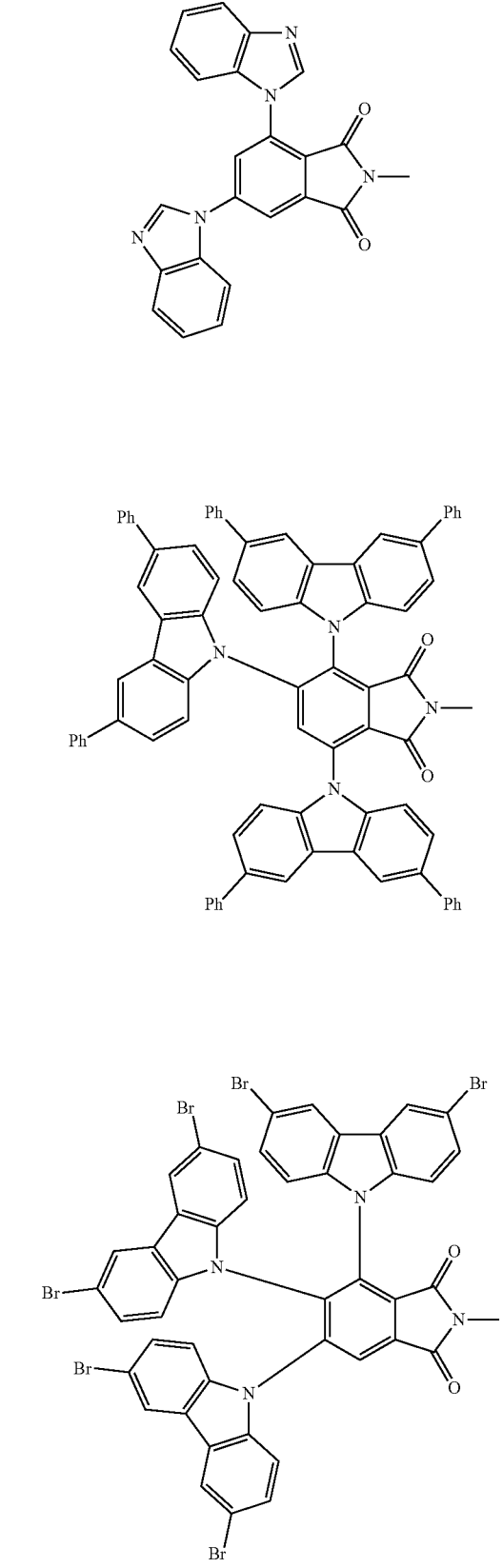

57
-continued
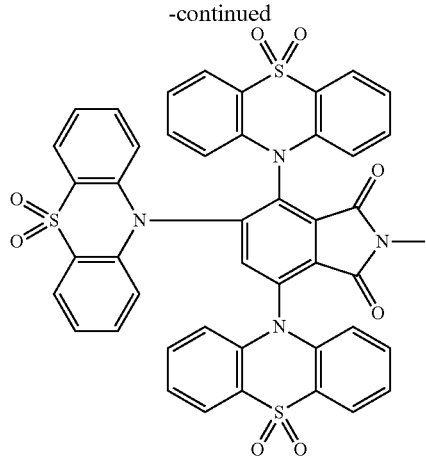
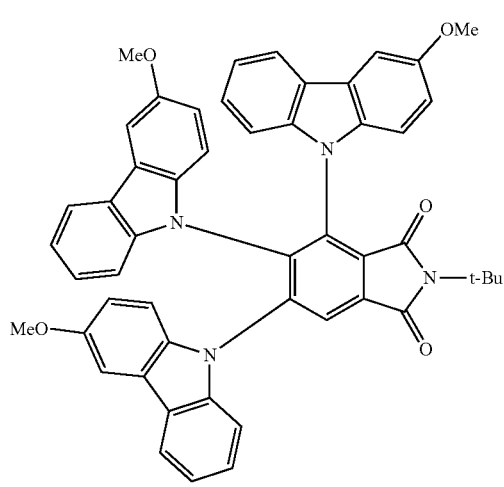
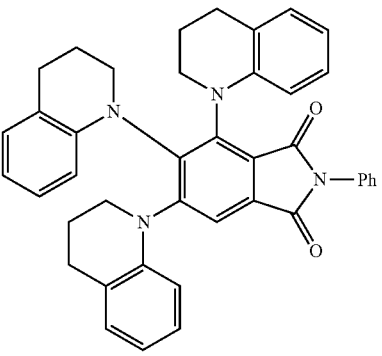
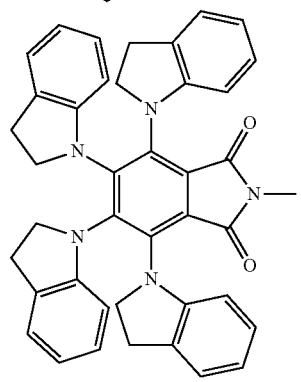
58
-continued
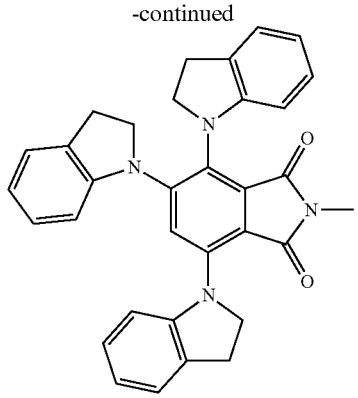
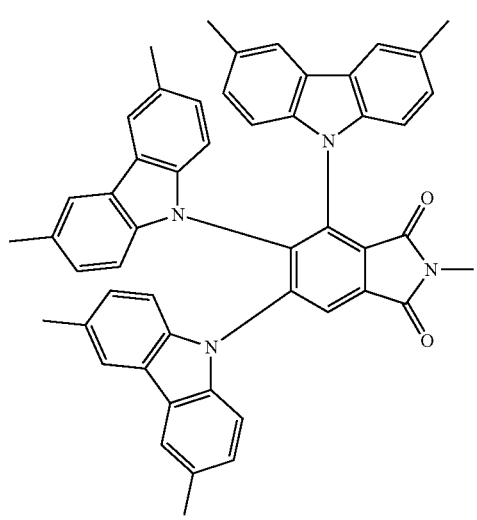
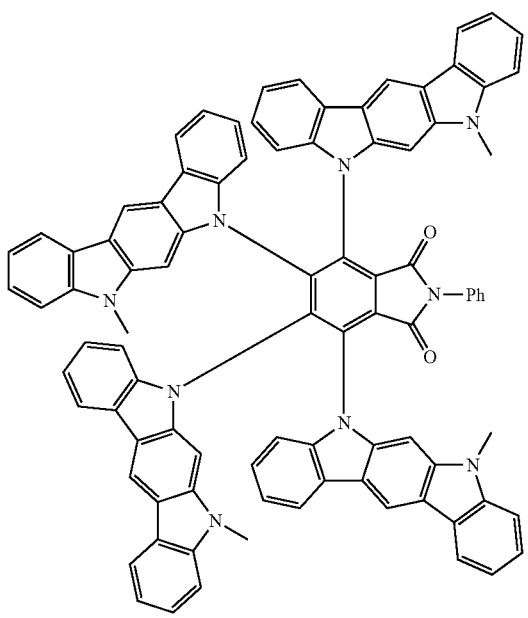

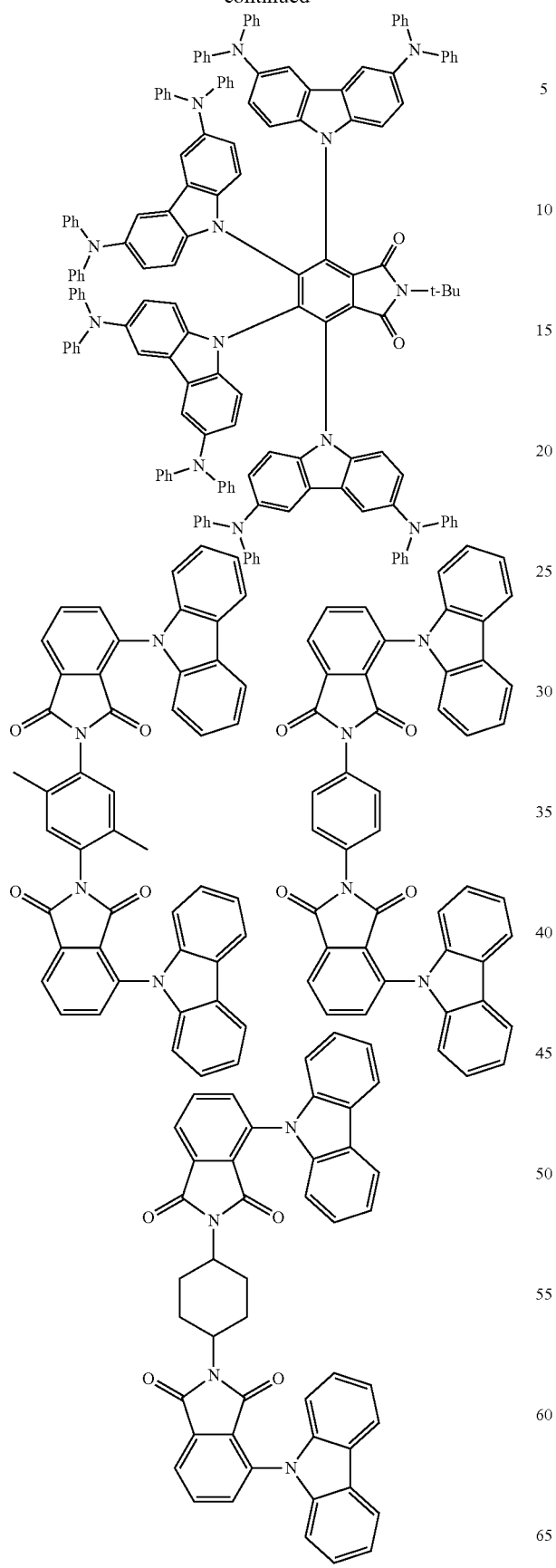
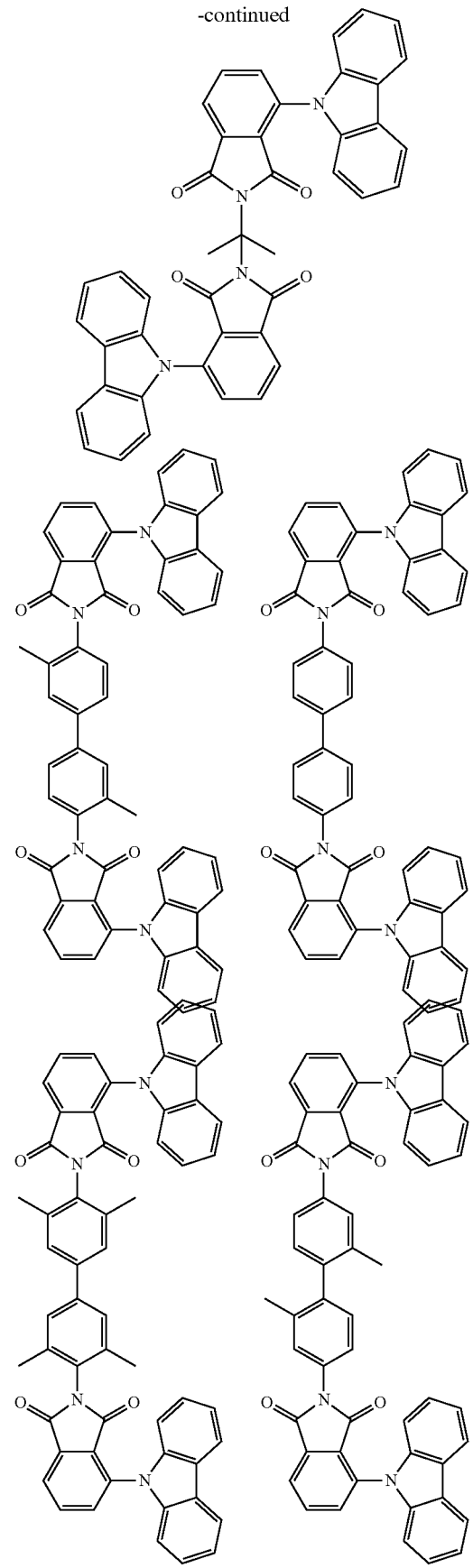

61
-continued
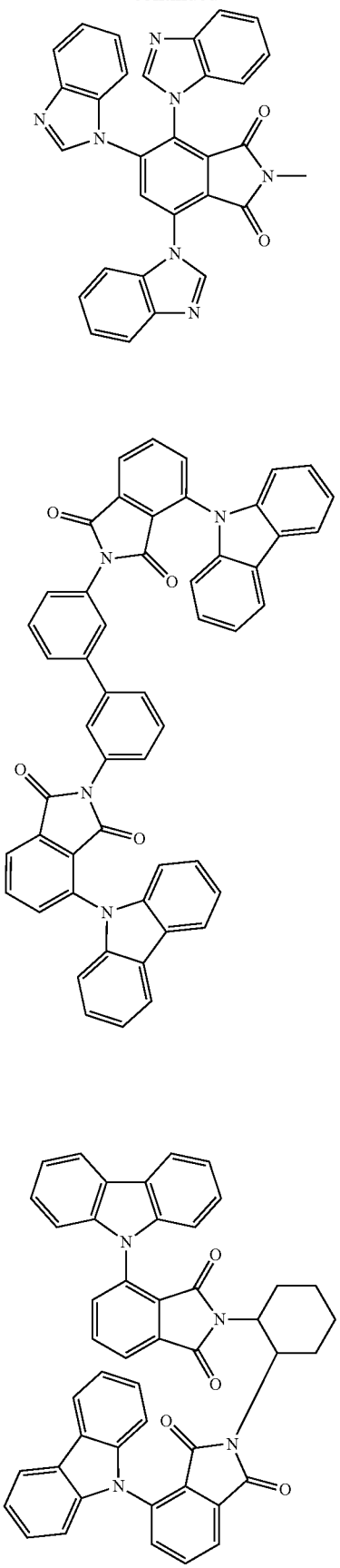 [SMILES: CN1C(=O)c2c(-n3cnc4ccccc43)cc(-n3cnc4ccccc43)c(-n3cnc4ccccc43)c2C1=O ; O=C1c2cccc(-n3c4ccccc4c4ccccc43)c2C(=O)N1c1cccc(-c2cccc(N3C(=O)c4cccc(-n5c6ccccc6c6ccccc65)c4C3=O)c2)c1 ; O=C1c2cccc(-n3c4ccccc4c4ccccc43)c2C(=O)N1C1CCCCC1N1C(=O)c2cccc(-n3c4ccccc4c4ccccc43)c2C1=O]
62
-continued
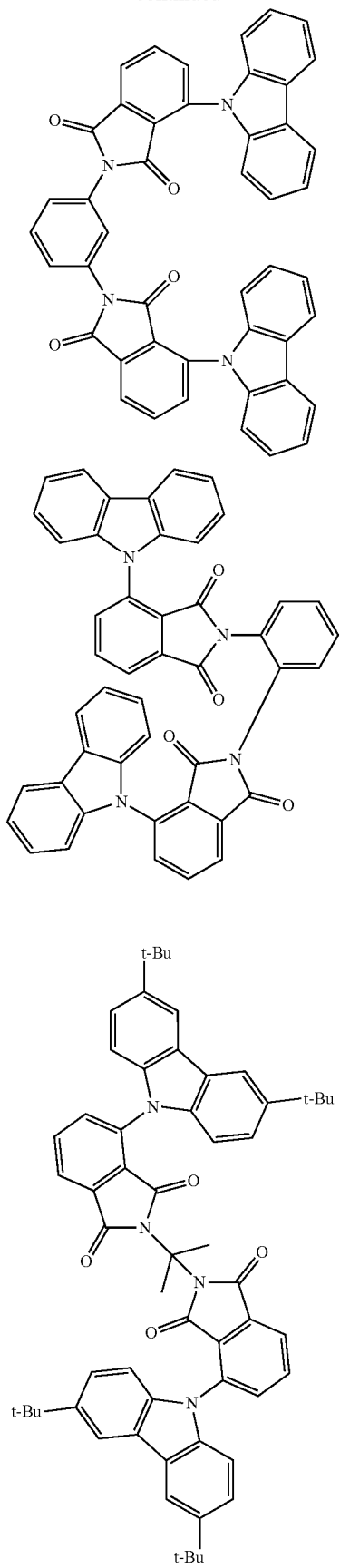

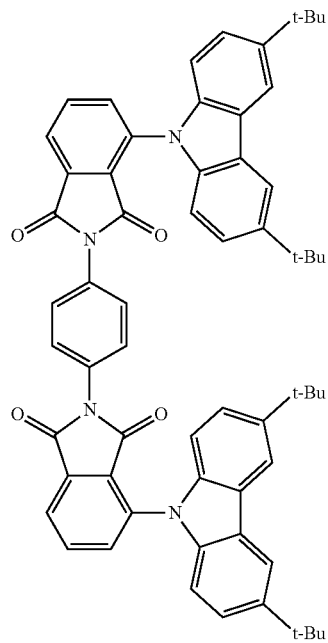
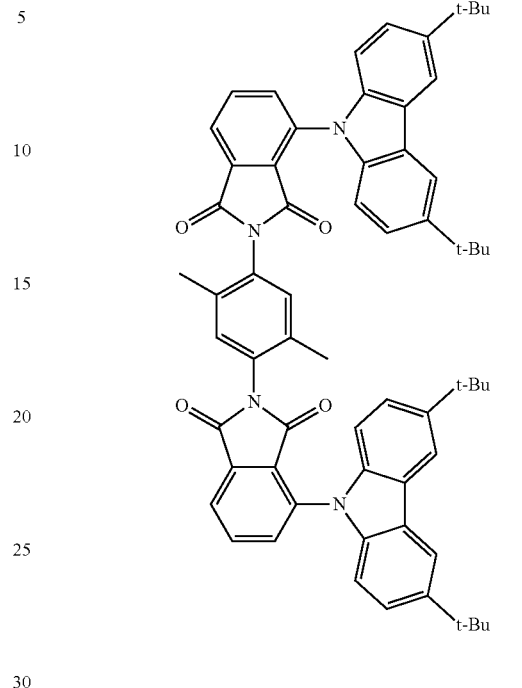
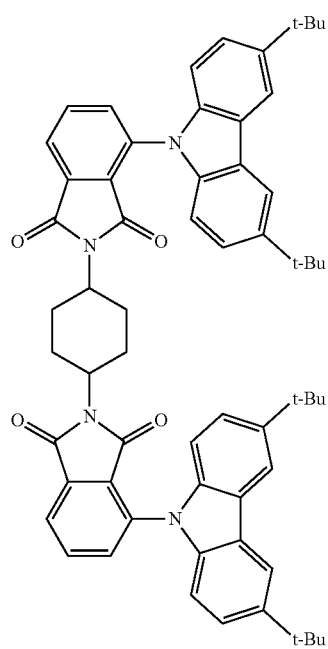
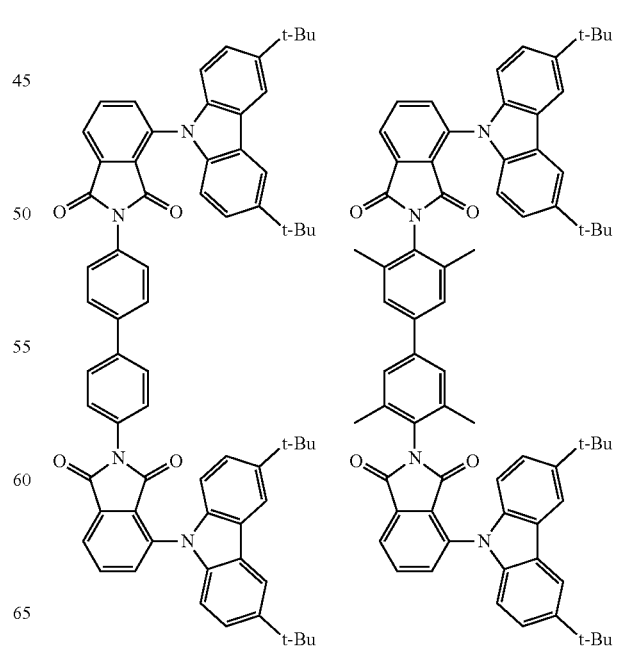

65
-continued
66
-continued
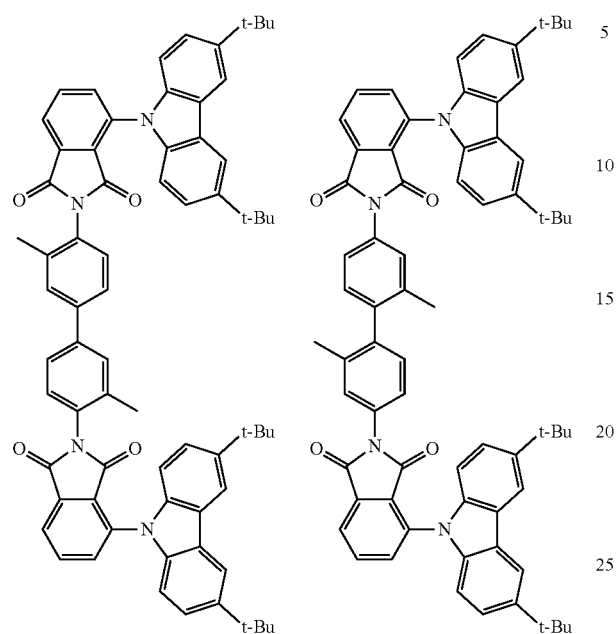
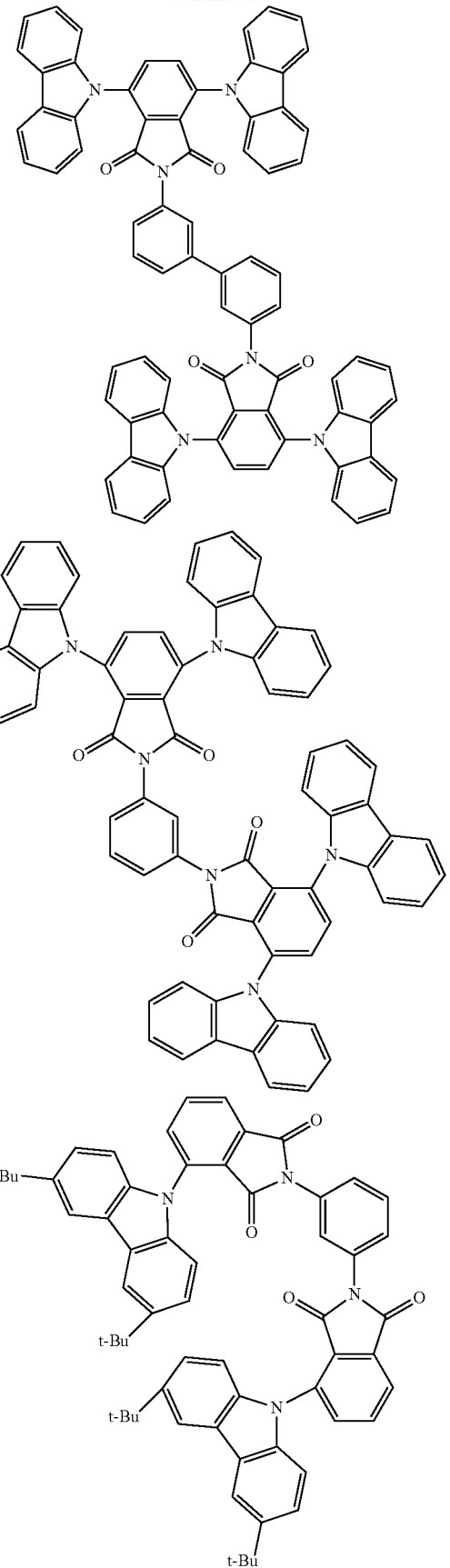

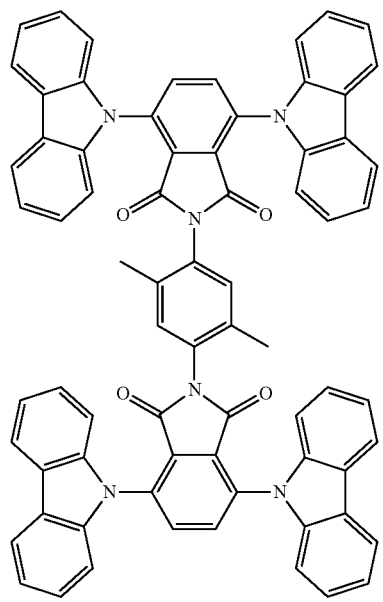
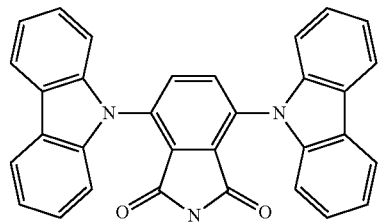
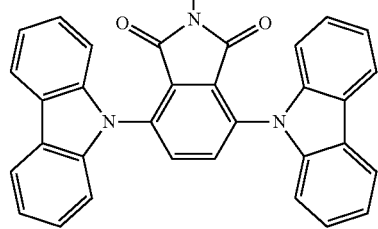
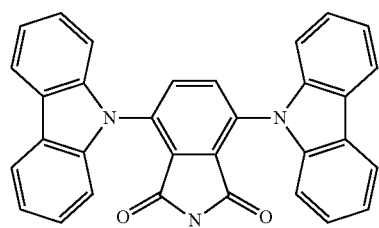
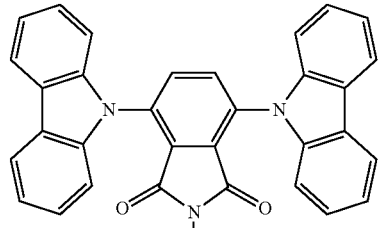
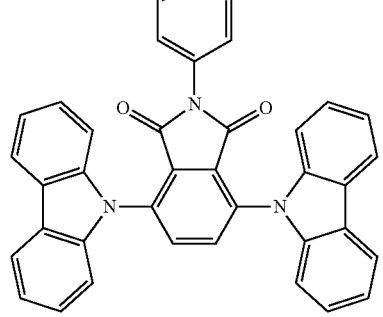
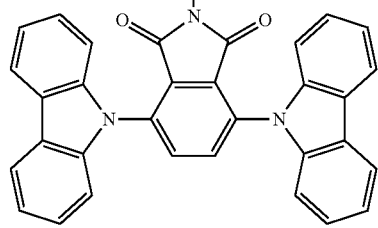

69
-continued
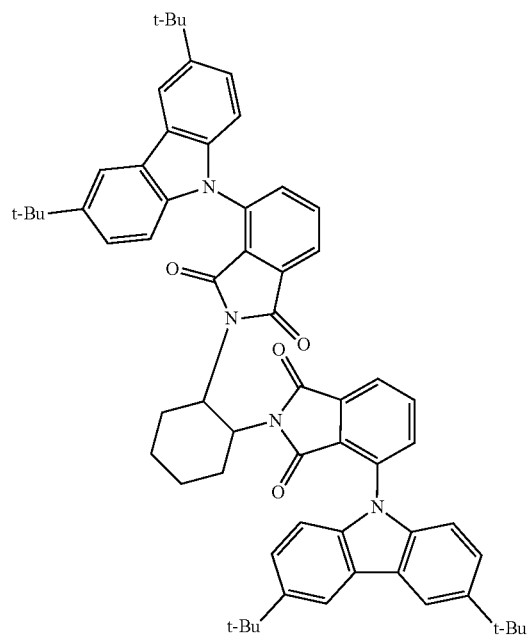
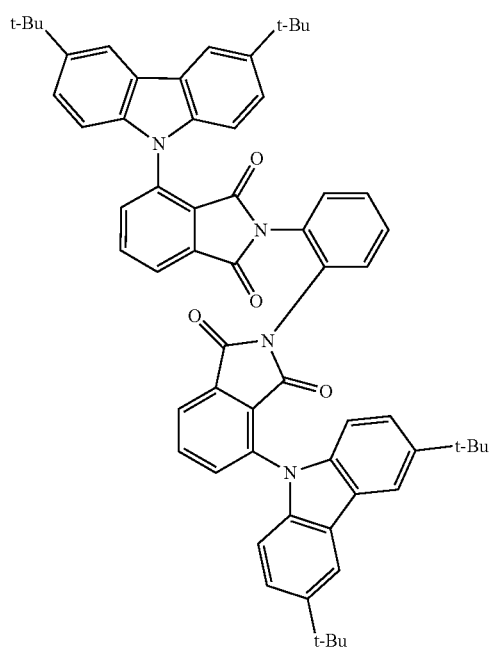
70
-continued
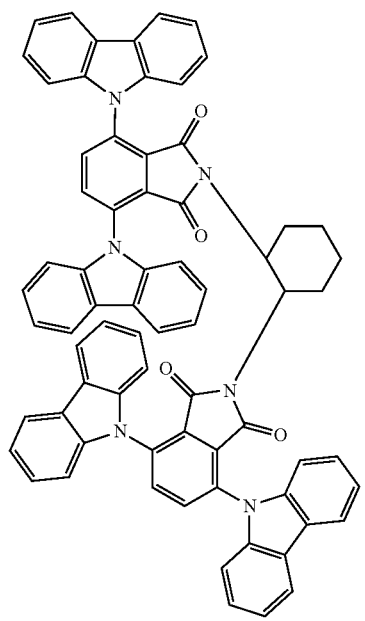
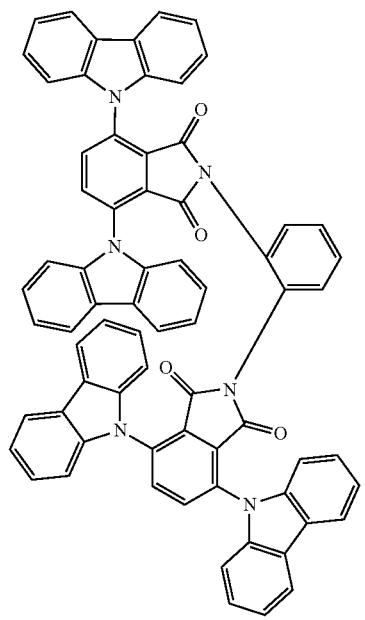

71
-continued
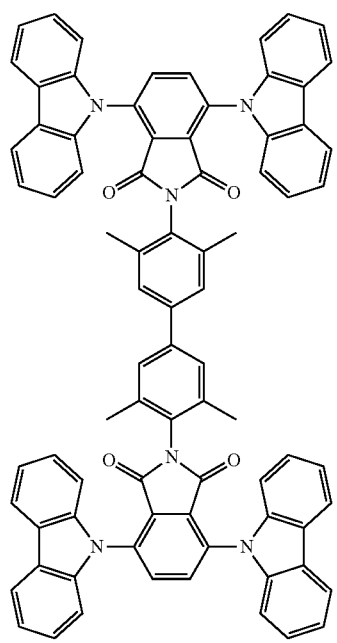
72
-continued
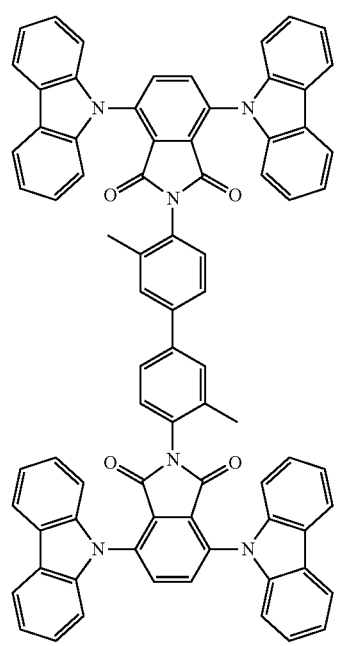
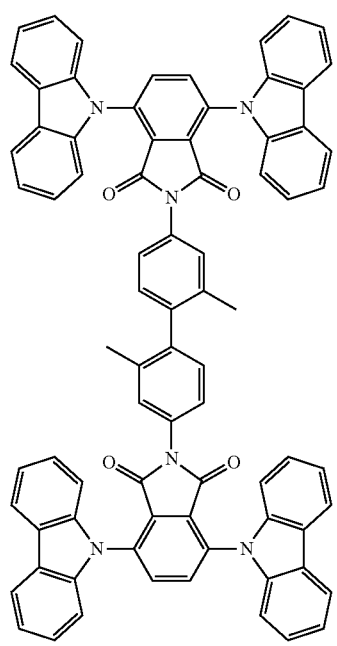
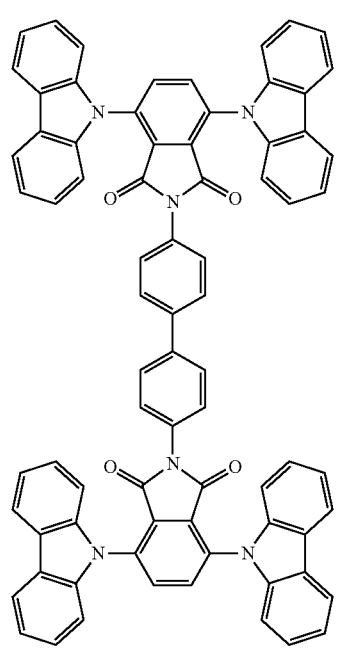

73
-continued
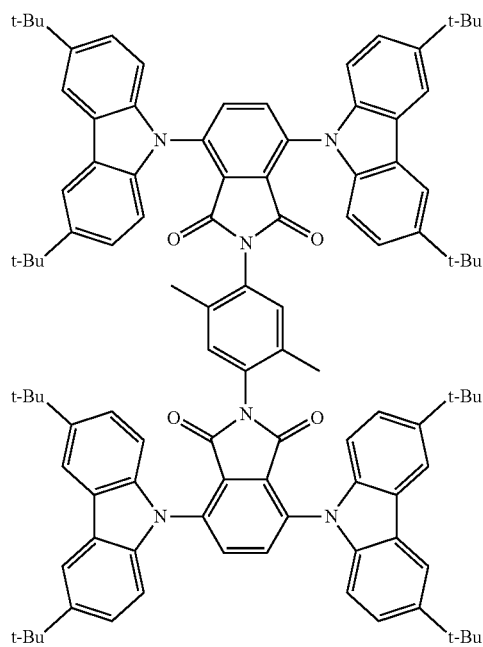
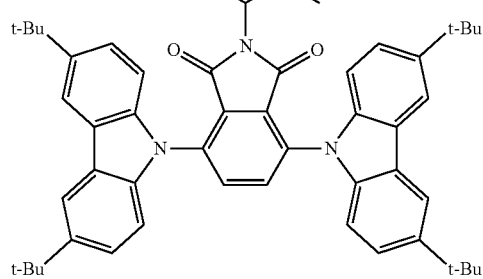
74
-continued
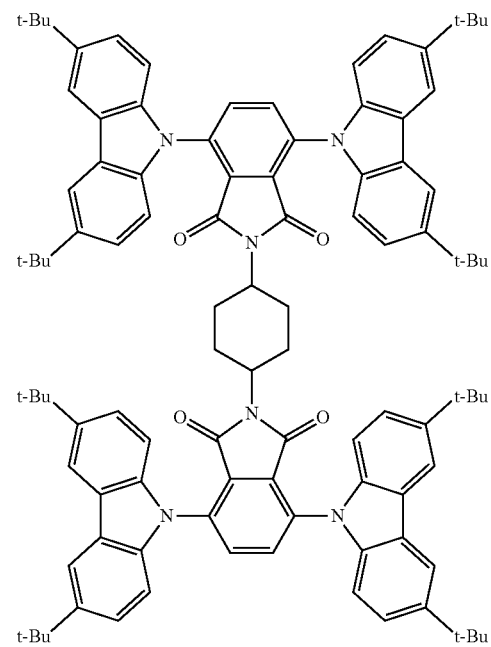
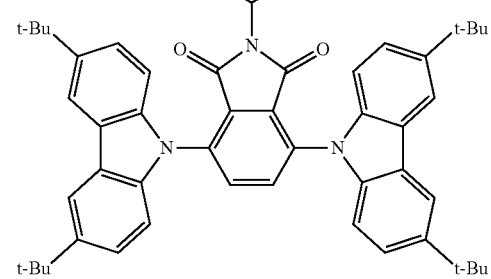
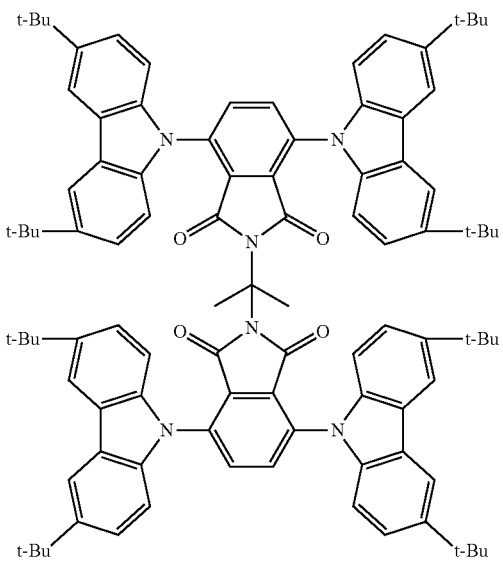

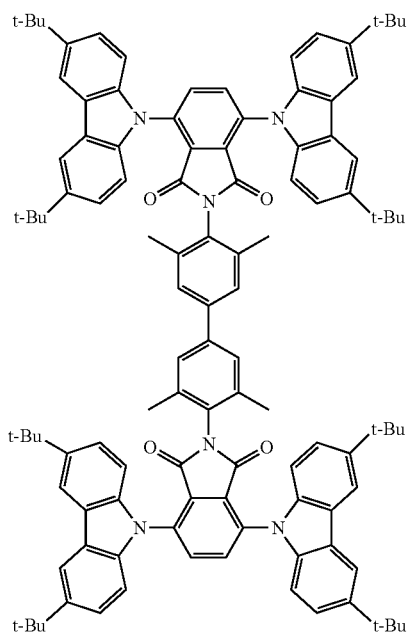
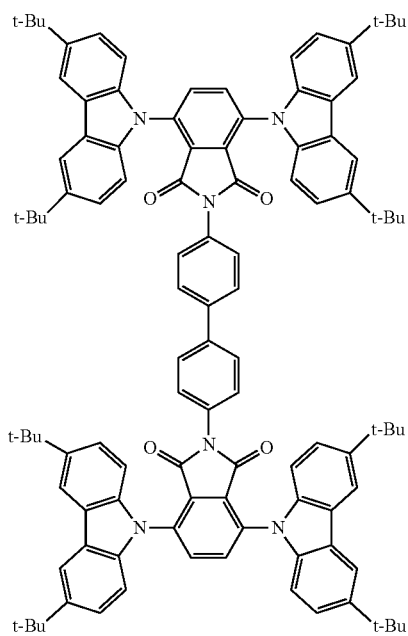
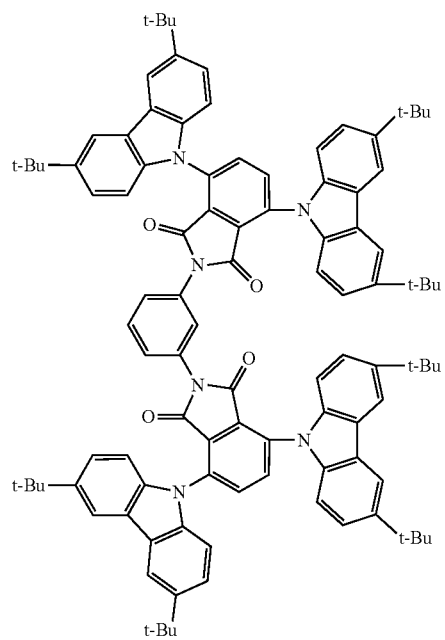
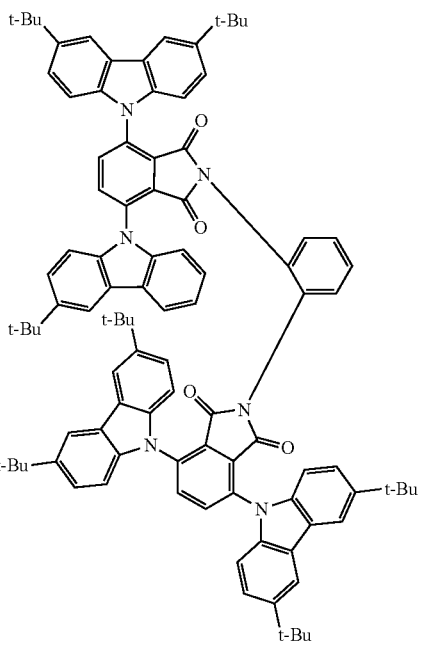

77
-continued
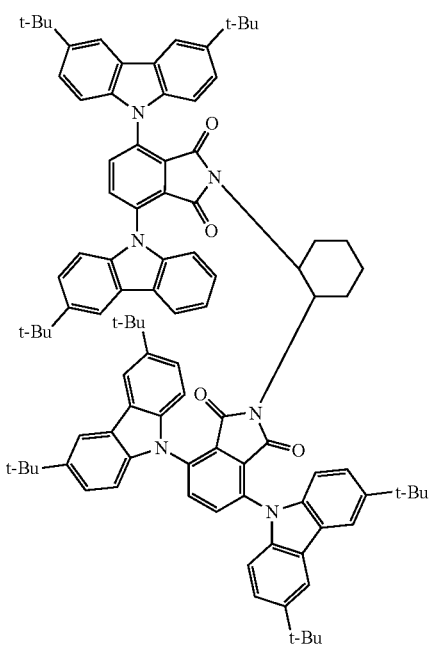
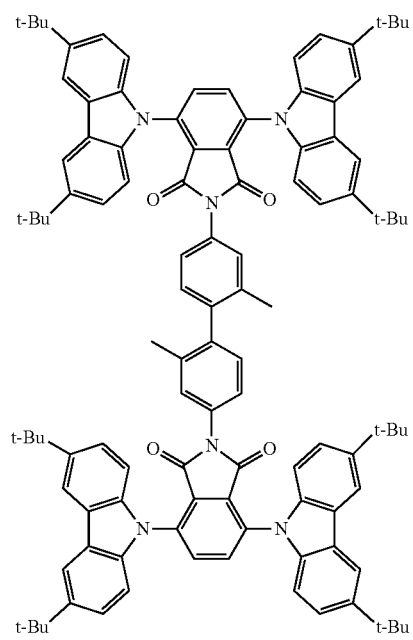
78
-continued
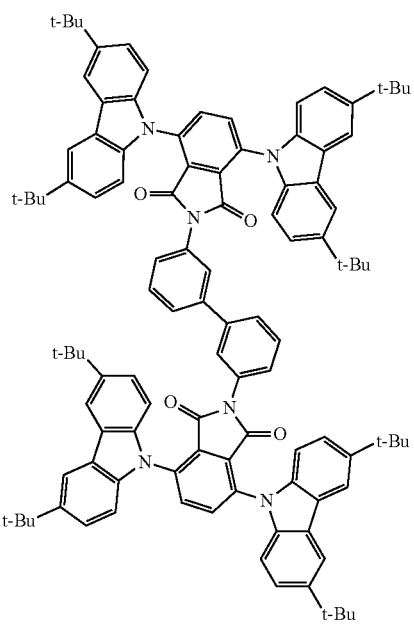
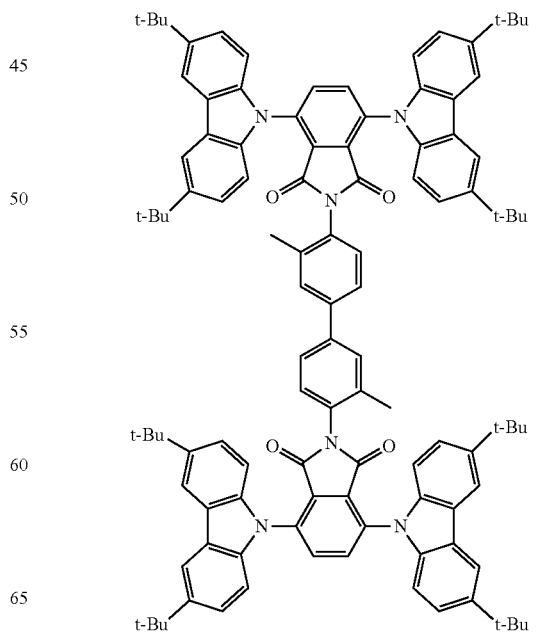

-continued
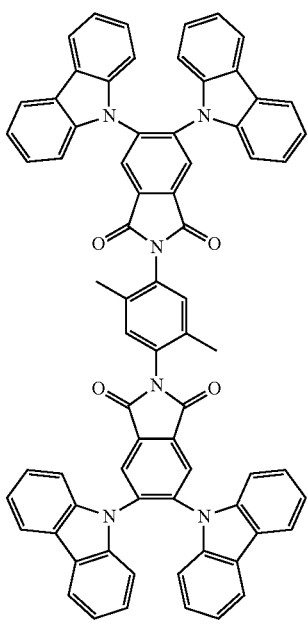
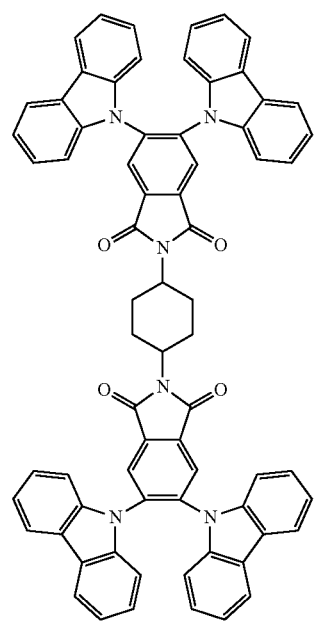
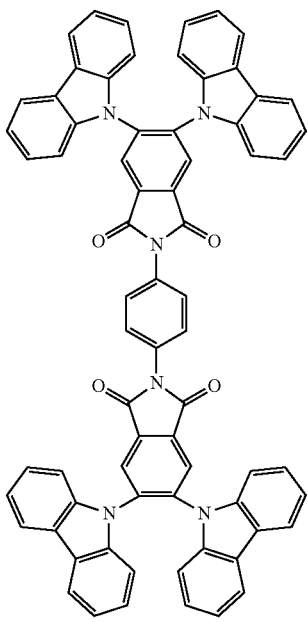
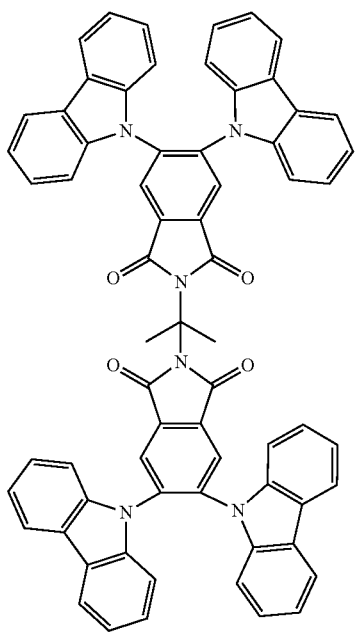

81
-continued
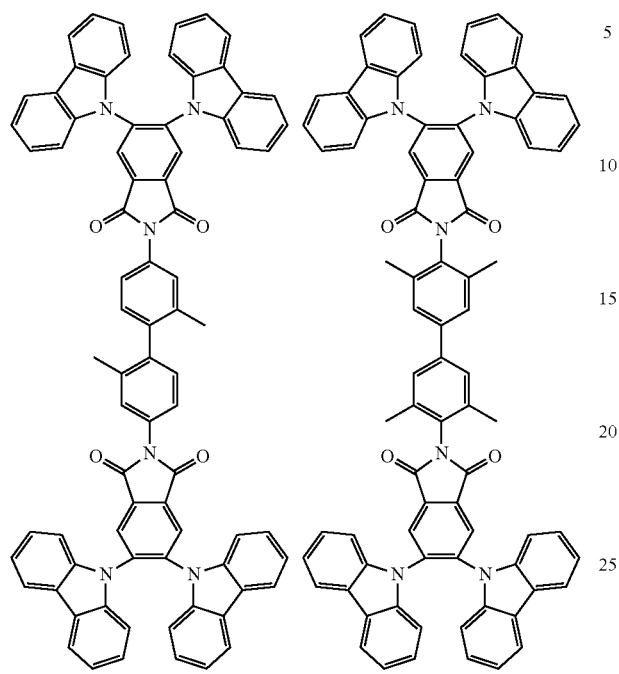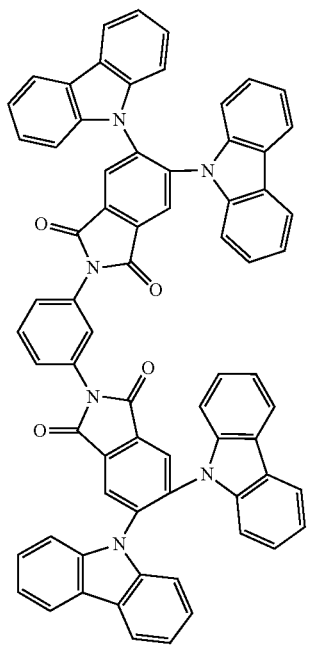
82
-continued
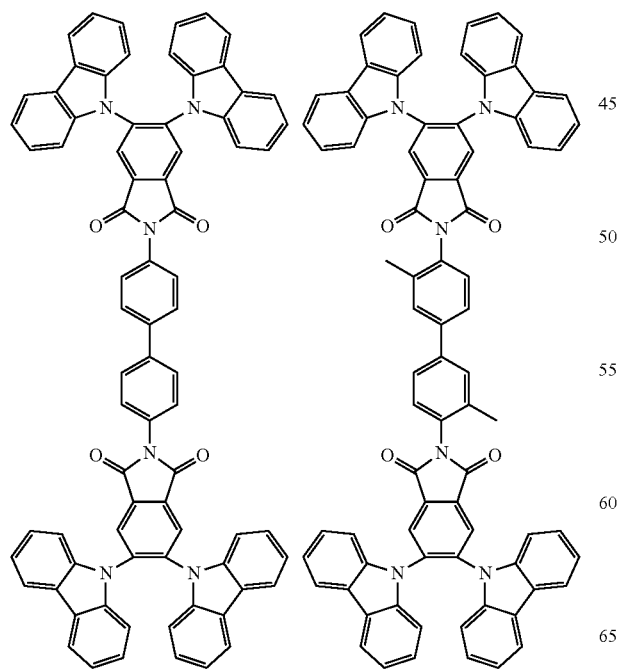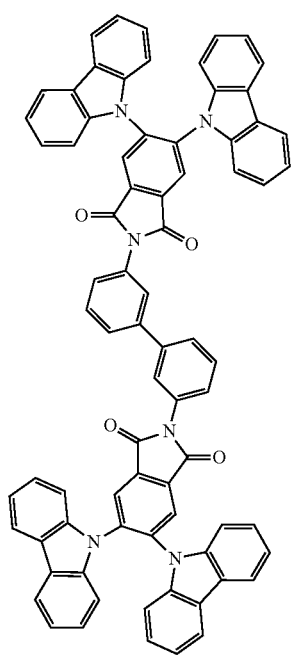

83
-continued
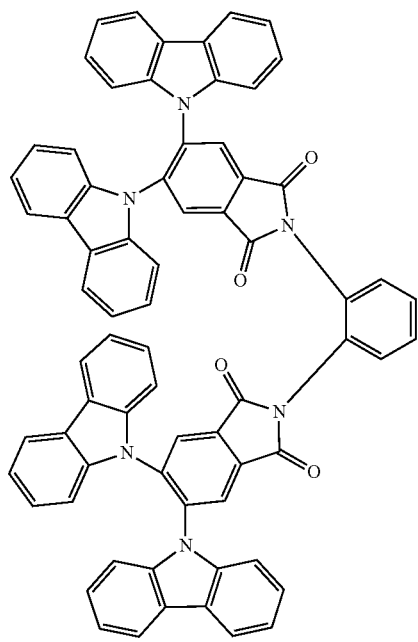
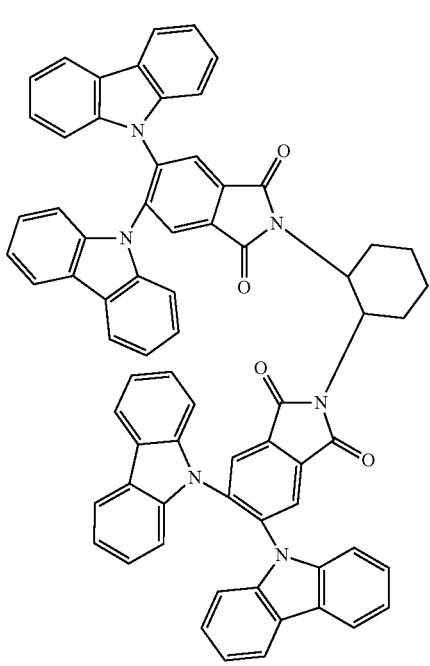
84
-continued
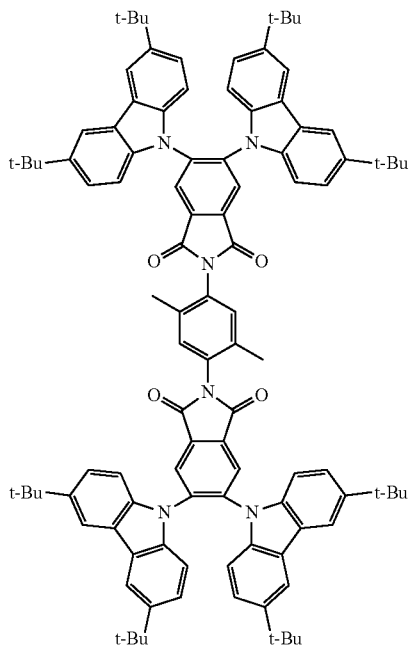
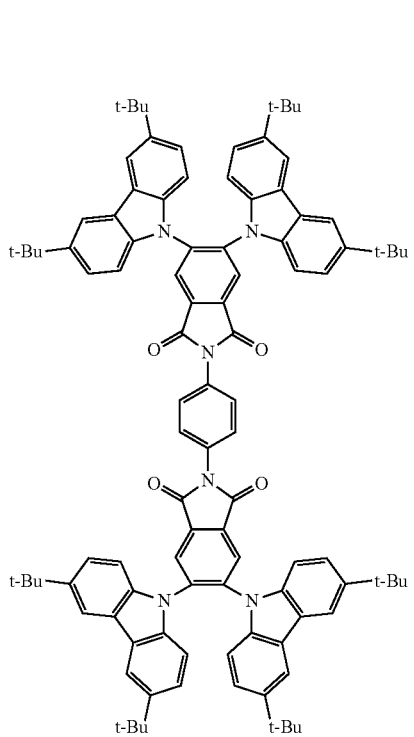

85
-continued
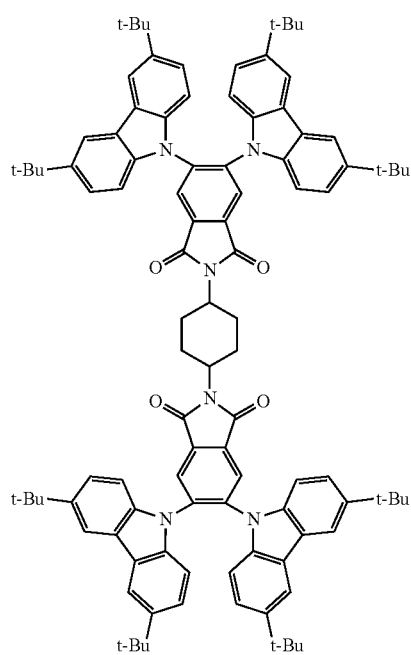
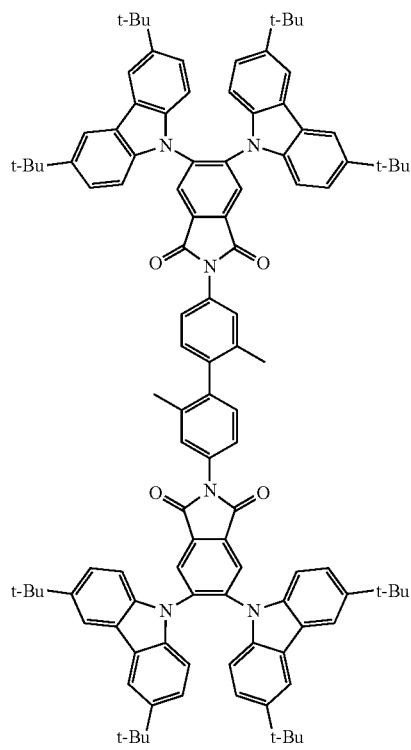
86
-continued
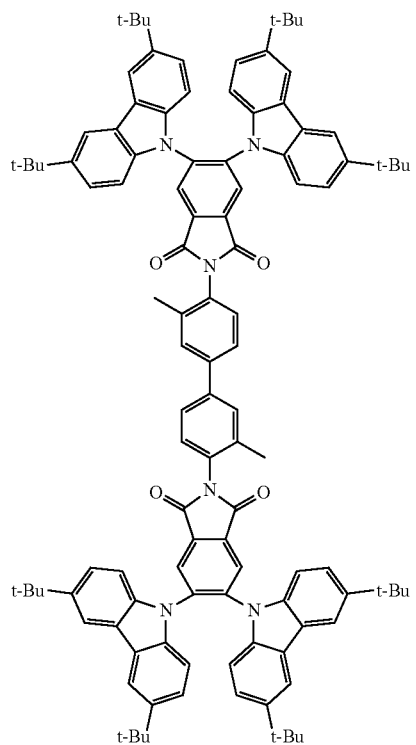
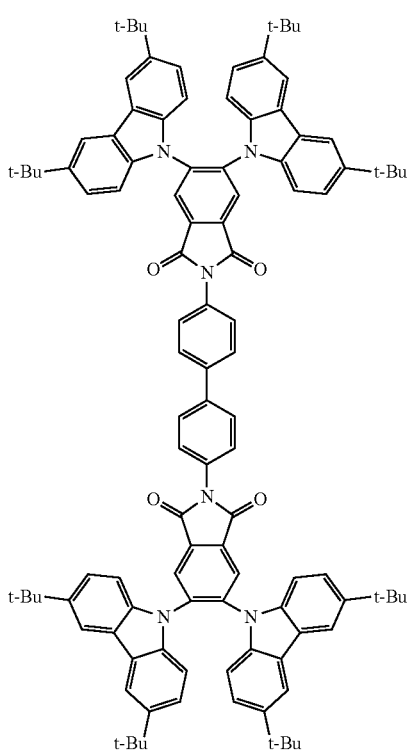

87
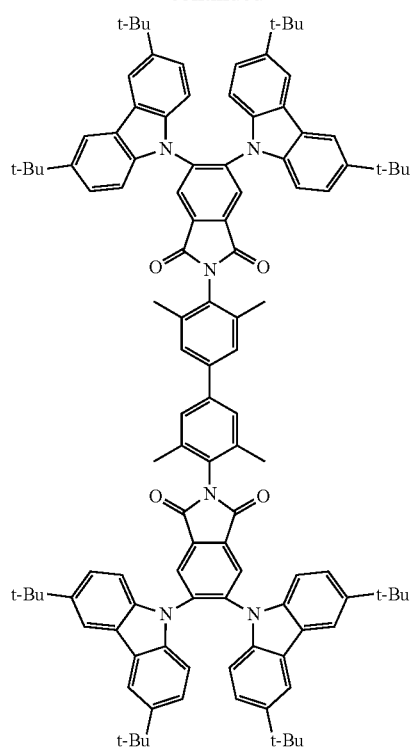
88
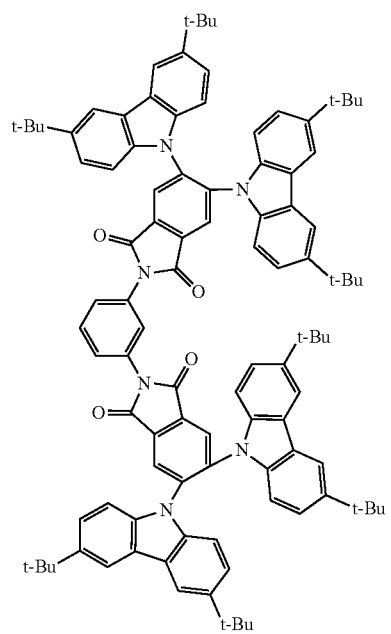
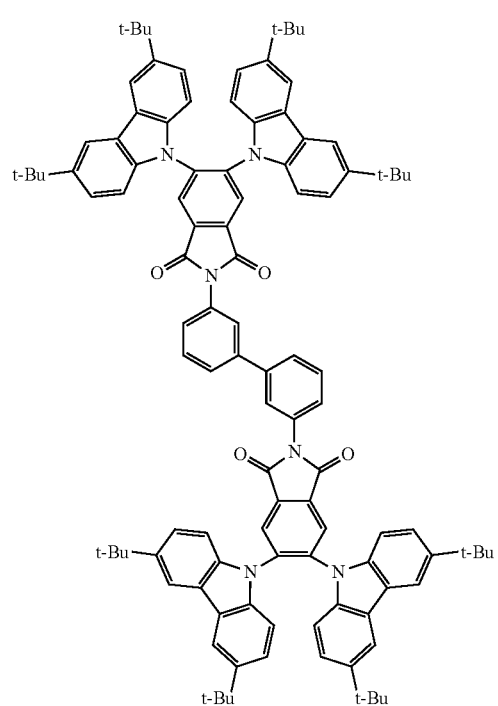
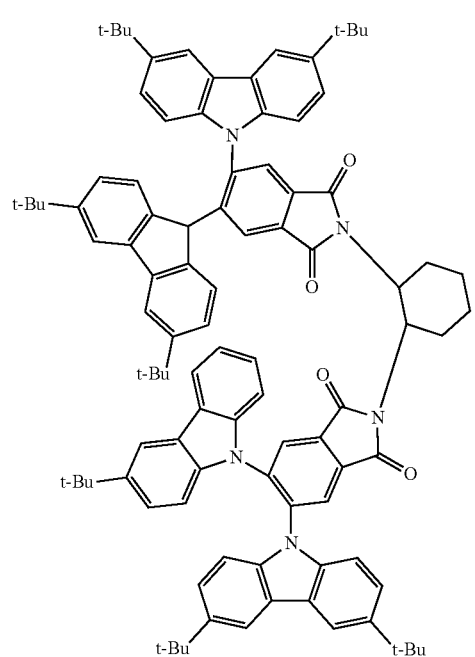

89
-continued
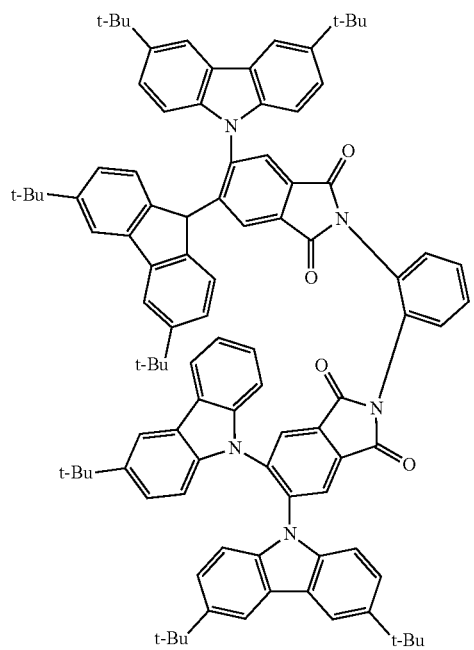
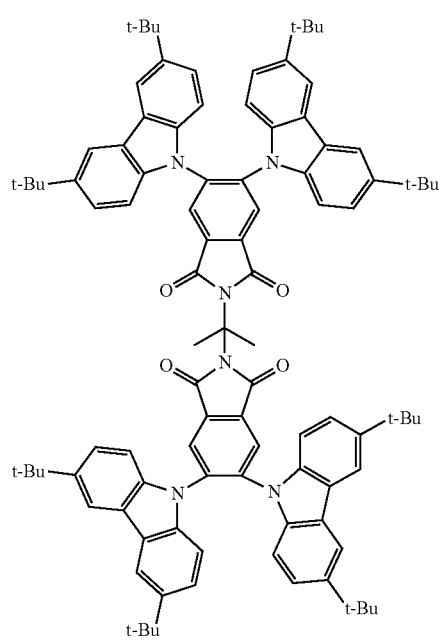
90
-continued
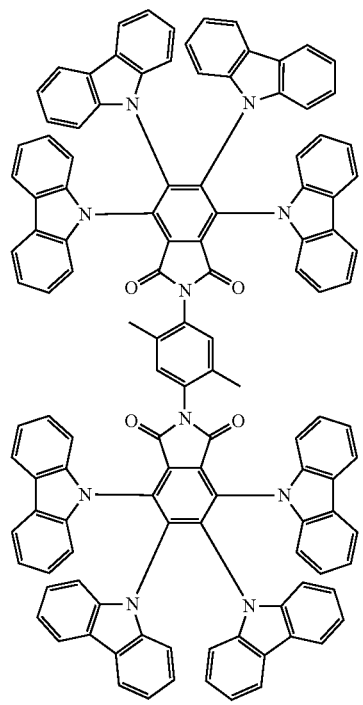
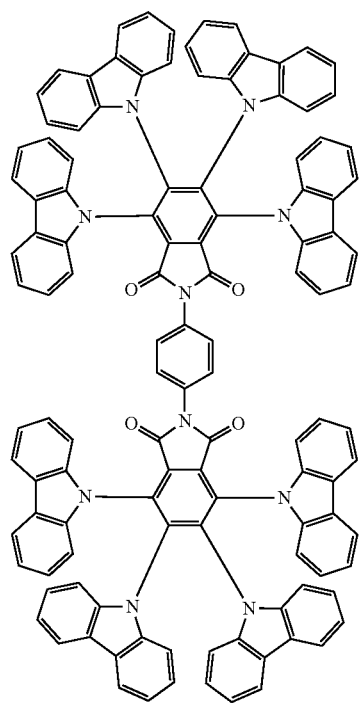

91
-continued
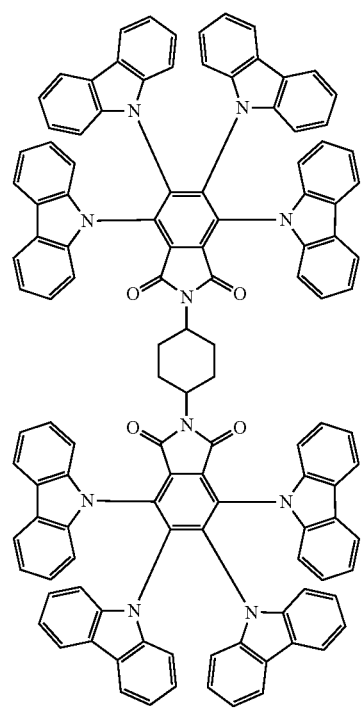
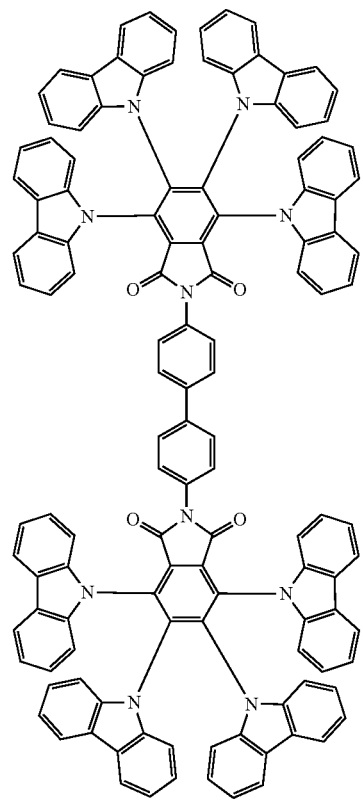
92
-continued
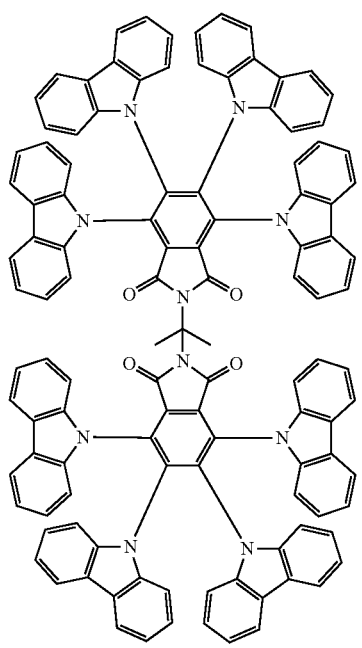
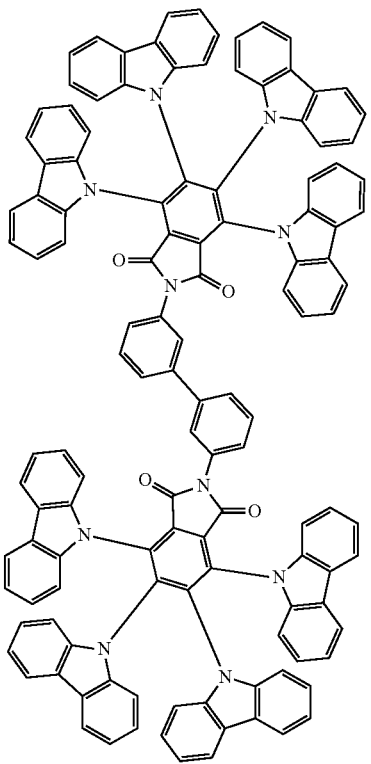

93
-continued
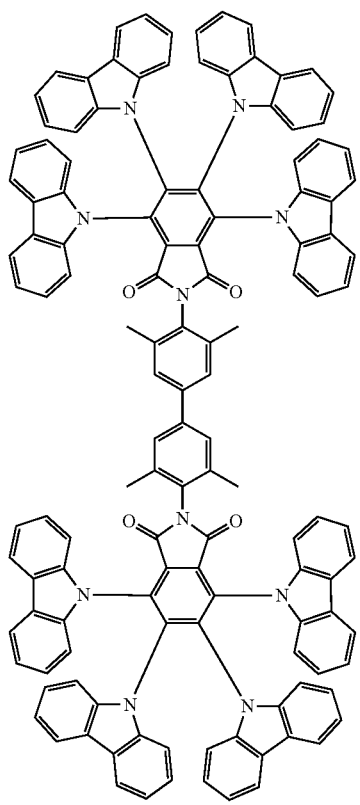
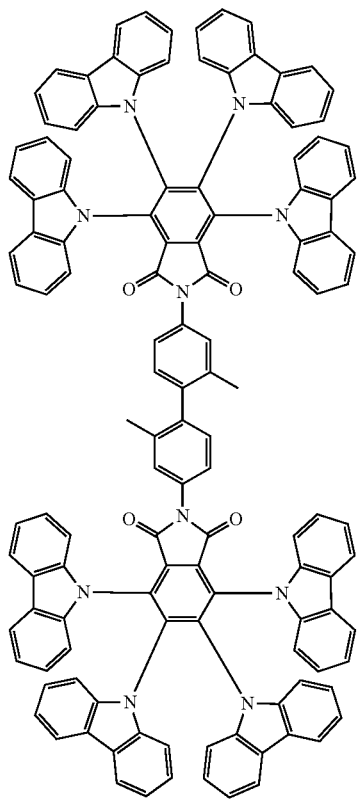
94
-continued
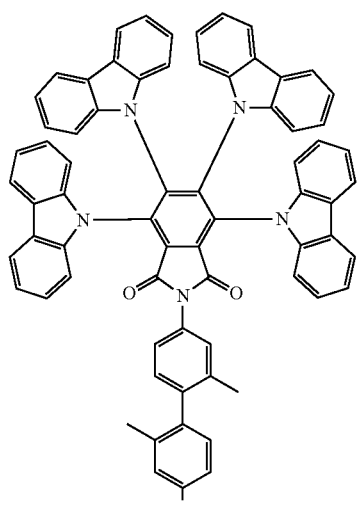
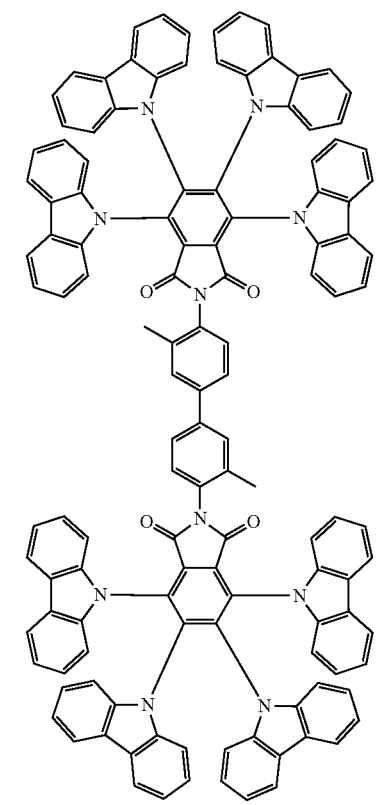

95
-continued
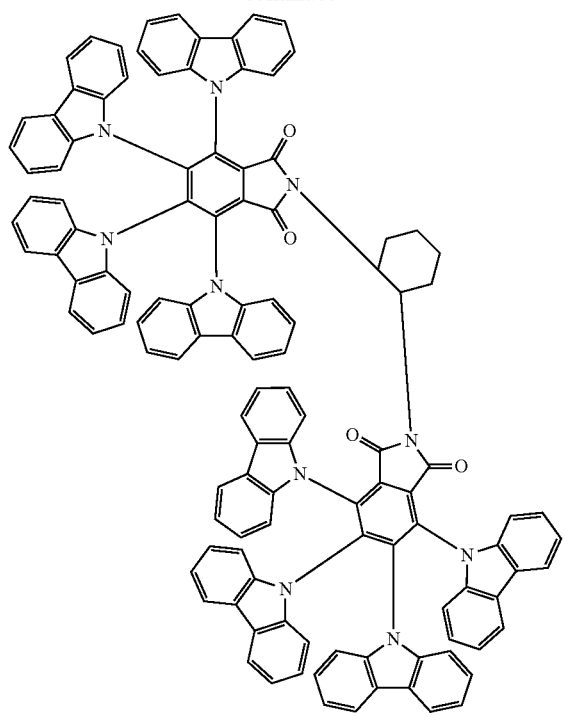
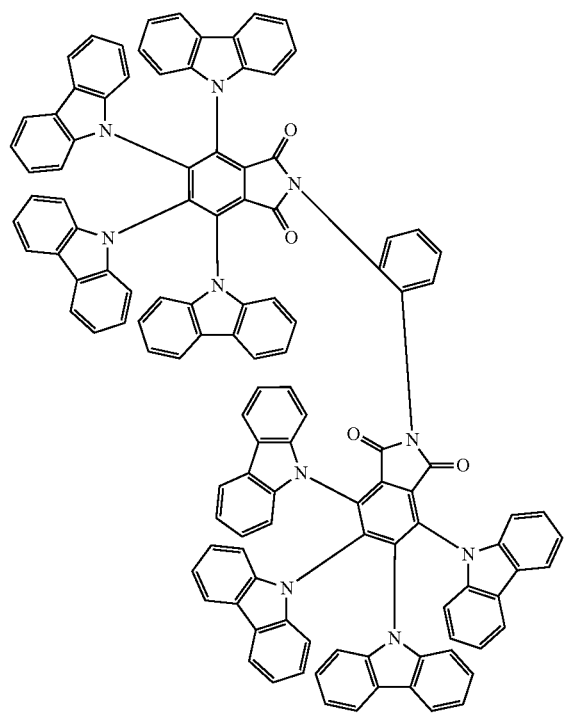 [SMILES: O=C1c2c(c(-n3c4ccccc4c4ccccc43)c(-n3c4ccccc4c4ccccc43)c(-n3c4ccccc4c4ccccc43)c2-n2c3ccccc3c3ccccc32)C(=O)N1c1ccccc1N1C(=O)c2c(c(-n3c4ccccc4c4ccccc43)c(-n3c4ccccc4c4ccccc43)c(-n3c4ccccc4c4ccccc43)c2-n2c3ccccc3c3ccccc32)C1=O]
96
-continued
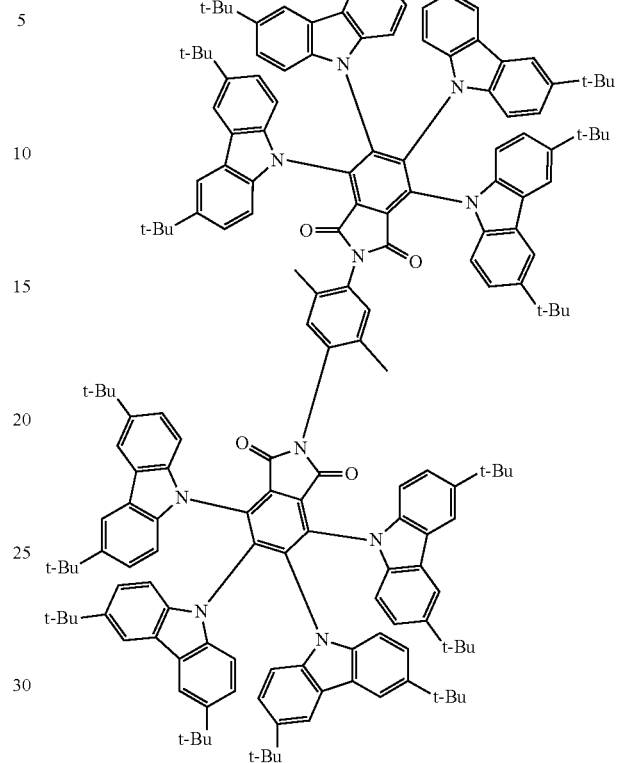
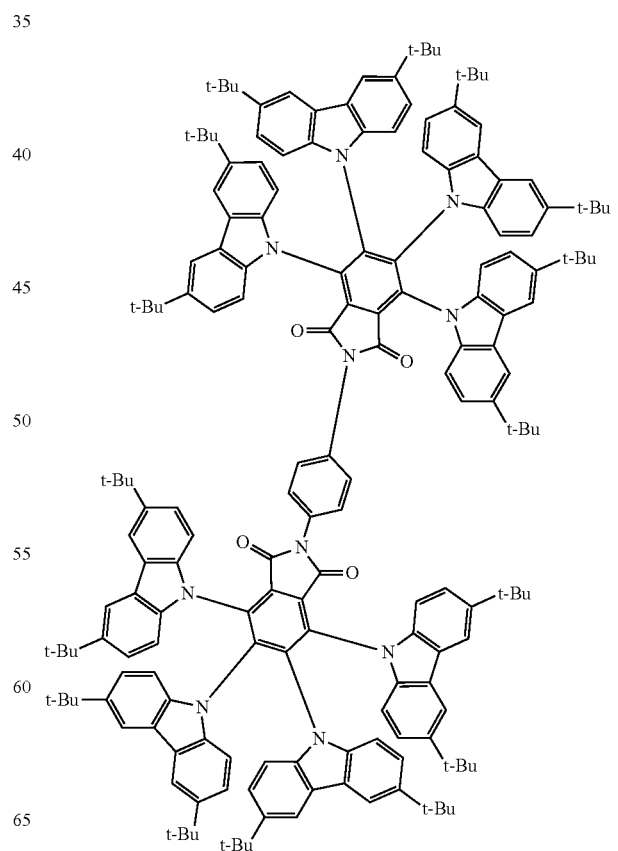

97
-continued
98
-continued
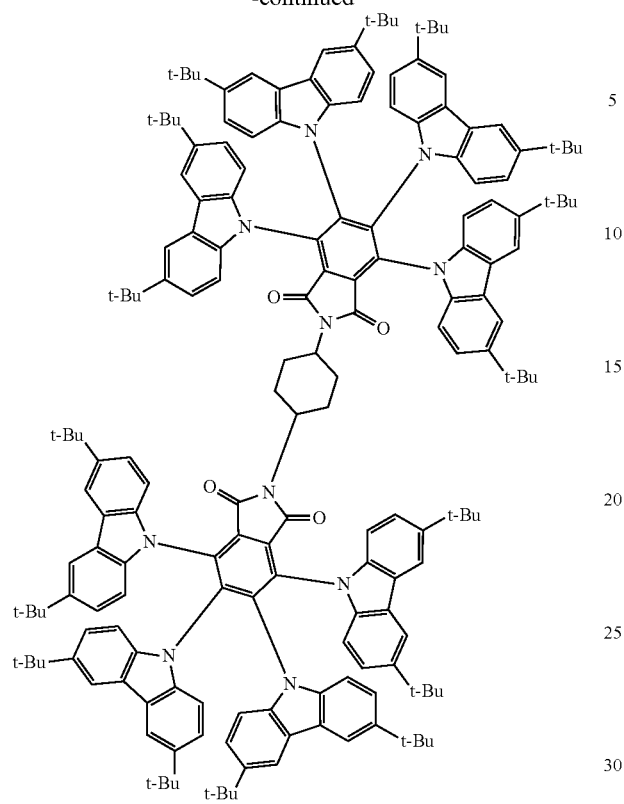
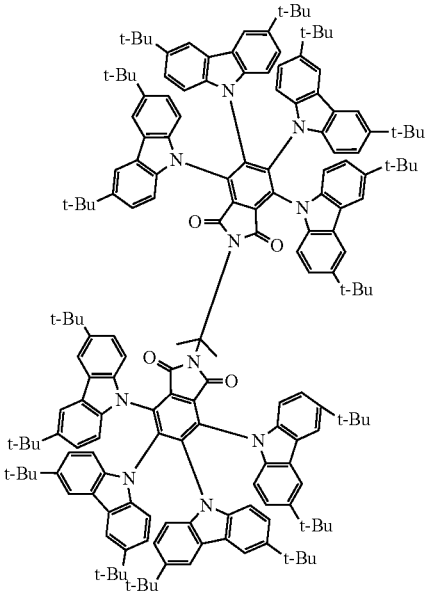

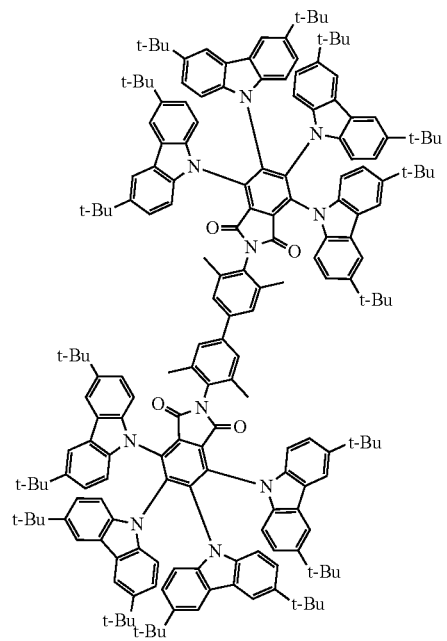
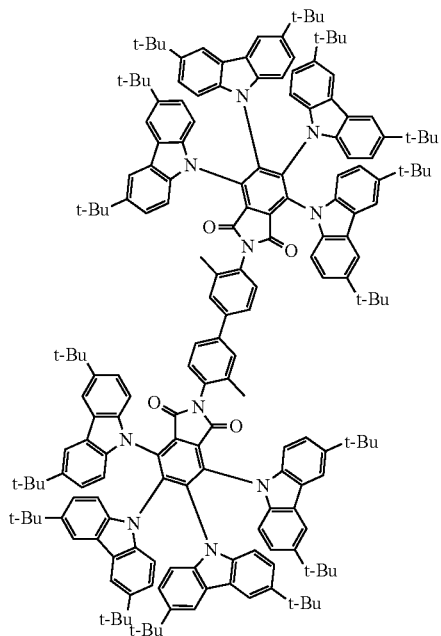
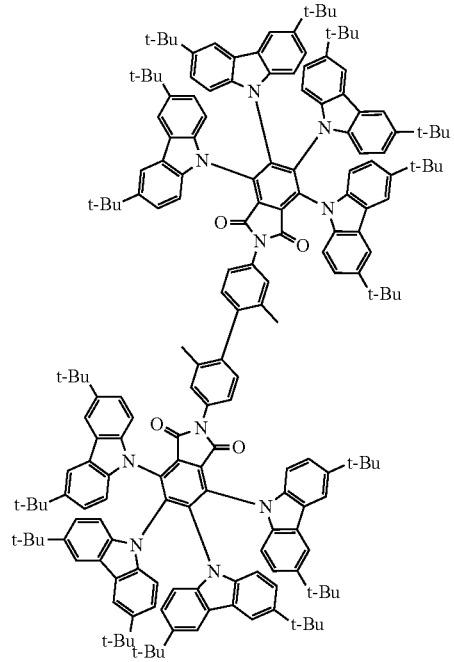
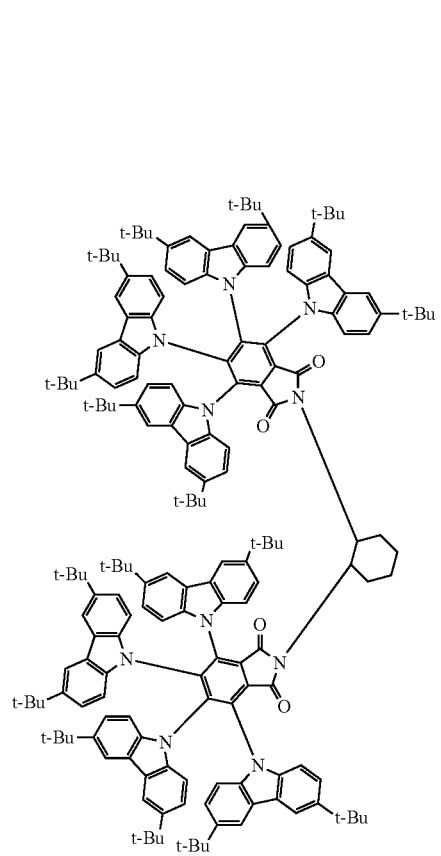

-continued
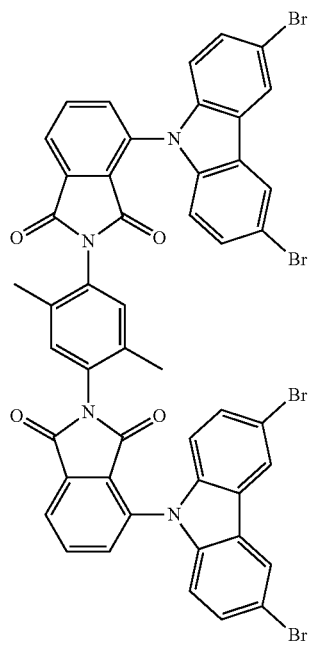
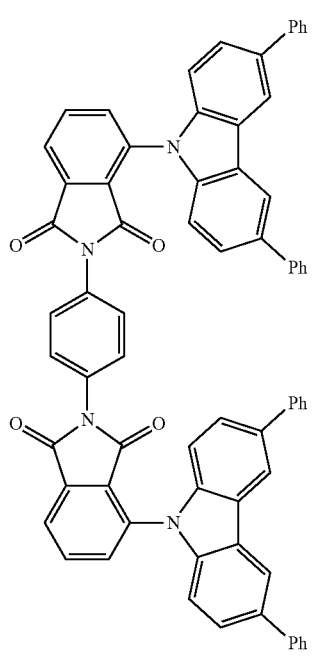
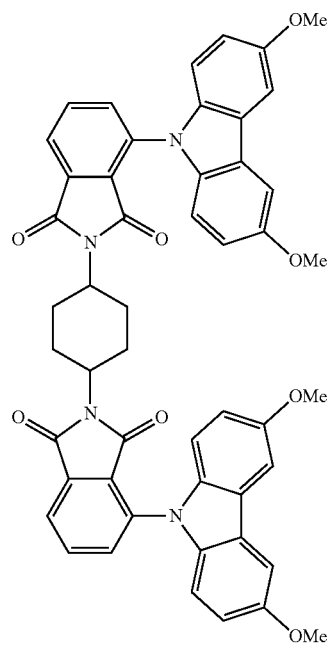
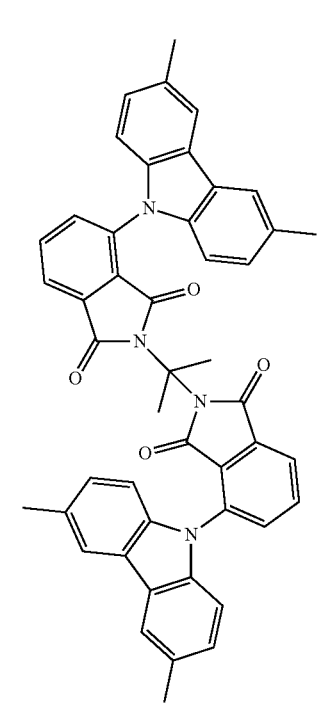

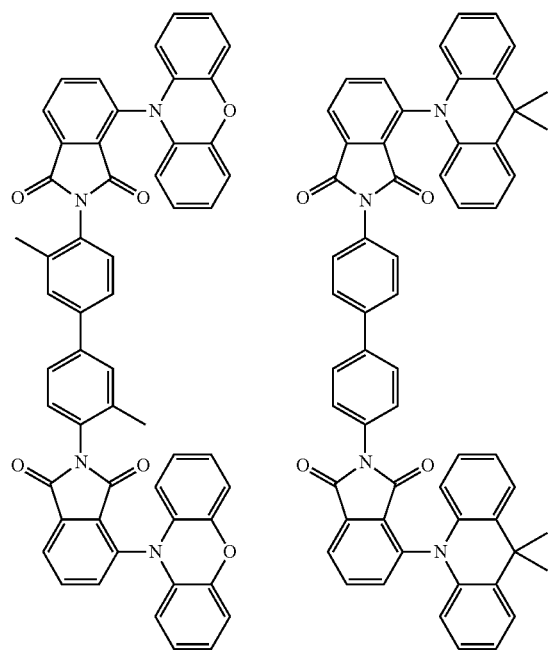
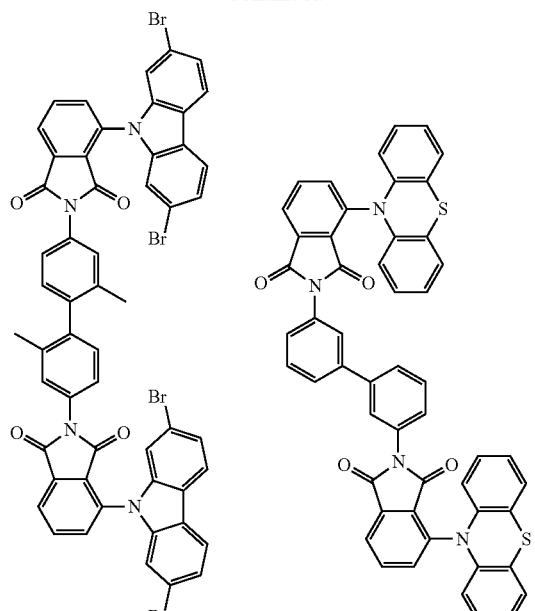
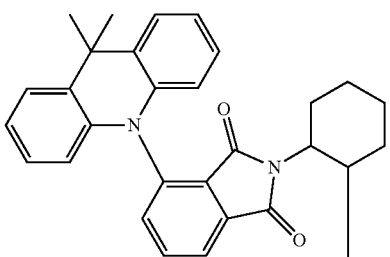
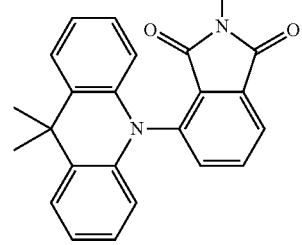
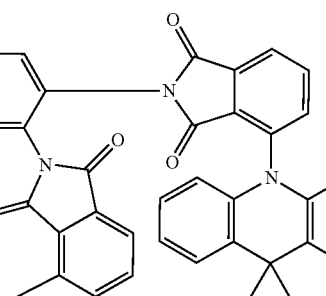
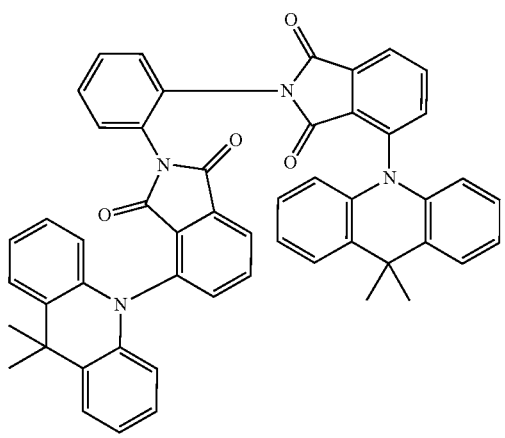

105
-continued
106
-continued
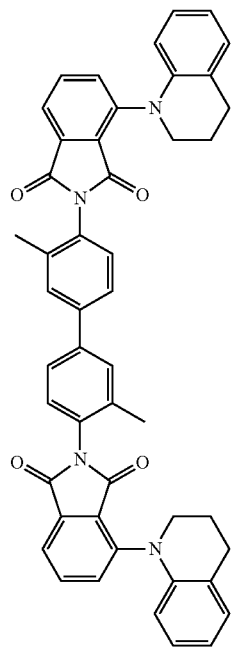
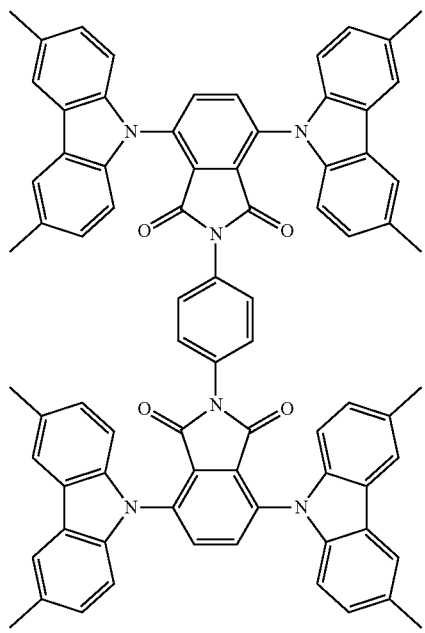
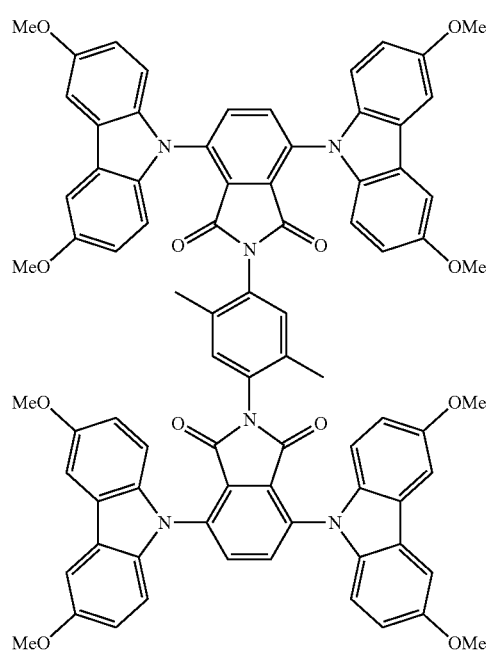
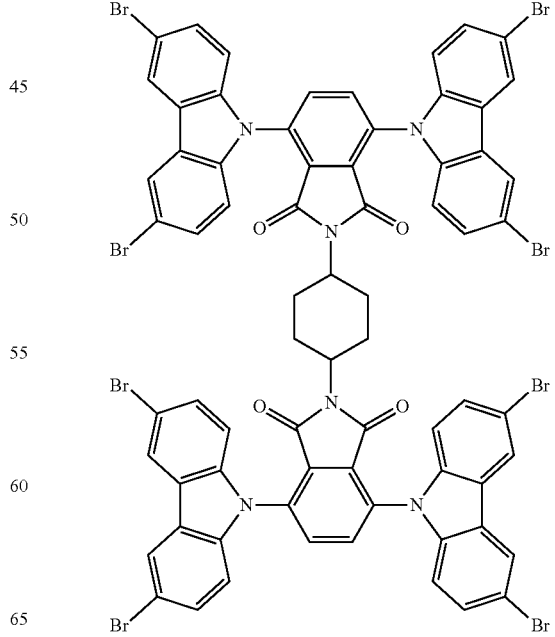

107
-continued
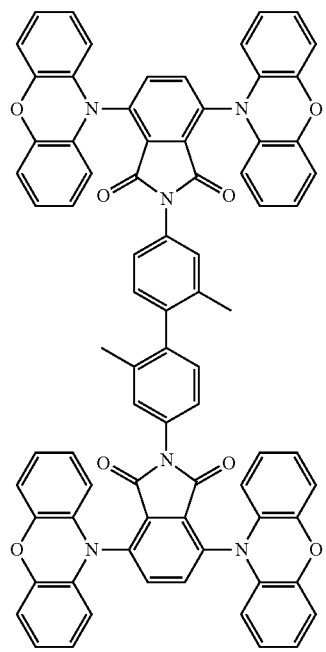
108
-continued
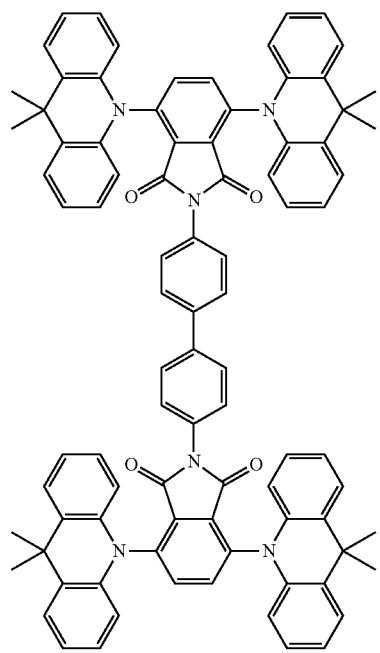
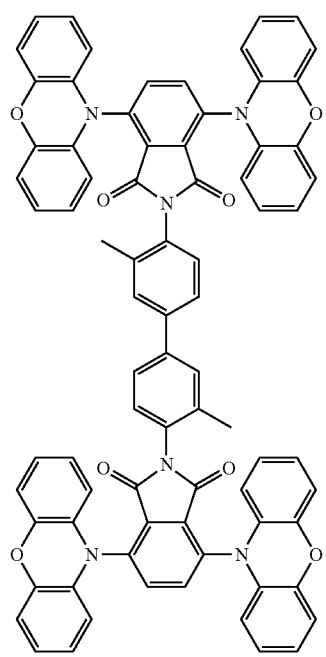
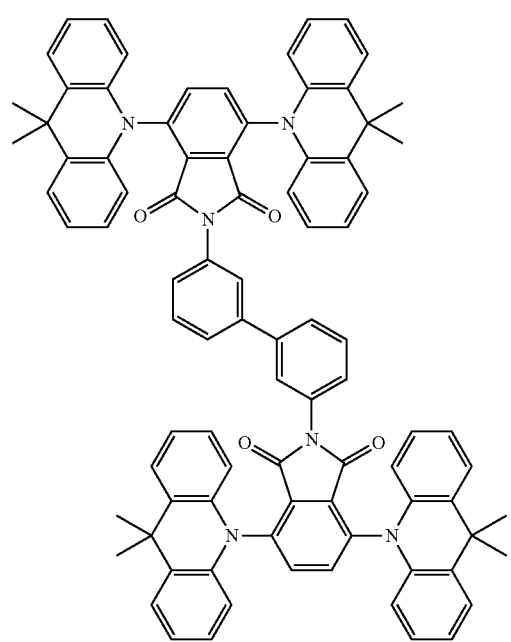

109
-continued
110
-continued
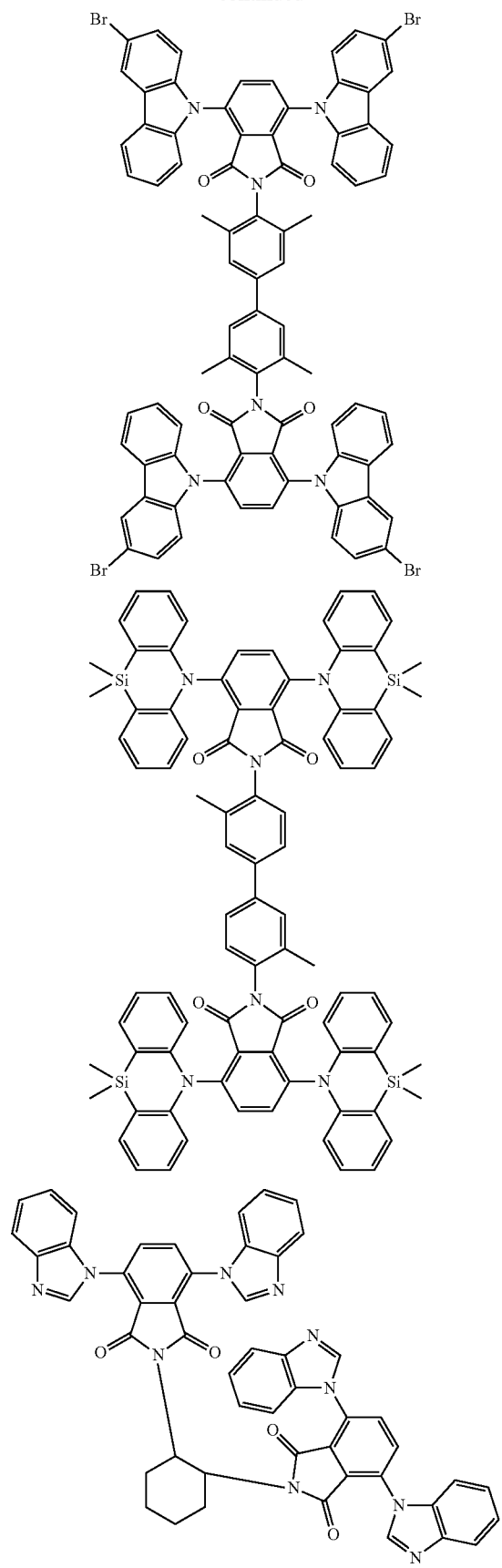

111
-continued
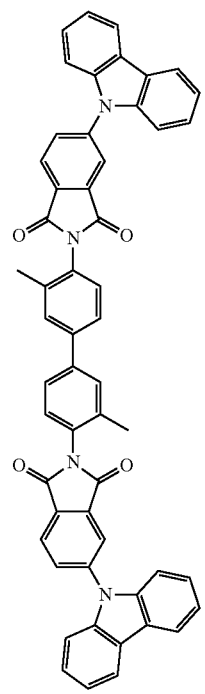
112
-continued
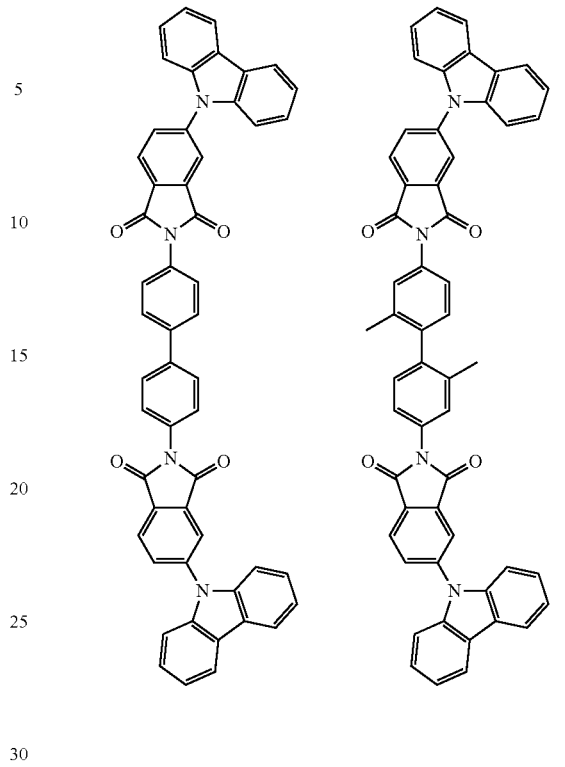
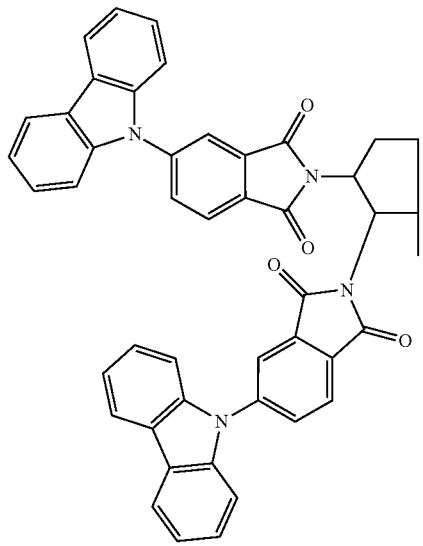
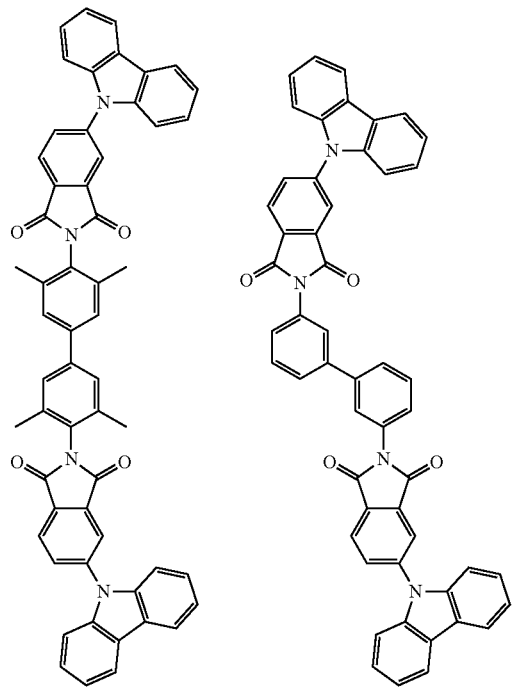

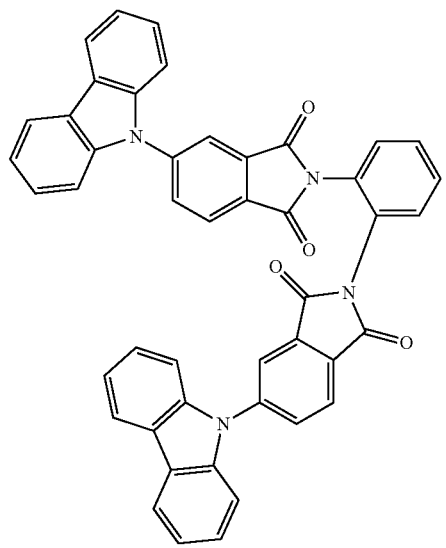
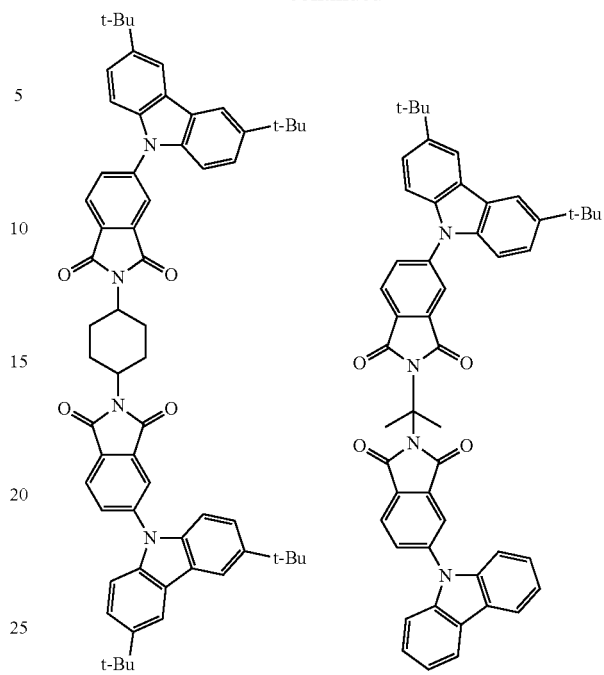
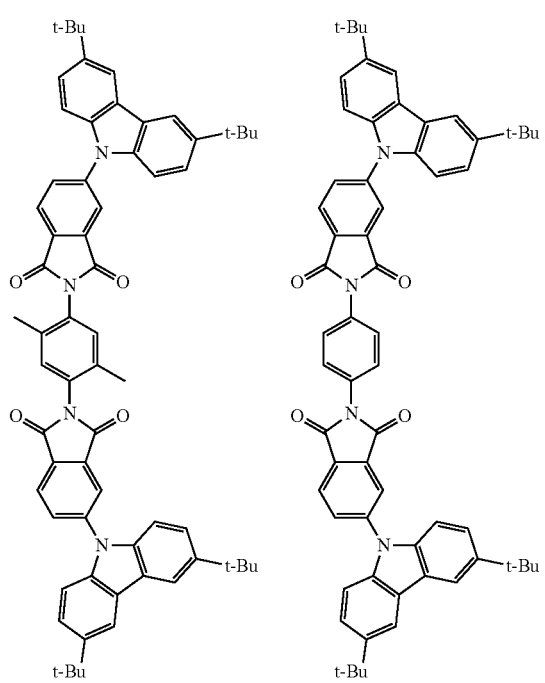
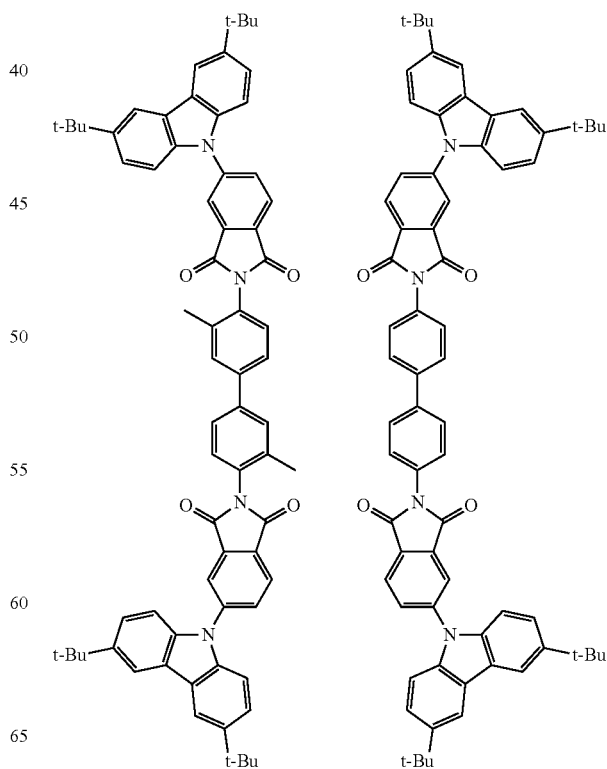

115
-continued
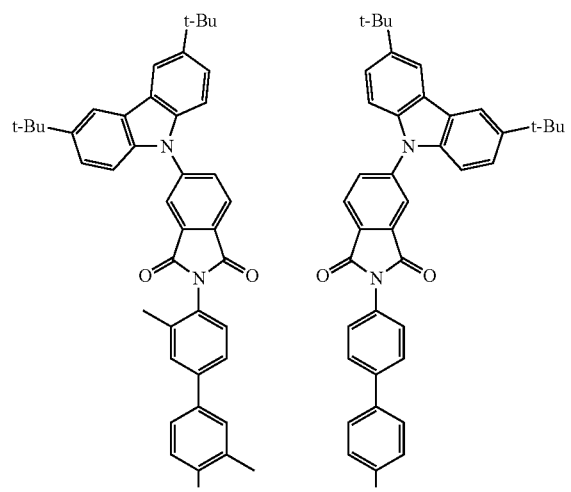
116
-continued
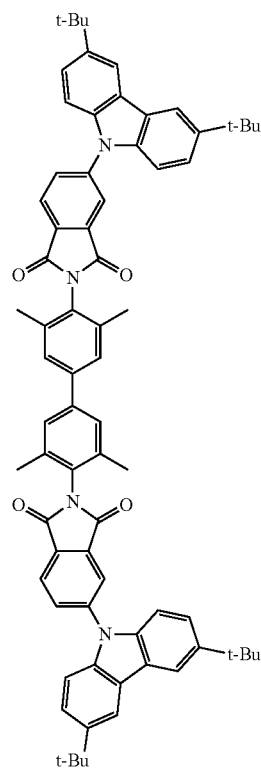
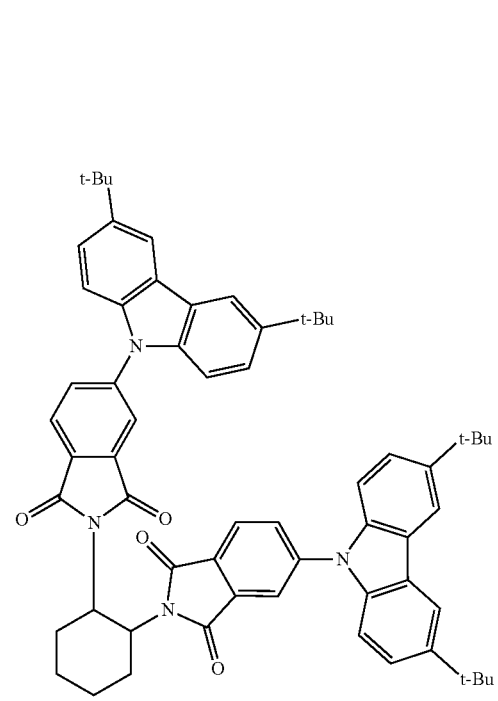

-continued

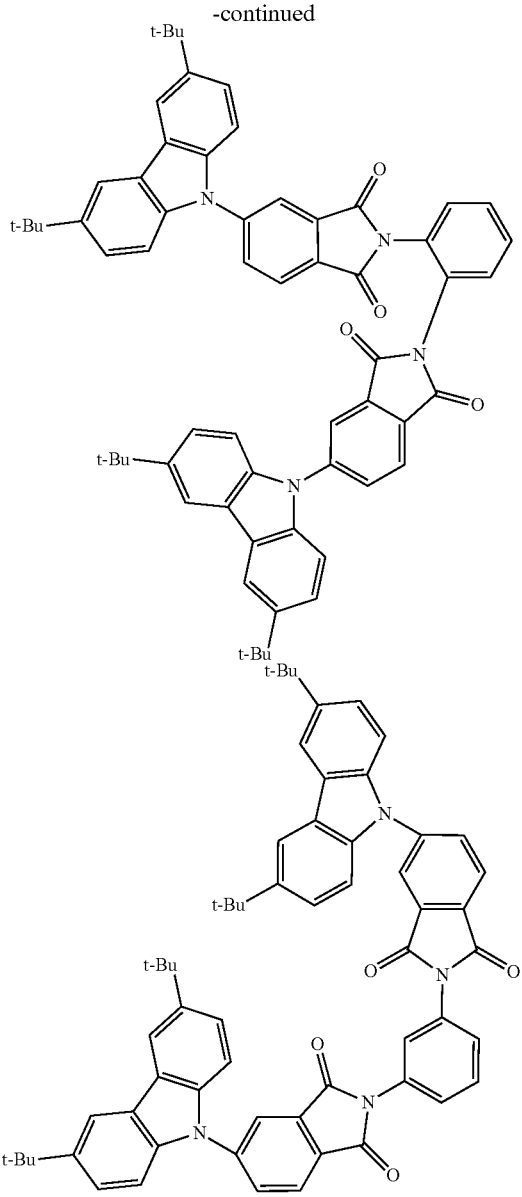

Preparation and Characterization of Organic Electroluminescent Devices from the Gas Phase OLED devices with the organic molecules 4 and 8 according to the invention as emitter substances were prepared by means of vacuum sublimation.

These un-optimized OLEDs were routinely characterized; for this purpose, the electroluminescence spectra, the external quantum efficiency (measured in %) depending on the brightness, calculated from the light detected by the photo diode, the electroluminescence spectra and the current were recorded.

Figure 39:
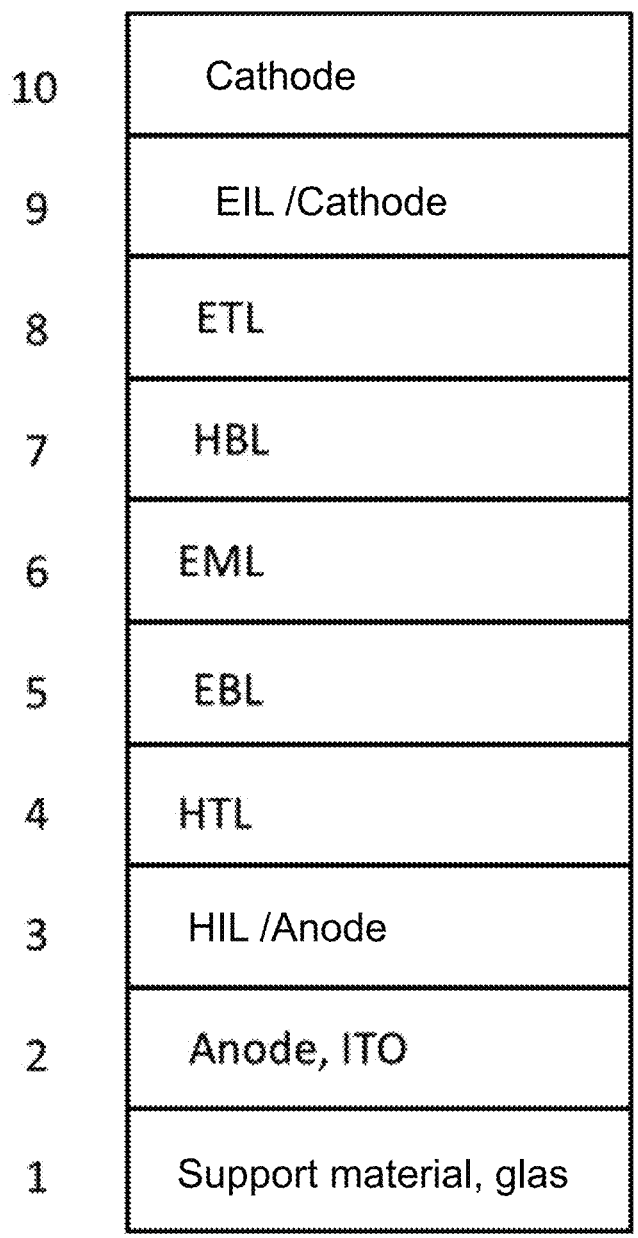
FIG. 39 is a schematic structure of an OLED device.

The meaning of the layers shown in FIG. 39 is as follows:
1. Glass or any other suitable solid or flexible transparent material can be used as support material.
2. Anode=ITO=indium-tin-oxide
3. HIL=hole injection layer=hole injection layer. For this purpose the commercially available PEDOT:PSS can be used for example. Typical layer thickness: 20-80 nm. Small molecules can also be used (e.g. copper phthalocyanine (CuPc e.g. 10 nm thick)) or metal oxides e.g. $MoO_3$, $V_2O_5$, etc.

HIL can also be regarded as anode.

4. HTL=hole transport layer=hole transport layer. This layer is as stated below optional but can be used for improving the propertied of the device. For this purpose for example [alpha]-NPD (N,N'-di(1-naphthyl)-N,N'-diphenyl-(1,1'-biphenyl)-4,4'-diamine), TAPC (4,4'-cyclohexylidene-bis[N,N-bis(4-methylphenyl) benzenamine]), TCTA (tris(4-carbazoyl-9-ylphenyl) amine), mCP (1,3-bis(N-carbazolyl)benzene) or TrisPCz (9,9'-diphenyl-6-(9-phenyl-9H-carbazole-3-yl)-9H,9'H-3,3'-bicarbazole) in a thickness of e.g. 20 nm can be deployed.

5. EBL=The electron blocking layer (optional) is supposed to ensure that the electron transport to the anode is suppressed since the charge carriers are hold in the emitter layer and the hole transport layer is not degraded by electrons (thickness e.g. 30 nm). Layer 4 and 5 can be a single material if the HTL comprises good properties as hole transport and electron transport layer.

6. EML=The emitter layer comprises or consists of the emitter material according to the invention. For sublimable materials according to the invention, this can be applied by sublimation. The layer thickness can be for example between 10 nm and 200 nm. For emitter materials according to the invention which emit in the green or red, the common matrix materials, such as CBP (4,4'-Bis-(N-carbazolyl)biphenyl) are suitable. For emitter materials according to the invention which emit in the blue, UGH matrix materials (see for example M. E. Thompson et al., Chem. Mater. 2004, 16, 4743) or other so-called wide-gap matrix materials can be employed.

7. HBL=Hole Blocking Layer=The hole blocking layer shall hold the charge carrier in the emitter layer (optional). This layer can be for example 10 nm thick. Suitable materials are for example BCP (4,7-diphenyl-2,9-dimethyl-phenanthroline=bathocuproin) or TSPO1 (diphenyl-4-triphenylsilylphenyl-phosphinoxide).

8. ETL=Electron Transport Layer=electron transport layer. For example, vapour-depositable Alq3 (aluminium-tris(8-hydroxyquinoline)) or TPBi (1,3,5-tris (1-phenyl-1H-benzimidazole-2-yl)benzene) can be used. Thickness is for example 25 nm. Layer 7 and 8 can be a single material if the ETL comprises good properties as electron transport and hole transport layer.

9. Cathode. This layer is generally applied by vapour deposition and is for example LiF, Ca, Mg, Ba. Where applicable the ETL and the CsF layer can be omitted. The layer thickness is between 0.5 and 30 nm.

10. Al or other stable metals (Cu, Ag, . . . ) are applied by vapour deposition to protect the reactive cathode. Al can also react with the lower layer (e.g. LiF/Al) (Xie, Z. T., Zhang, W. H., Ding, B. F., Gao, X. D., You, Y. T., Sun, Z. Y., . . . Hou, X. Y. (2009). Interfacial reactions at Al/LiF and LiF/Al. Applied Physics Letters, 94(6), 063302. doi:10.1063/1.3077167). Typical layer thickness is 100 nm.

The voltage applied to the device is for example 2.5 V to 15 V.

Prototypes of Vapor-Deposited Organic Emitters

The above mentioned emitters 4 and 8 were used.

TABLE 1

Device results. Tickness of TCTA between 15-35 nm, mCP between 15-35 nm, EML between 15-45 nm, TSPO1 between 15-35 nm, TPB between: 15-35 nm.

| OLED No. | Layer 1 | Layer 2 | Layer 3 | Layer 4 | Layer 5 | Layer 6 | Layer 7 | Layer 8 | Layer 9 |
|---|---|---|---|---|---|---|---|---|---|
| 1 | ITO | PEDOT:PSS | TCTA | mCP | Emitter 4 | TSPO1 | TPBi | LiF | Al |
| 2 | ITO | PEDOT:PSS | TCTA | mCP | Emitter 4:SiMCP2 20 wt. % | TSPO1 | TPBi | LiF | Al |
| 3 | ITO | PEDOT:PSS | TCTA | mCP | Emitter 8 | TSPO1 | TPBi | LiF | Al |
| 4 | ITO | PEDOT:PSS | TCTA | mCP | Emitter 8:SiMCP2 20 wt. % | TSPO1 | TPBi | LiF | Al |
| 5 | ITO | V2O5 | TCTA | mCP | Emitter 4 | TSPO1 | TPBi | LiF | Al |

TABLE 2

Continuation of table 1

| OLED No. | Wavelength (nm) | (CIE$_x$, CIE$_y$) | Light density (cd/m$^2$) | Performance efficiency (lm/W) | Current efficiency (cd/A) | EQE (%) |
|---|---|---|---|---|---|---|
| 1 | 515 | (0.32, 0.51) | 8570 | 7.9 | 25.2 | 8.5 |
| 2 | 498 | (0.26, 0.45) | 3200 | 4.7 | 12 | 4.3 |
| 3 | 530 | (0.35, 0.52) | 8900 | 3.8 | 10.7 | 3.4 |
| 4 | 510/515 | (0.30, 0.49) | 3440 | 5.0 | 14.2 | 4.8 |
| 5 | 507 | (0.28, 0.48) | 3750 | 8.2 | 26.3 | 9.3 |

TABLE 3

Device results.

| OLED No. | Layer 1 | Layer 2 | Layer 3 | Layer 4 | Layer 5 | Layer 6 | Layer 7 | Layer 8 |
|---|---|---|---|---|---|---|---|---|
| 6 | ITO | HAT-CN | Tris-Pcz | Emitter 4:mCBP | T2T | BpyTP2 | Liq | Al |
| 7 | ITO | HAT-CN | Tris-Pcz | 4:mCBP | T2T | BPyTP2 | LiF | Al |
| 8 | ITO | HAT-CN | Tris-Pcz | Emitter 8:mCBP | T2T | BpyTP2 | Liq | Al |

TABLE 4

Continuation of Table 3

| OLED No. | Wavelength (nm) | (CIE$_x$, CIE$_y$) | Light density (cd/m$^2$) | Performance efficiency (lm/W) | Current efficiency (cd/A) | EQE (%) |
|---|---|---|---|---|---|---|
| 6 | 512 | (0.29, 0.49) | 24066 | 10.8 | 29.7 | 9.9 |
| 7 | 502 | (0.26, 0.47) | 21951 | 21.7 | 28.8 | 10 |
| 8 | 524 | (0.33, 0.52) | 23962 | 11.6 | 22.5 | 7.5 |

Figure 35:
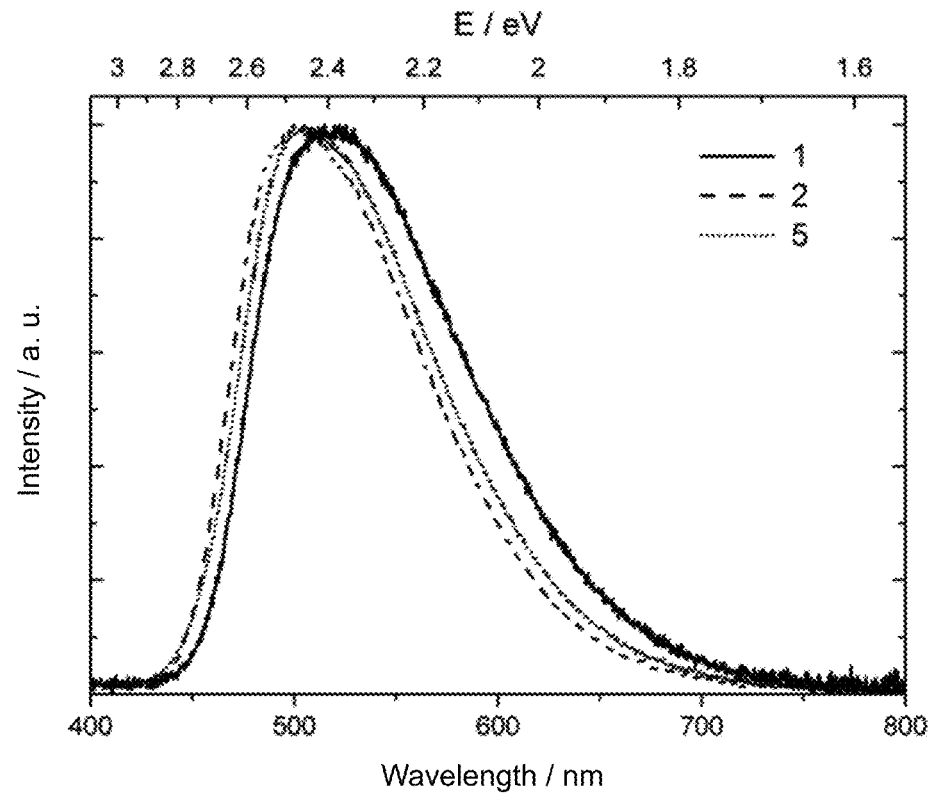
FIG. 35 is an electroluminescence spectrum for product 4, wherein the numbering refers to the OLED devices of tables 1 and 2.
Figure 36:
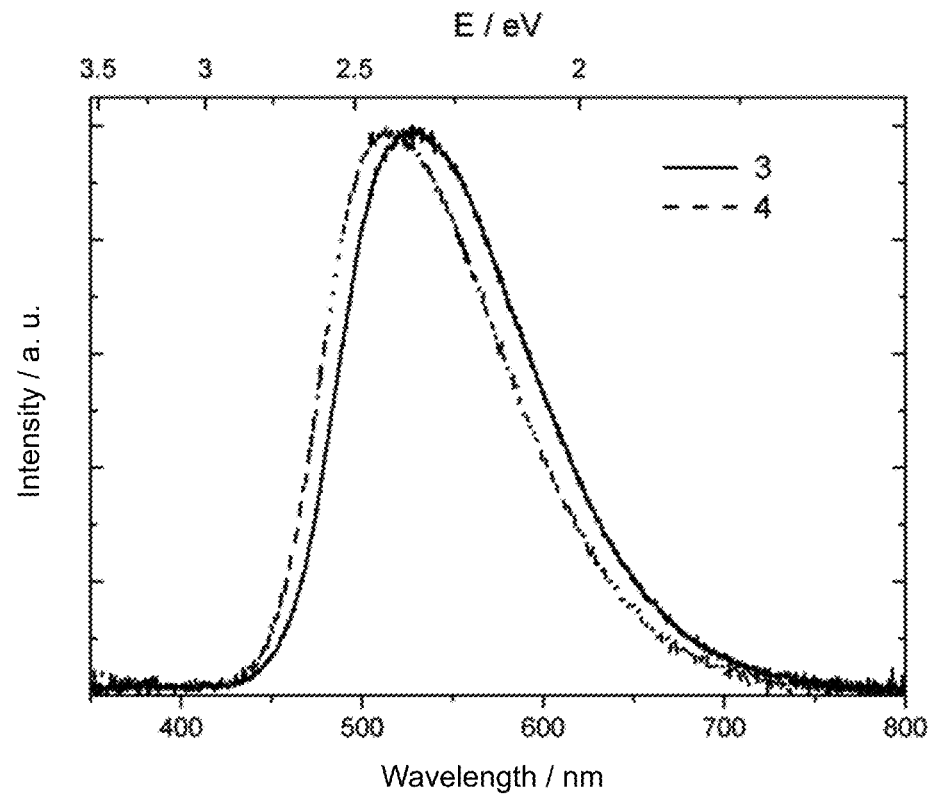
FIG. 36 is an electroluminescence spectrum for product 8, wherein the numbering refers to the OLED devices of tables 1 and 2.

The electroluminescence spectra of the above shown devices are shown in FIGS. 35 and 36.

FIGURES

FIG. 1: Absorption spectrum of 2 in dichloromethane.
FIG. 2: Film emission of 2 (10% in PMMA).
FIG. 3: Absorption spectrum of 3 in Dichloromethane.
FIG. 4: Film emission of 3 (10% in PMMA).
FIG. 5: Absorption spectrum of 4 in dichloromethane.
FIG. 6: Film emission of 4 (10% in PMMA).
FIG. 7: Absorption spectrum of 5 in dichloromethane.
FIG. 8: Film emission of 5 (10% in PMMA).
FIG. 9: Absorption spectrum of 6 in dichloromethane.
FIG. 10: Film emission of 6 (10% in PMMA).
FIG. 11: Absorptionsspektrum von 7 in dichloromethane.
FIG. 12: Film emission of 7 (10% in PMMA).
FIG. 13: Absorption spectrum of 8 in dichloromethane.
FIG. 14: Film emission of 8 (10% in PMMA).
FIG. 15: Absorption spectrum of 9 in dichloromethane.
FIG. 16: Film emission of 9 (10% in PMMA).
FIG. 17: Absorption spectrum of 10 in dichloromethane.
FIG. 18: Film emission von 10 (10% in PMMA).
FIG. 19: Absorption spectrum of 11 in dichloromethane.
FIG. 20: Film emission of 11 (10% in PMMA).
FIG. 21: Absorption spectrum of 12 in dichloromethane.
FIG. 22: Film emission of 12 (10% in PMMA).
FIG. 23: Absorption spectrum of 13 in dichloromethane.
FIG. 24: Film emission of 13 (10% in PMMA).
FIG. 25: Absorption spectrum of 14 in dichloromethane.
FIG. 26: Film emission of 14 (10% in PMMA).
FIG. 27: Absorptionsspektrum von 15 in dichloromethane.
FIG. 28: Film emission of 15 (10% in PMMA).
FIG. 29: Absorption spectrum of 16 in dichloromethane.
FIG. 30: Absorption spectrum of 16 (10% in PMMA).
FIG. 31: Absorption spectrum of 19 in 2-methyltetrahydrofuran.

Figure 37:
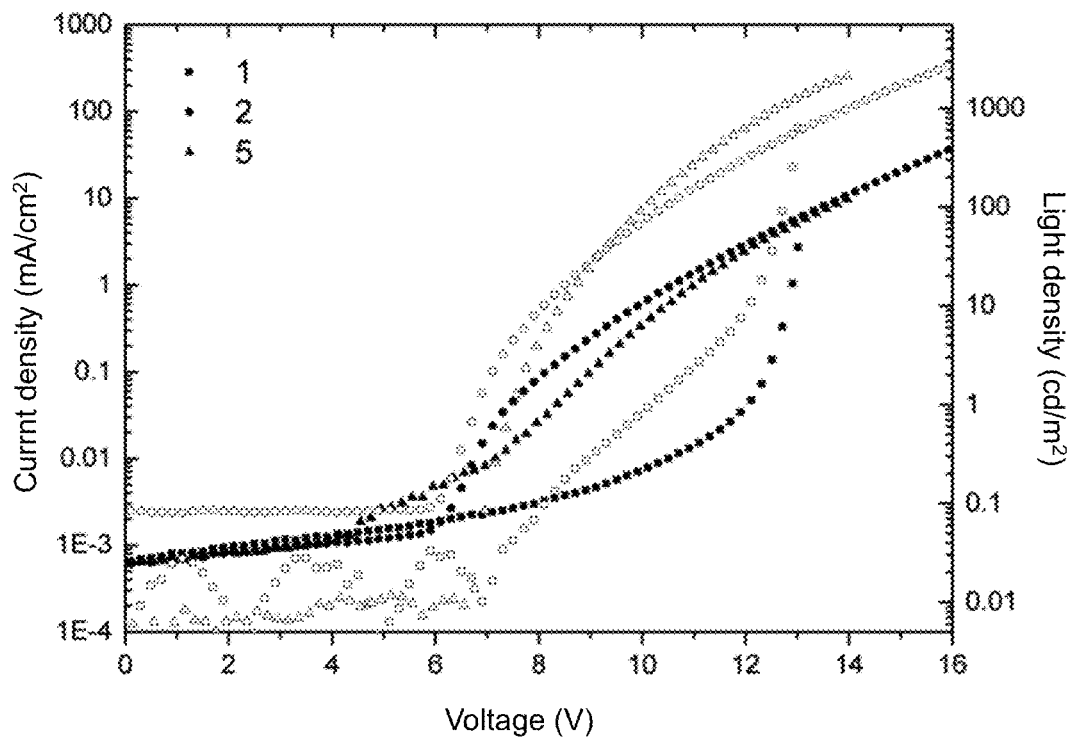
FIG. 37 is a U-I-characteristic curve (filled symbols) and brightness as a function of the voltage (empty symbols) for products 4 and 8, wherein the numbering refers to the OLED devices of tables 1 and 2.
Figure 38:
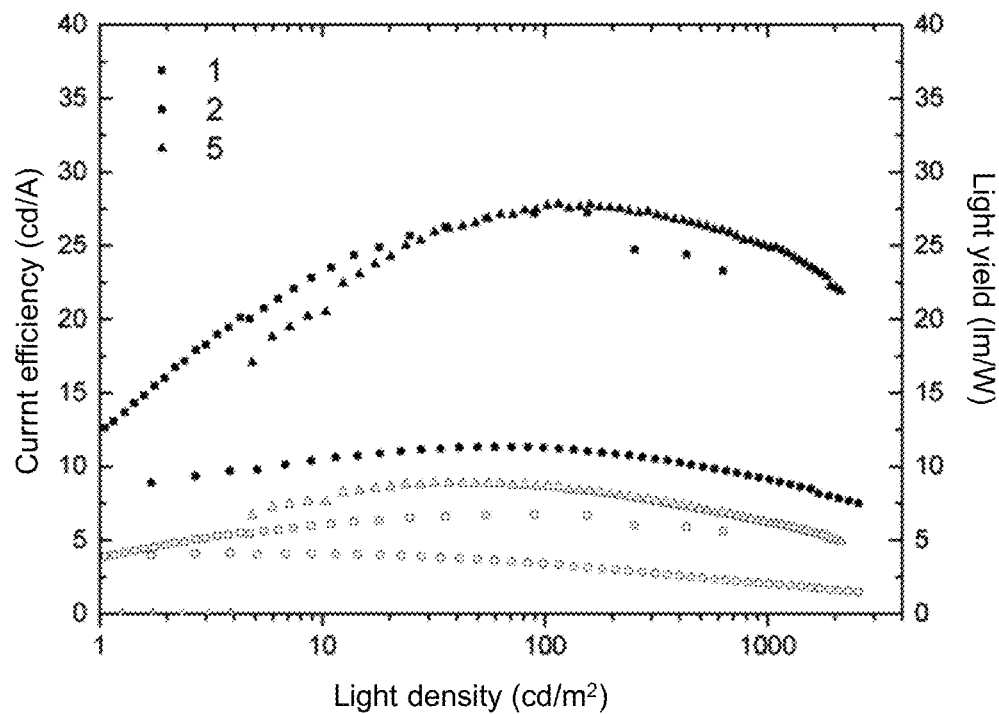
FIG. 38 is a current efficiency (filled symbols) and performance efficiency (empty symbols) for products 4 and 8, plotted against the light density, wherein the numbering refers to the OLED devices of tables 1 and 2.
Figure 40:
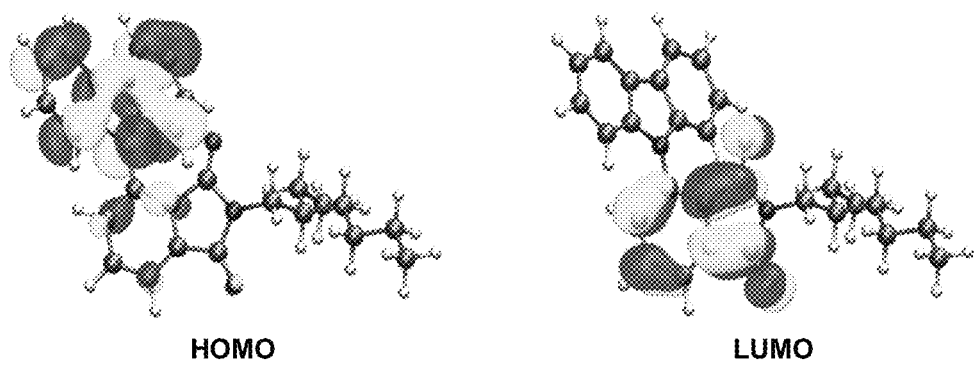
FIG. 40 is a HOMO and LUMO of product 3, calculation method: DFT, functional: BP86, base set: def2-SV(P), calculation software: Turbomole 6.5.

FIG. 32: Film emission of 19 (10% in PMMA).
FIG. 33: Film emission of 21 (10% in PMMA).
FIG. 34: Film emission of 22 (10% in PMMA).
FIG. 35: Elektroluminescence spectrum for 4, wherein the numbering refers to the OLED devices of tables 1 and 2.
FIG. 36: Elektroluminescence spectrum for 8, wherein the numbering refers to the OLED devices of tables 1 and 2.
FIG. 37: U-I-characteristic curve (filled symbols) and brightness as a function of the voltage (empty symbols) for 4 and 8, wherein the numbering refers to the OLED devices of tables 1 and 2.
FIG. 38: Current efficiency (filled symbols) and performance efficiency (empty symbols) for 4 and 8, plotted against the light density, wherein the numbering refers to the OLED devices of tables 1 and 2.
FIG. 39: Schematic structure of an OLED device.
FIG. 40: HOMO and LUMO of 3, calculation method: DFT, functional: BP86, base set: def2-SV(P), calculation software: Turbomole 6.5. A structure optimization for the electronic ground state was carried out.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:
1. An organic molecule comprising a structure of formula D:

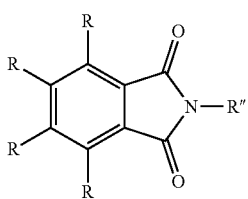

Formula D wherein
R" is R or an organic bridge via which a second same or different unit of formula D is bound forming a dimeric system and wherein at least one R at the aryl ring is a donor group comprising a structure of formula I

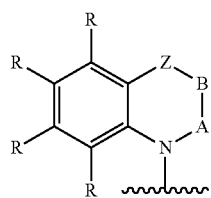

Formula I wherein
A and B are independently selected from the group consisting of CRR', CR, NR, and N, wherein there is a single or a double bond between A and B and a single or a double bond between B and Z;
Z is a direct bond or a divalent organic bridge group selected from the group consisting of a substituted or unsubstituted C1-C9-alkylene, C2-C8-alkenylene, C2-C8-alkynylene or arylene group or a combination of these, —CRR', —C=CRR', —C=NR, —NR—, —O—, —SiRR'—, —S—, —S(O)—, —S(O)$_2$—, and O-interrupted substituted or unsubstituted C1-C9-alkylene, C2-C8-alkenylene, C2-C8-alkynylene or arylene groups, or phenyl or substituted phenyl units; wherein the waved line indicates the position over which R is bound to the aryl ring;
wherein each R and R' at each occurrence is the same or different H, deuterium, azide ($N_3^-$), F, Cl, Br, I, $N(R^2)_2$, CN, $CF_3$, $NO_2$, OH, COOH, $COOR^2$, $CO(NR^2)_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^2$, wherein one or more not adjacent $CH_2$-groups can be replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^2$, or an aryloxy or heteroaryloxy group with 5 to 60 aromatic ring atoms, which can be substituted by one or more radicals $R^2$, or a diarylamino group, diheteroarylamino group or arylheteroarylamino group with 10 to 40 aromatic ring atoms, which can be substituted by one or more radicals $R^2$, or a combination of these systems, or a cross-linkable unit, whereby two or more of the substituents R and R' can also form with each other a mono- or polycyclic, aliphatic, aromatic and/or benzoannulated ring system;
$R^2$ is at each occurrence is the same or different H, deuterium, F, Cl, Br, I, $N(R^3)_2$, CN, $CF_3$, $NO_2$, OH, COOH, $COOR^3$, $CO(NR^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals $R^3$, wherein one or more not adjacent $CH_2$-groups can be replaced by $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and wherein one or more H-atoms can be replaced by deuterium, F, Cl, Br, I, CN, $CF_3$ or $NO_2$, or an aromatic or heteroaromatic ring system with 5 to 60 aromatic ring atoms, which each can be substituted by one or more radicals $R^3$, or an aryloxy or heteroaryloxy group with 5 to 60 aromatic ring atoms, which can be substituted by one or more radicals $R^3$, or a diarylamino group, diheteroarylamino group or arylheteroarylamino group with 10 to 40 aromatic ring atoms, which can be substituted by one or more radicals $R^3$, or a combination of these systems; whereby two or more of these substituents $R^2$ can also form with each other a mono- or polycyclic, aromatic and/or benzoannulated ring system;
$R^3$ is at each occurrence is the same or different H, deuterium, F, $CF_3$ or an aliphatic, aromatic and/or heteroaromatic hydrocarbon radical with 1 to 20 C-atoms, in which one or more H-atoms can be replaced by F or CF₃; whereby two or more substituents R³ can form with each other a mono- or polycyclic aliphatic ring system,
wherein at least one of the donor groups of formula I comprises a structure of formula II:

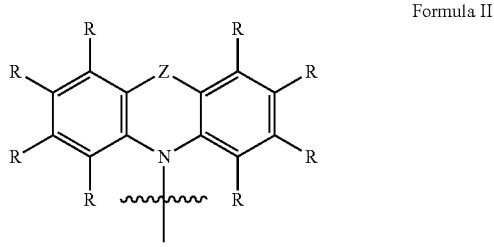

Formula II wherein
Z is a direct bond or a divalent organic bridge group selected from the group consisting of a substituted or unsubstituted C1-C9-alkylene, C2-C8-alkenylene, C2-C8-alkynylene or arylene group or a combination of these, —CRR', —C=CRR', —C=NR—, —NR—, —O—, —SiRR'—, —S—, —S(O)—, —S(O)₂—, and O-interrupted substituted or unsubstituted C1-C9-alkylene, C2-C8-alkenylene, C2-C8-alkynylene or arylene groups, phenyl or substituted phenyl units; wherein the waved line indicates the linkage position of D;
each R and R' at each occurrence is same or different H, deuterium, F, Cl, Br, I, N(R²)₂, CN, CF₃, NO₂, OH, COOH, COOR², CO(NR²)₂, Si(R²)₃, B(OR²)₂, C(=O)(R²), P(=O)(R²)₂, S(=O)R², S(=O)₂R², OSO₂R², a linear alkyl, alkoxy or thioalkoxy group with 1 to 40 C-atoms or a linear alkenyl or alkenyl group with 2 to 40 C-atoms or a branched or cyclic alkyl, alkenyl, alkynyl, alkoxy or thioalkoxy group with 3 to 40 C-atoms, which each can be substituted by one or more radicals R², wherein one or more not adjacent CH₂-groups replaced by R²C=CR², C≡C Si(R²)₂, Ge(R²)₂, Sn(R²)₂, C=O, C=S, C=Se, C=NR², P(=O)(R²), SO, SO₂, NR², O, S or CONR² and wherein one or more H-atoms can be replaced by deuterium, F, Cl, Br, I, CN, CF₃ or NO₂ or an aromatic or heteroaromatic ring system with 5 to 60 aromatic ring atoms, which each can be substituted by one or more radicals R², or an aryloxy or heteroaryloxy group with 5 to 60 aromatic ring atoms, which can be substituted by one or more radicals R², a diarylamino group, diheteroarylamino group or arylheteroarylamino group with 10 to 40 aromatic ring atoms, which can be substituted by one or more radicals R², or a combination of these systems, or a cross-linkable unit, which can be cross-linked by acid-catalyzed thermal or UV cross-linking processes; thereby two or more of the substituents R and R' can form with each other a mono- or polycyclic, aliphatic, aromatic and/or benzoannulated ring system;
R² is at each occurrence is the same or different H, deuterium F, Cl, Br, I, N(R³)₂, CN, CF₃, NO₂, OH, COOH, COOR³, CO(NR³)₂, Si(R³)₃, B(OR³)₂, C(=O)R³, P(=O)(R³)₂, S(=O)R³, S(=O)₂R³, OSO₂R³, a linear alkyl, alkoxy or thioalkoxy group with 1 to 40 C-atoms or a linear alkenyl or alkynyl group with 2 to 40 C-atoms or a branched or cyclic alkyl, alkenyl, alkynyl, alkoxy or thioalkoxy group with 3 to 40 C-atoms, which each can be substituted by one or more radicals R³, wherein one or more not adjacent CH₂-groups can be replaced by R³C=CR³, C≡C, Si(R³)₂, Ge(R³)₂, Sn(R³)₂, C=O, C=S, C=Se, C=NR³, P(=O)(R³), SO, SO₂, O, S or CONR³ and wherein one or more H-atoms can be replaced by deuterium, F, Cl, Br, I, CN, CF₃ or NO₂, or an aromatic or heteroaromatic ring system with 5 to 60 aromatic ring atoms, which each can be substituted by one or more radicals R³, or an aryloxy or heteroaryloxy group with 5 to 60 aromatic ring atoms, which can be substituted by one or more radicals R³, or a diarylamino group, diheteroarylamino group or arylheteroarylamino group with 10 to 40 aromatic ring atoms, which can be substituted by one or more radicals R³, or a combination of these systems; thereby two or more of these substituents R² can also form with each other a mono- or polycyclic, aromatic and/or benzoannulated ring system; and
R³ is at each occurrence is the same or different H, deuterium, F, CF₃ or an aliphatic, aromatic and/or heteroaromatic hydrocarbon radical with 1 to 20 C-atoms, in which one or more H-atoms can also be replaced by F or CF₃; thereby two or more substituents R³ can also form with each other a mono- or polycyclic aliphatic ring system.

2. The organic molecule according to claim 1, wherein the organic molecule comprises a ΔE(S₁-T₁)-value between a lowermost excited singlet (S₁)-state and a triplet (T₁)-state below it of smaller than 3000 cm⁻¹; and/or comprises an emission lifetime of at the most 100 μs.

3. The organic molecule according to claim 1, wherein the organic molecule of formula D comprises a structure of formula D*:

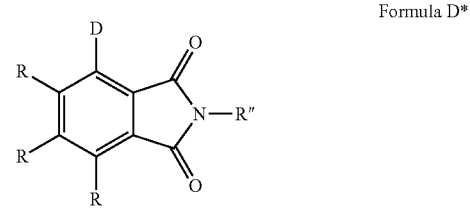

Formula D* wherein each R and R" have the aforestated meanings, wherein R is no donor.

4. An optoelectronic device comprising an organic molecule according to claim 3.

5. The organic molecule according to claim 1, wherein the organic molecule of formula D comprises a structure of formula E:

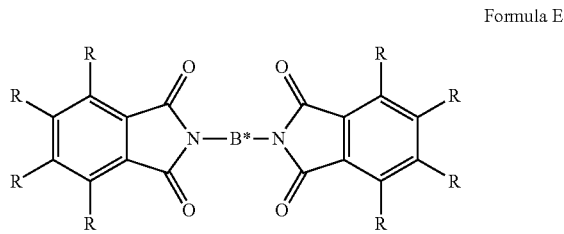

Formula E wherein each R has the aforestated meanings;
and further wherein at least one R at the aryl ring is a donor group; and
B* is an organic bridge, which is a substituted or unsubstituted alkylene, alkenylene, alkynylene or arylene group or a combination of these, —O—, —NR—, —C=CR$_2$, —C=NR, —SiR$_2$—, —S—, —S(O)—, —S(O)$_2$—, or O-interrupted alkyl (branched or cyclic), heteroalkyl, aryl, heteroaryl, alkenyl, phenyl and substituted phenyl units.

6. The organic molecule according to claim 1, wherein Z is a direct bond.

7. An optoelectronic device comprising an organic molecule according to claim 1.

8. The optoelectronic device according to claim 7, wherein the optoelectronic device is an organic light-emitting device, an organic diode, an organic solar cell, an organic field-effect transistor, an organic laser or a down-conversion element.

9. The optoelectronic device according to claim 7, wherein the organic molecule is one of an emitter and an absorber in the optoelectronic component.

10. The optoelectronic device according to claim 7, wherein the proportion of the organic molecule in the emitter or absorber is 100%.

11. The optoelectronic device according to claim 7, wherein the proportion of the organic molecule in the emitter or absorber is in the range of 1% to 99%.

12. The optoelectronic device according to claim 7, wherein the organic molecule is introduced into a matrix material for conduction of electrons or holes in the optoelectronic component.

13. The optoelectronic device according to claim 7, wherein the organic molecule alters at least one of an emission property and an absorption property of the optoelectronic component.

* * * * *

UNITED STATES PATENT AND TRADEMARK OFFICE
CERTIFICATE OF CORRECTION

PATENT NO. : 10,651,394 B2  
APPLICATION NO. : 15/506346  
DATED : May 12, 2020  
INVENTOR(S) : Michael Danz Page 1 of 1

It is certified that error appears in the above-identified patent and that said Letters Patent is hereby corrected as shown below:

In the Claims

Claim 1, Column 121, Line 67 delete "un substituted" and insert --unsubstituted--

Claim 1, Column 123, Line 24 delete "-C=NR-," and insert -- -C=NR,--

Claim 1, Column 123, Line 40 insert --can be-- between "CH2-groups" and "replaced by"

Claim 1, Column 124, Line 3 insert --$NR^3$,-- between "-$SO_2$," and "O,"

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*